United States Patent [19]

Saitoh et al.

[11] Patent Number: 5,573,601
[45] Date of Patent: Nov. 12, 1996

[54] PIN AMORPHOUS SILICON PHOTOVOLTAIC ELEMENT WITH COUNTER-DOPED INTERMEDIATE LAYER

[75] Inventors: Keishi Saitoh; Tatsuyuki Aoike; Yasushi Fujioka; Masafumi Sano; Mitsuyuki Niwa, all of Nagahama, Japan

[73] Assignee: Canon Kabushiki Kaisha, Tokyo, Japan

[21] Appl. No.: 323,063

[22] Filed: Oct. 14, 1994

Related U.S. Application Data

[63] Continuation of Ser. No. 951,046, Sep. 24, 1992, abandoned, which is a continuation of Ser. No. 598,111, Oct. 16, 1990, abandoned.

[30] Foreign Application Priority Data

| Oct. 17, 1989 | [JP] | Japan | 1-268257 |
| Oct. 17, 1989 | [JP] | Japan | 1-268258 |
| Oct. 17, 1989 | [JP] | Japan | 1-268259 |

[51] Int. Cl.$^6$ ............... H01L 31/0288; H01L 31/0392; H01L 31/075
[52] U.S. Cl. ............... 136/258; 257/53; 257/55
[58] Field of Search ............... 357/30 K, 89, 357/90, 2; 136/258; 257/53, 55, 56

[56] References Cited

U.S. PATENT DOCUMENTS

| 4,064,521 | 12/1977 | Carlson | 357/2 |
| 4,396,793 | 8/1983 | Madan | 357/30 K |
| 4,692,558 | 9/1987 | Delahoy et al. | 357/30 K |
| 4,959,106 | 9/1990 | Nakagawa et al. | 136/258 |
| 5,002,617 | 3/1991 | Kanai et al. | 136/258 |
| 5,006,180 | 4/1991 | Kanai et al. | 136/258 |
| 5,007,971 | 4/1991 | Kanai et al. | 136/258 |
| 5,024,706 | 6/1991 | Kanai et al. | 136/258 |

FOREIGN PATENT DOCUMENTS 55-11329  1/1980  Japan .

OTHER PUBLICATIONS

Y. Tawada et al., "Optimizations of the Film Deposition Parameters for the Hydrogenated Amorphous Silicon Solar Cell," Proceedings of the 2nd Photovoltaic Science and Engineering Conference in Japan, Tokyo, Dec. 2–4, 1980, *Japanese Journal of Applied Physics*, vol. 20, 1981 pp. 219–225.

*Primary Examiner*—William D. Larkins
*Attorney, Agent, or Firm*—Fitzpatrick, Cella, Harper & Scinto

[57] ABSTRACT

A pin type photovoltaic element having an electroconductive substrate and a cell stacked with an n-type semiconductor layer, an i-type semiconductor layer and a p-type semiconductor, all composed of a non-single crystal material containing silicon, and featuring an intermediate layer. The intermediate layer composed of non-single material containing silicon atoms as the matrix and atoms of elements belonging to Group IIIA and VA of the periodic table is between the i-type conductor layer and the p-type conductor layer or the n-type semiconductor layer. The intermediate layer may contain carbon atoms and/or germanium atoms.

17 Claims, 13 Drawing Sheets

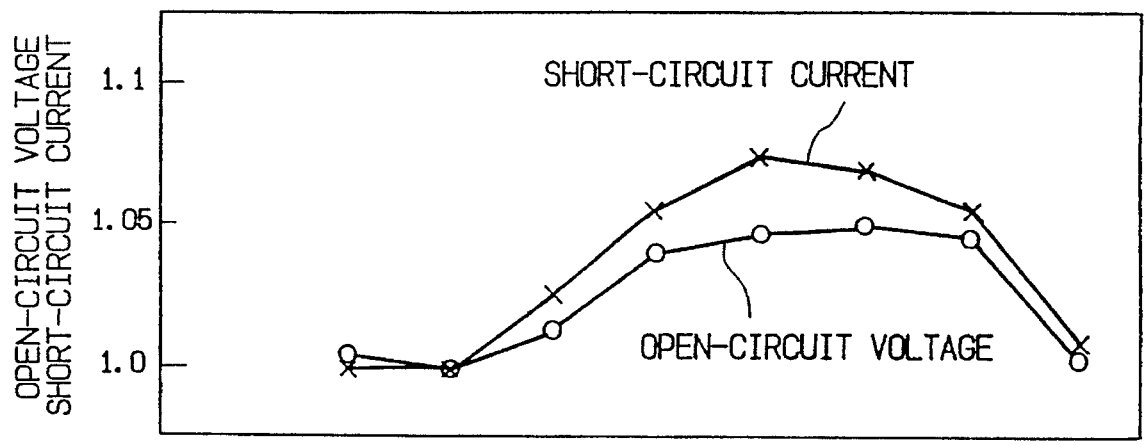
FIG. 4(A)1
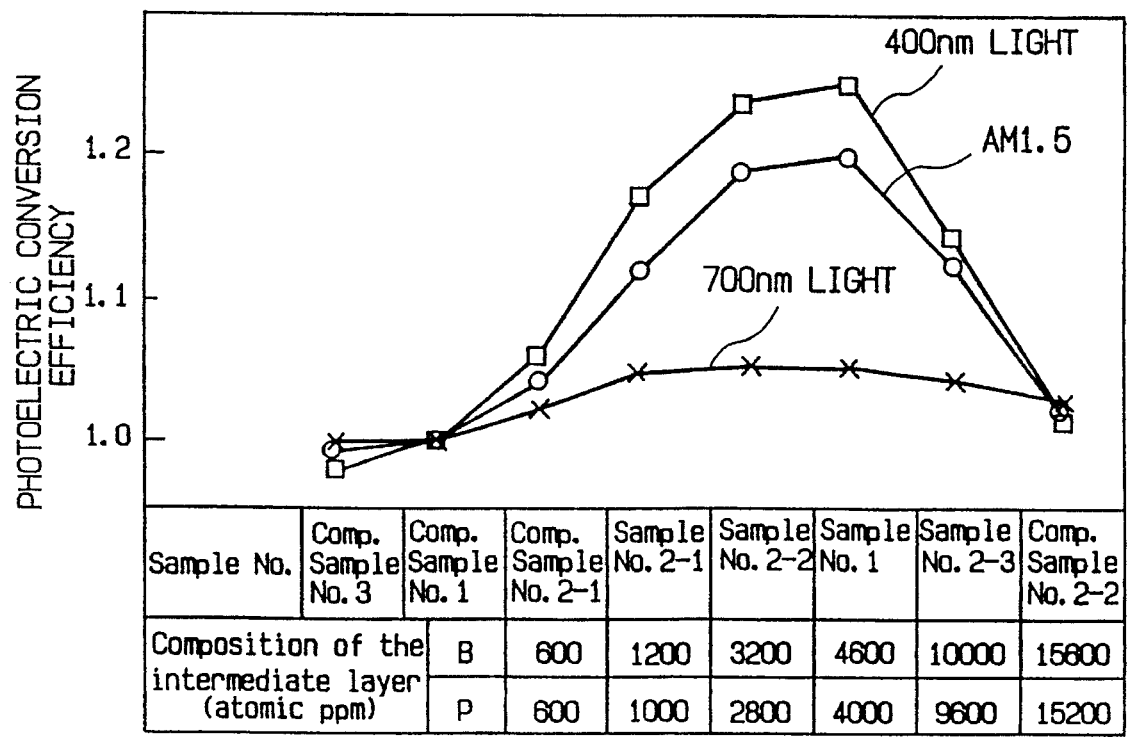
*the values plotted in the figure are those relative to the value
(which was considered to be one) of Comp.Sample No. 1.
FIG. 4(A)2

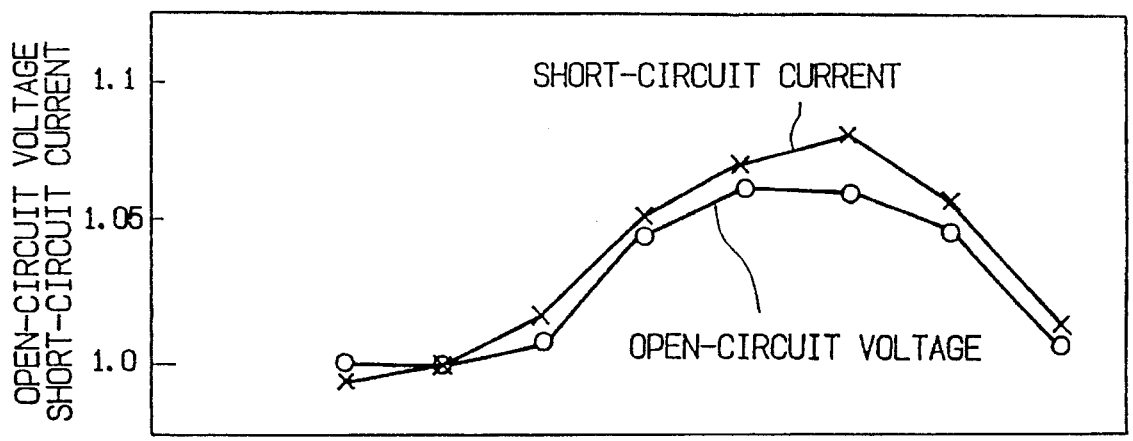
FIG. 4(B)1
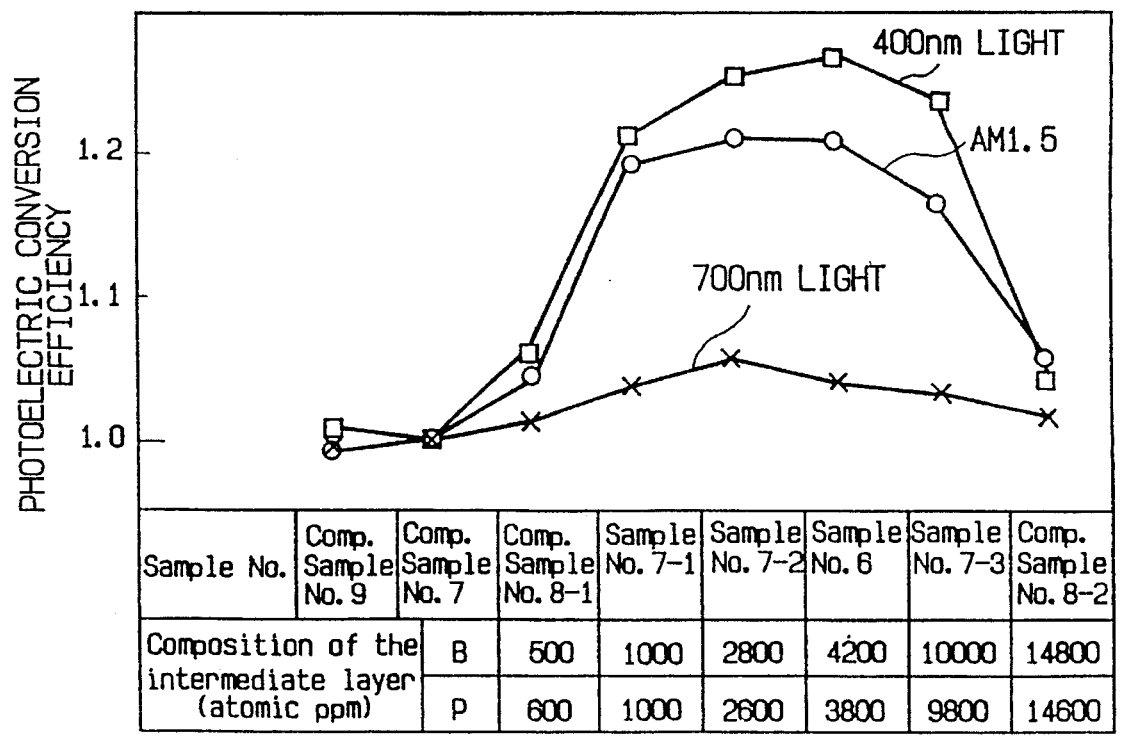
*the values plotted in the figure are those relative to the value (which was considered to be one) of Comp. Sample No. 7.
FIG. 4(B)2

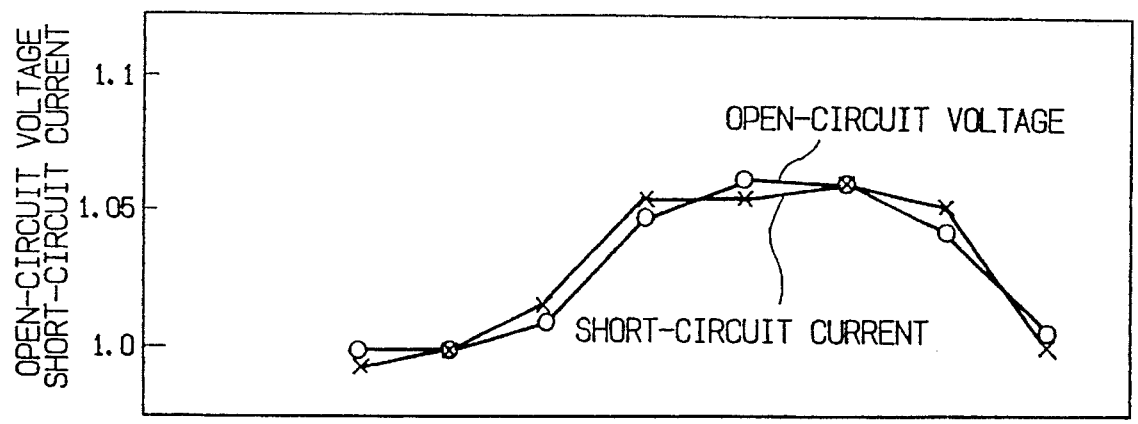
FIG. 4(C)1
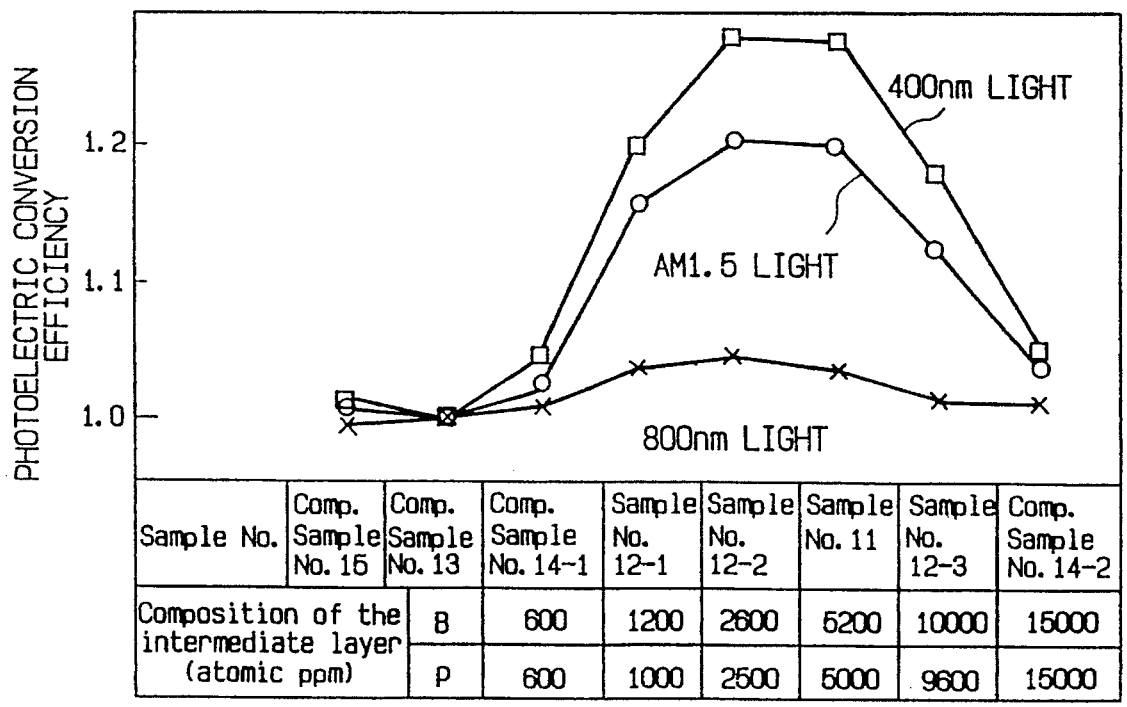
*the values plotted in the figure are those relative to the value (which was considered to be one) of Comp. Sample No. 13.
FIG. 4(C)2

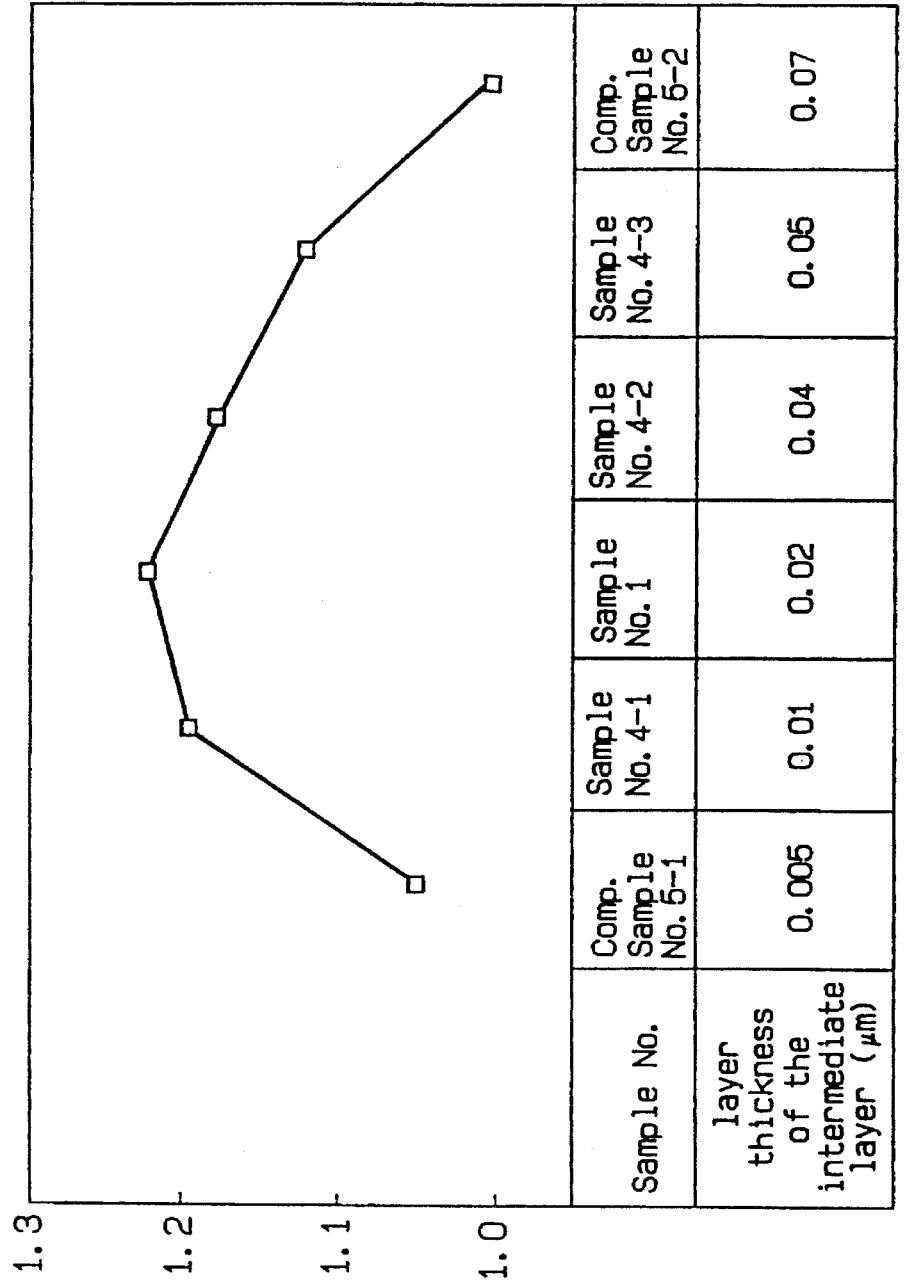

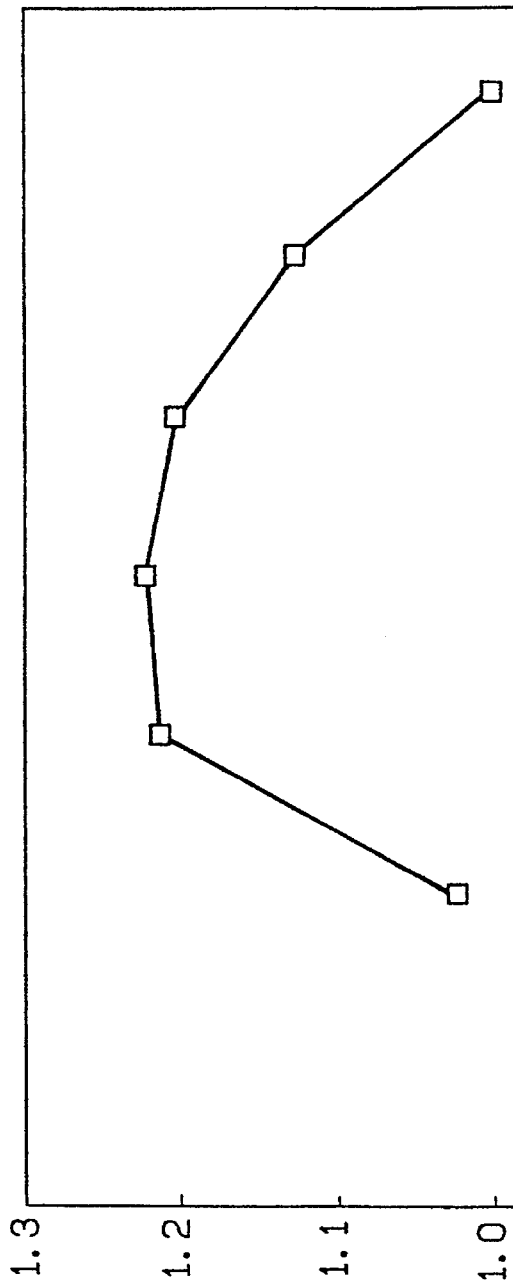

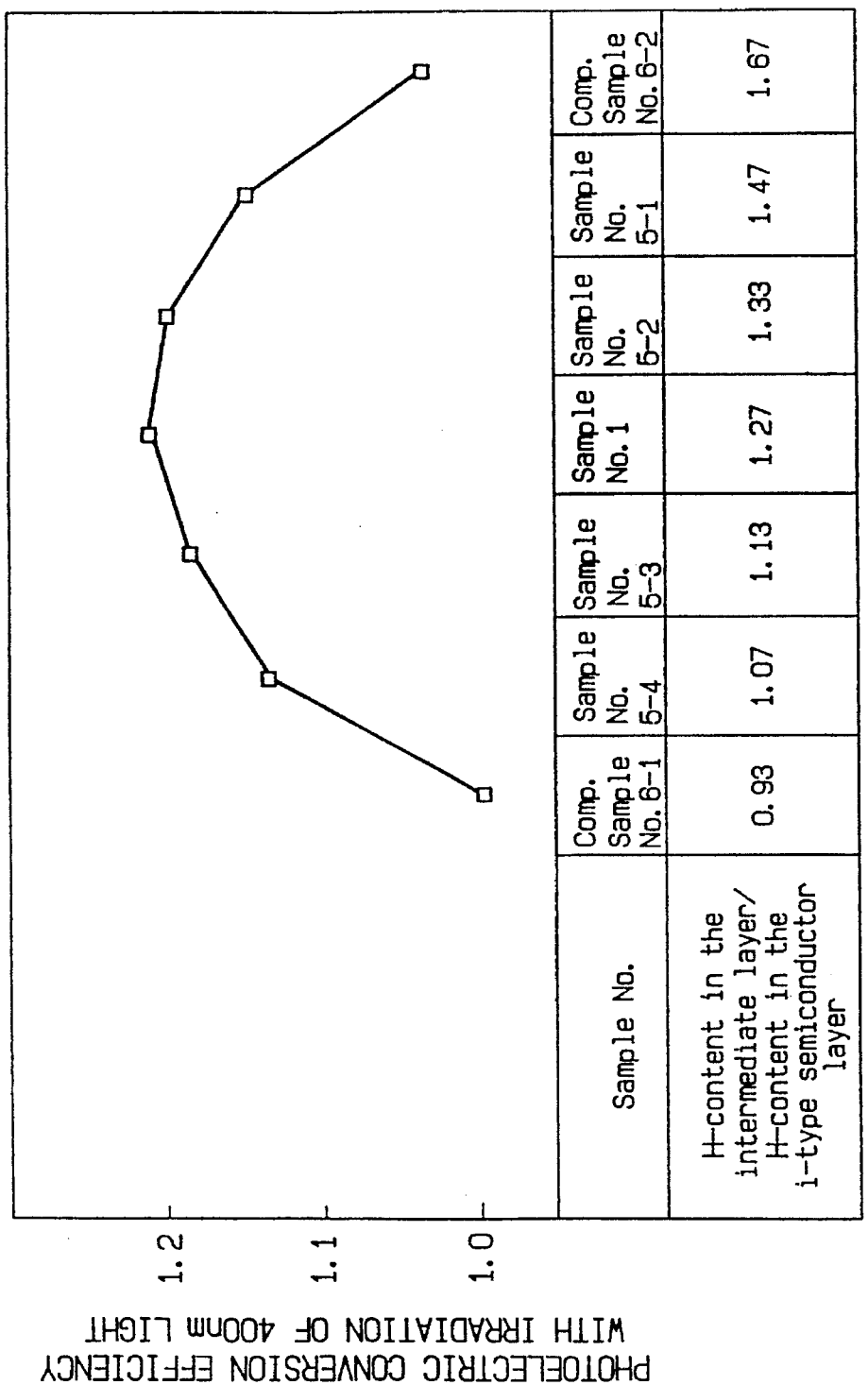

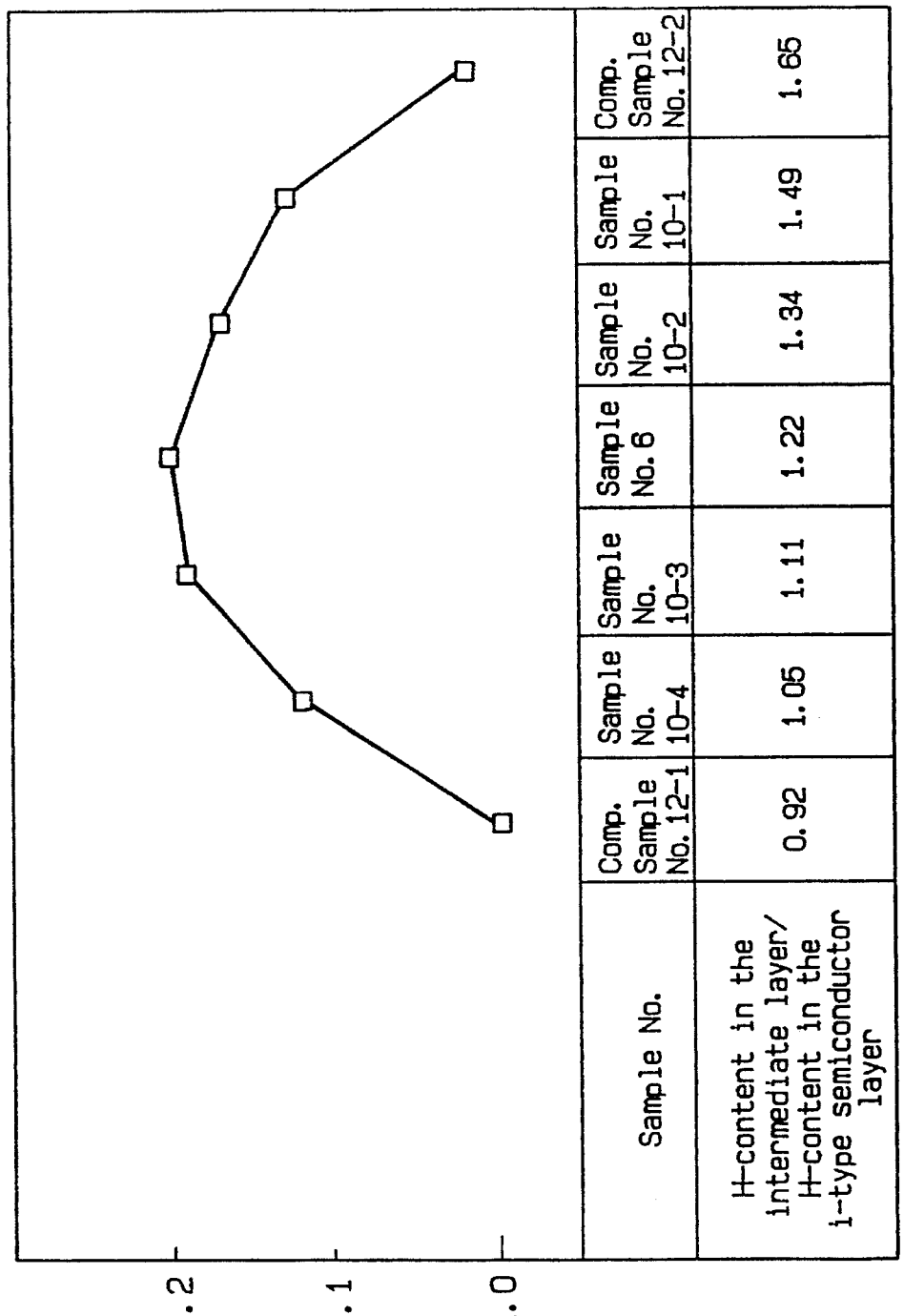

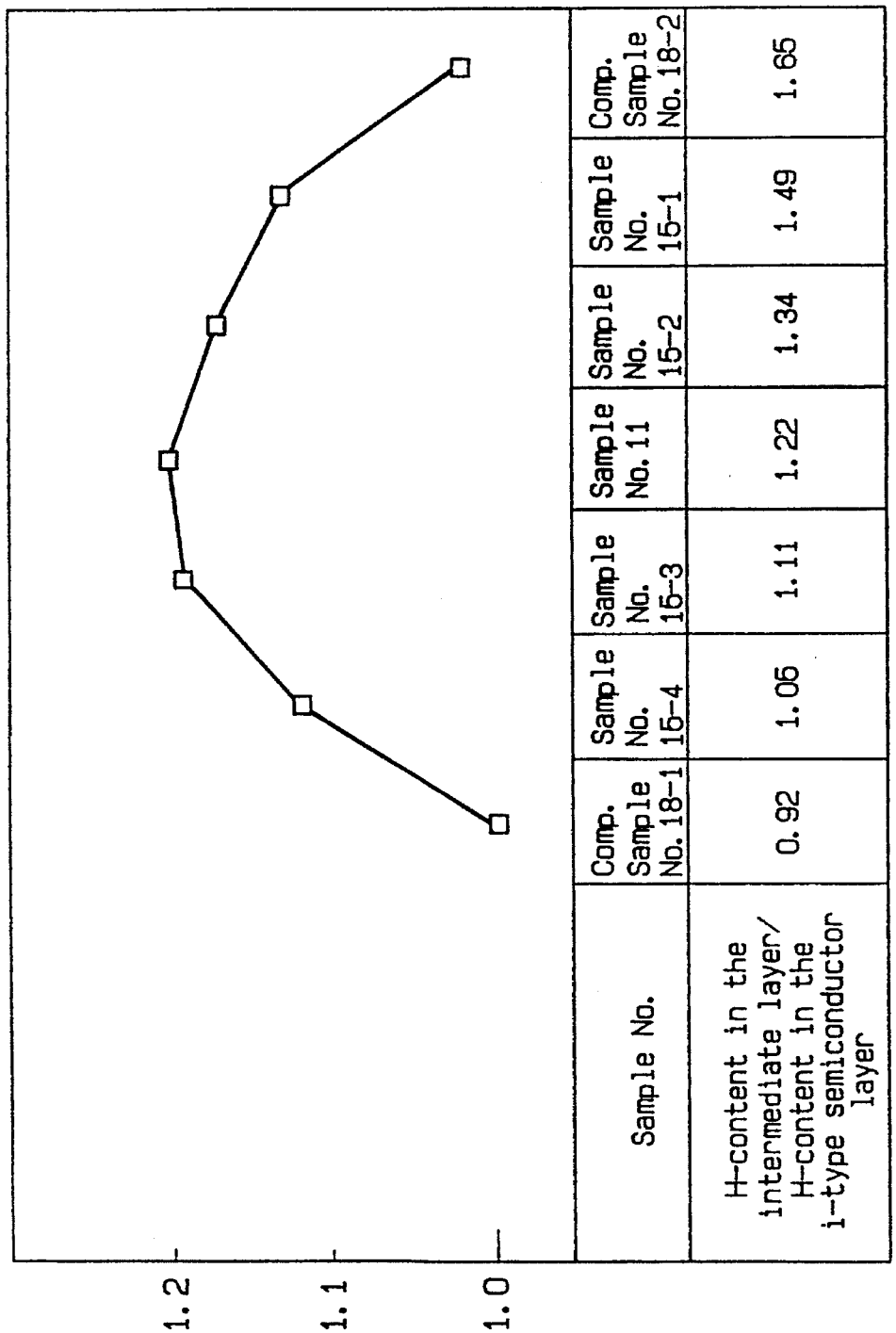

PIN AMORPHOUS SILICON PHOTOVOLTAIC ELEMENT WITH COUNTER-DOPED INTERMEDIATE LAYER

This application is a continuation of application Ser. No. 07/951,046 filed Sep. 24, 1992, now abandoned, which is a continuation of application Ser. No. 07/598,111 filed Oct. 16, 1990, now abandoned.

FIELD OF THE INVENTION

The present invention relates to a non-single crystal system pin type photovoltaic element which is free of discontinuity in the conduction band or/and valence band in the vicinity of the interface between the i-type semiconductor layer and the window semiconductor layer and which is improved in the mobility-lifetime ($\mu\tau$) product of photo-excited carrier in said vicinity. More particularly, the present invention relates to an improved non-single crystal silicon system pin type photovoltaic element having an intermediate layer being composed of a non-single crystal material containing silicon atoms as the matrix, atoms of an element belonging to Group VA of the periodic table and atoms of an element belonging to Group IIIA of said table, and optionally, at least one kind of atoms selected from the group consisting of carbon atoms and germanium atoms, which stably provides an improved photoelectric conversion efficiency without being photodegradated even upon continuous use for a long period of time.

BACKGROUND OF THE INVENTION

Since Spear et al. succeeded in doping an amorphous silicon (that is, a-Si:H), a number of photovoltaic elements with the use of a-Si:H were proposed, for examples, as disclosed in U.S. Pat. No. 4,064,521.

Nowadays, a number of a-Si:H solar cells have been employed in watches, miniature computers, street lamps, etc. as their power sources.

However, any of those a-Si:H solar cells is still problematic especially in photoelectric conversion efficiency, anti-photodegradation property, and the like.

In order to provide a a-Si:H solar cell having an improved photoelectric conversion efficiency and an improved anti-photodegradation property, a variety of proposals have been made.

For example, there have been reported a solar cell provided with a p-type semiconductor layer composed of an amorphous silicon carbide having a wide forbidden band as the window layer through which light is impinged (Y. Tawada et al., Japan J. Appl. Phys. 20(1981) Supplement 20-2, 219): a solar cell provided with a less light absorptive n-type semiconductor layer composed of a microcrystal silicon material as the window layer through which light is impinged [Y. Uchida, US-Japan Joint Seminar, Technological Applications of Tetrahedral Amorphous Solids, Palo Alto, Calif. (1982)]; and a solar cell provided with a p-type semiconductor layer composed of a microcrystal silicon carbide as the window layer through which light is impinged (Y. Hattori et al., Technical Digest of the International PUSEC-3, Tokyo, Japan, 1987, A-II, a-3).

Further, a proposal has been made to incorporate a trace amount (less than 10 ppm) of phosphorus atoms (P) or boron atoms (B) into the i-type semiconductor layer in order to increase carrier range in said i-type semiconductor layer (W. Kusian et al., The conference record of the nineteenth IEEE photovoltaic specialists conference-1987, p. 599; and M. Kondo et al., The conference record of the nineteenth IEEE photovoltaic specialists conference-1987, p. 604).

However, in the case of such solar cell having the window semiconductor layer composed of the foregoing microcrystal silicon material, microcrystal silicon carbide or amorphous silicon carbide, there are problems that interface-state and discontinuities in the conduction band and/or the valence band such as notch, spike, etc. which lead to shortening the lifetime of photo-excited carrier often occur at the interface between the i-type semiconductor layer and the window semiconductor layer especially when there is a difference between the window semiconductor layer and the i-type semiconductor layer with respect to their layer structure, forbidden band and amount of a dopant contained, to thereby provide negative influences for carrier generation in the vicinity of the interface between the i-type semiconductor layer and the window semiconductor layer and for transportation of the carrier generated.

It is considered that the problem relating to the lifetime of the photo-excited carrier can be somewhat eliminated by the incorporation of a trace amount of phosphorus atoms (P) or boron atoms (B) into the i-type semiconductor layer as found in the above report. However, other problems relating to the discontinuities in the conduction band and valence band such as notch, spike, etc. still remain unsolved.

In order to eliminate the problem relating to the foregoing discontinuities, there is a proposal to continuously vary the composition of the i-type semiconductor layer toward the window semiconductor layer as disclosed in Japanese Unexamined Patent Publication 55(1980)-11329. However, said problem cannot be satisfactorily eliminated by this proposal mainly because of a difference between the condition for the formation of the i-type semiconductor layer and that for the formation of the window semiconductor layer.

SUMMARY OF THE INVENTION

The present invention is aimed at eliminating the foregoing problems in the known pin type photovoltaic element.

Another object of the present invention is to provide an improved pin type photovoltaic element which is free of the foregoing problems relating to occurrence of discontinuities in the conduction band and/or valence band in the vicinity of the interface between the i-type semiconductor layer and the p-type semiconductor layer or the n-type semiconductor layer as the window layer which are found in the known pin type photovoltaic element.

A further object of the present invention is to provide an improved pin type photovoltaic element which promotes the mobility-lifetime ($\mu\tau$) product of photo-excited carrier in the vicinity of the interface between the i-type semiconductor layer and the p-type or n-type semiconductor layer as the window layer.

A further object of the present invention is to provide an improved pin type photovoltaic element which provides a high quantum efficiency for carrier excitation in the vicinity of the interface between the i-type semiconductor layer and the p-type or n-type semiconductor layer as the window layer.

A further object of the present invention is to provide an improved pin type photovoltaic element which provides a large open-circuit voltage and a large short-circuit current and which provides an improved photoelectric conversion efficiency.

A further object of the present invention is to provide an improved pin type photovoltaic element with an intermediate layer composed of a non-single crystal silicon material containing atoms of an element of Group IIIA of the periodic table and atoms of an element of Group VA of said table between the i-type semiconductor layer and the p-type or n-type semiconductor layer.

BRIEF DESCRIPTION OF THE DRAWINGS

FIGS. 4(A) through 4(C) are graphs respectively showing the interrelation between the amounts of boron and phosphorus atoms contained in the intermediate layer of the pin type photovoltaic element according to the present invention and the characteristics of said element.

FIGS. 6(A) through 6(C) are graphs respectively showing the interrelation between the thickness of the intermediate layer of the pin type photovoltaic element according to the present invention and the characteristics of said element.

FIGS. 7(A) through 7(C) are graphs respectively showing the interrelation between the ratio between the amount of hydrogen atoms contained in the intermediate layer and the amount of hydrogen atoms contained in the i-type semiconductor layer of the pin type photovoltaic element according to the present invention and the photoelectric conversion efficiency of said element.

DETAILED DESCRIPTION OF THE INVENTION

Figure 2:
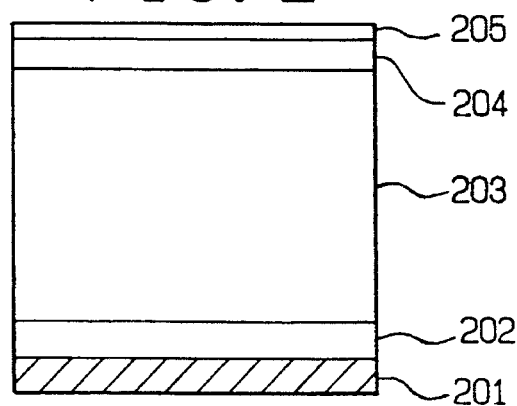
FIG. 2 is a schematic cross-sectional view of a known pin type photovoltaic element.

The present inventors have made extensive studies for overcoming the foregoing problems in the known pin type photovoltaic element having such a configuration as shown in FIG. 2 and attaining the objects as described above and as a result, have accomplished the present invention based on the findings as below described.

The known pin type photovoltaic element shown in FIG. 2 comprises an electroconductive substrate 201, an n-type (or p-type) semiconductor layer 202 disposed on said substrate, an i-type semiconductor layer 203 disposed on said n-type (or p-type) semiconductor layer, a p-type (or n-type) semiconductor layer 204 disposed on said i-type semiconductor layer, and a transparent electrode 205 disposed on said p-type (or n-type) semiconductor layer.

That is, the present inventors have found facts that when a specific semiconductor layer composed of an amorphous material (including microcrystal material) or a polycrystal material (these materials will be collectively expressed by the term "non-single crystal material" in the following) containing silicon atoms as the matrix, atoms of an element belonging to Group IIIA of the periodic table (this element will be hereinafter referred to as "Group IIIA element") and atoms of an element belonging to Group VA of the periodic table (this element will be hereinafter referred to as "Group VA element") is disposed in the known pin type photovoltaic element as an intermediate layer between the i-type semiconductor layer 203 and the p-type (or n-type) semiconductor layer 204, the foregoing problems relating to occurrences of interface-state and discontinuities in the conduction band and/or the valence band in the vicinity of the interface between i-type semiconductor layer and the p-type or n-type semiconductor layer are effectively eliminated to thereby provide a desirable improvement in the mobility-lifetime ($\mu\tau$) product of photo-excited carrier, and the resulting pin type photovoltaic element becomes such that provides a large open-circuit voltage and a large short-circuit current and that stably provides an improved photoelectric conversion efficiency without light-induced photodegradation even upon continuous use for a long period of time.

The present inventors have found further facts that when the above intermediate layer is incorporated with carbon atoms or/and germanium atoms, the above effects are enhanced.

Figure 1A:
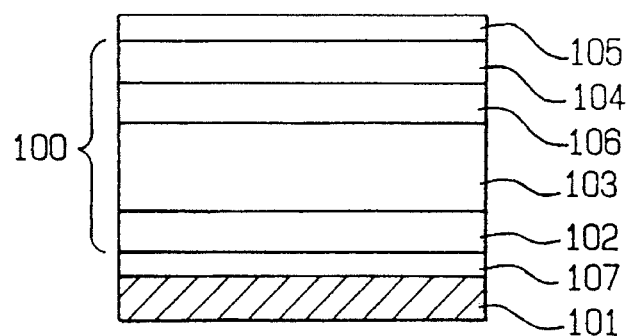
FIGS. 1(A) and 1(B) schematically illustrate typical embodiments of the pin type photovoltaic element according to the present invention.

Shown in FIG. 1(A) is a schematic cross-sectional view of a typical embodiment of the pin type photovoltaic element of the present invention. The pin type photovoltaic element shown in FIG. 1(A) has a configuration comprising a substrate 101; a cell 100 comprising an n-type (or p-type) semiconductor layer 102 composed of a silicon-containing non-single crystal material, an i-type semiconductor layer 103 composed of a silicon-containing non-single crystal material, an intermediate layer 106 composed of a non-single crystal material containing silicon atoms as the matrix, atoms of a Group IIIA element and atoms of a Group VA element, and optionally carbon atoms or/and germanium atoms and, a p-type (or n-type) semiconductor layer 104 composed of a silicon-containing non-single crystal material; and a transparent electrode 105, wherein said n-type (or p-type) semiconductor layer 102, said i-type semiconductor layer 103, said intermediate layer 106 and said p-type (or n-type) semiconductor layer 104 are stacked on said substrate 101 in this order from the side of the substrate. The transparent electrode 105 is disposed on the p-type (or n-type) semiconductor layer 104.

In the pin type photovoltaic element shown in FIG. 1(A), light is impinged from the side of the transparent electrode 105. In a preferred embodiment of this pin type photovoltaic element, a collecting electrode such as a comb-shaped electrode (not shown in FIG. 1(A)) is disposed on the transparent electrode 105, and a lower electrode 107 is disposed between the substrate 101 and the n-type (or p-type) semiconductor layer 102 as shown in FIG. 1(A).

Figure 1B:
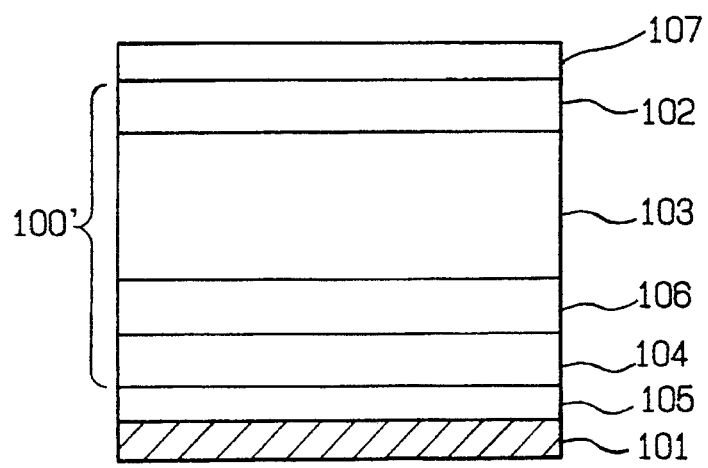

The pin type photovoltaic element of the present invention can assume other configuration as shown in FIG. 1(B) in which light is impinged from the side of a substrate.

The pin type photovoltaic element of the present invention shown in FIG. 1(B) comprises a transmissive substrate 101; a transparent electrode 105; a cell 100' comprising a p-type (or n-type) semiconductor 104 composed of a silicon-containing non-single crystal material, an intermediate layer 106 composed of a non-single crystal material containing silicon atoms as the matrix, atoms of a Group IIIA element and atoms of a Group VA element, and optionally carbon atoms or/and germanium atoms, an i-type semiconductor layer 103 composed of a silicon-containing non-single crystal material and an n-type (or p-type) semiconductor layer 102 composed of a silicon-containing non-single crystal material; and an electrode 107, wherein said transparent electrode 105, said p-type (or n-type) semiconductor layer 104, said intermediate layer 106, said i-type semiconductor layer 103, said n-type (or p-type) semiconductor layer 102 and said electrode are stacked on said substrate 101 in this order from the side of the substrate.

Any of the above pin type photovoltaic elements shown in FIGS. 1(A) and 1(B) is of the single cell type.

The pin type photovoltaic element of the present invention can be a multicells stacked pin type photovoltaic element comprising two or more of said cells 100 or 100' being stacked. In this case, it is possible to dispose the foregoing intermediate layer 106 only in the cell situated adjacent to the transparent electrode or the transmissive substrate through which light is impinged.

The pin type photovoltaic element of the present invention thus configured causes neither interface-state nor discontinuities in the conduction band and/or the valence band in the vicinity of the interface between the i-type semiconductor layer and the p-type or n-type semiconductor layer as the window layer; promotes the mobility-lifetime ($\mu\tau$) product of photo-excited carrier in said vicinity; provides a high quantum effeciency for carrier generation in said vicinity; provides a large open-circuit voltage and a large short-circuit current; and provides an improved photoelectric conversion efficiency.

In the following, explanation will be made on the intermediate layer, each of the constituent semiconductor layers, the substrate and each of the constituent electrodes in the pin type photovoltaic element of the present invention.

Intermediate Layer

As described above, in the pin type photovoltaic element of the present invention, the intermediate layer is disposed between the i-type semiconductor layer and the p-type semiconductor layer or the n-type semiconductor layer as the window layer.

In a typical embodiment, the intermediate layer is formed of a non-single crystal silicon material such as amorphous silicon material (including microcrystal silicon material) containing silicon atoms (Si) as the matrix, hydrogen atoms (H), atoms of a Group IIIA element (hereinafter referred to as "atoms ($M_1$)") and atoms of a Group VA element (hereinafter referred to as "atoms ($M_2$)") (this non-single crystal silicon material will be hereinafter referred to as "Non-Si:H:$M_1$:$M_2$ material").

Specific examples of the Group IIIA element are boron(B), aluminum(Al), gallium(Ga), indium(In) and thallium(Tl).

Specific examples of the Group VA element are phosphorus(P), arsenic(As), nitrogen(N), antimony(Sb) and bismuth(Bi).

In another embodiment, the intermediate layer is formed of a Non-Si:H:$M_1$:$M_2$ material containing carbon atoms (C) or/and germanium atoms (Ge) (this non-single crystal material will be hereinafter referred to as "Non-Si:H:$M_1$:$M_2$:(C,Ge) material").

In any case, said Non-Si:H:$M_1$:$M_2$ material or said Non-Si:H:$M_1$:$M_2$:(C,Ge) material to constituting the intermediate layer may contain halogen atoms (X).

As previously described, for the known pin type photovoltaic element, there are problems that interface-state after occurs later in the vicinity of the interface between the i-type semiconductor layer and the p-type or n-type semiconductor layer as the window layer not only causing discontinuities such as notch, spike, etc. in the conduction bands or/and valence bands of said i-type semiconductor layer and said p-type or n-type semiconductor layer but also shortening the lifetime of photo-excited carrier in said vicinity.

However, the pin type photovoltaic element of the present invention which is provided with a specific intermediate layer composed of the foregoing specific Non-Si:H:$M_1$:$M_2$ material or Non-Si:H:$M_1$:$M_2$:(C,Ge) material between the i-type semiconductor layer and the p-type or n-type semiconductor layer as the window layer is free of those problems found in the known pin type photovoltaic element.

As for the reason in this sequence, the present inventors learned through experiments that (i) the atoms ($M_1$) and the atoms ($M_2$) contained together in the intermediate layer provide sensitizing effects, particularly, function to produce energy level near the conduction band or the valence band, resulting in prolonging the lifetime of photo-excited carrier; (ii) these atoms ($M_1$) and ($M_2$) together contained in the intermediate layer function to substantially prevent the mobility of photo-excited carrier from reducing, particularly, said atoms ($M_1$) and ($M_2$) produce energy level in notch, spike, etc. such that photo-excited carrier is allowed to move through said energy level and thus, the mobility-lifetime ($\mu\tau$) product of photo-excited carrier is markedly improved; (iii) thus, the provision of the foregoing specific intermediate layer in the known pin type photovoltaic element markedly improves the characteristics of the i-type semiconductor layer and the p-type or n-type semiconductor layer in the vicinity of the interface between the two semiconductor layer; and (iv) because of these factors, the pin type photovoltaic element of the present invention provides a large open-circuit voltage and a large short-circuit current resulting in providing an improved photoelectric conversion efficiency.

Now, in order for the intermediate layer to effectively cause the foregoing effects, the intermediate is required to have a specific electrical property capable of allowing the application of an electric field thereon to promote transportation of photo-excited carrier in the intermediate layer.

In order to satisfy this requirement, the intermediate layer composed of the foregoing specific silicon-containing non-single crystal material is so designed as to exhibit an i-type conduction.

Further, the amount of the foregoing atoms ($M_1$) and the amount of the foregoing atoms ($M_2$) contained in the intermediate layer are important factors in order for the intermediate layer to provide effects of prolonging the lifetime of photo-excited carrier and producing energy level in notch, spike, etc. In case of incorporating these atoms ($M_1$) and ($M_2$) in excessive amounts into the intermediate layer, the intermediate layer cannot be desirably matched with the i-type semiconductor layer in terms of semiconductive matching.

In view of this, due regard should be made of the amounts of the two kind of atoms ($M_1$) and ($M_2$) to be contained in the intermediate layer.

The present inventors have experimentally found that the amount of the atoms ($M_1$) and the amount of the atoms ($M_2$) contained in the intermediate layer are to be adjusted in the range of from 1000 atomic ppm to 1 atomic % in order to attain the object of the present invention. It is considered for the amount of 1000 atomic ppm in this case that a mean distance among the atoms added corresponds to the distance which allows an electron to move by the tunnel effect.

In any case, the amount of the atoms ($M_1$) and the amount of the atoms ($M_2$) to be contained in the intermediate layer must be adjusted in the above range such that the number of acceptors (atoms ($M_1$)) activated becomes equivalent to the number of doners (atoms ($M_2$)) activated in the intermediate layer and the intermediate layer becomes substantially intrinsic. As will be later explained, the intermediate layer is formed by introducing a film-forming raw material gas, a raw material gas capable of supplying the atoms ($M_1$) (hereinafter referred to as "atoms ($M_1$) supplying gas") and a raw material gas capable of supplying the atoms ($M_2$) (hereinafter referred to as "atoms ($M_2$) supplying gas") together into a glow discharging deposition chamber at predetermined respective flow rates and applying a predetermined discharging energy into the deposition chamber to cause glow discharge resulting in the formation of the intermediate layer.

In order for the resulting intermediate layer to contain each of the atoms ($M_1$) and the atoms ($M_2$) in the foregoing range such that the number of acceptors activated is equivalent to the number of doners activated and the intermediate layer is intrinsic, the ratio of the amount of each of the atoms ($M_1$) supplying gas and the atoms ($M_2$) supplying gas to the film-forming raw material gas and the ratio between the amount of the atoms ($M_1$) supplying gas and the amount of the atoms ($M_2$) supplying gas upon forming the intermediate layer in the way as above described are properly controlled so as to provide the aforesaid situation for the intermediate layer depending upon the kind and property of each of the atoms ($M_1$) supplying gas and the atoms ($M_2$) supplying gas, and other related parameters required upon the formation of the intermediate layer.

The amount of hydrogen atoms (H) to be contained in the intermediate layer is an important factor in order to provide a desirable relaxation to the intermediate layer particularly in relation to the i-type semiconductor layer.

In a preferred embodiment in order to attain this purpose, the ratio $H_1/H_2$ of the concentration ($H_1$) of the hydrogen atoms contained in the intermediate layer to the concentration ($H_2$) of the hydrogen atoms contained in the i-type semiconductor layer is in the range of 1.05 to 1.5.

In the case where the intermediate layer is formed of the foregoing Non-Si:H:$M_1$:$M_2$:(C,Ge) material, the foregoing effects caused by the intermediate layer are improved. Particularly, when carbon atoms (C) are incorporated into the intermediate layer, the carbon atoms function to control the forbidden band of the intermediate layer.

As for the amount of carbon atoms (C) to be contained in the intermediate layer, it is preferably 3 to 30 atomic %, most preferably 5 to 20 atomic %. Likewise, as for the amount of germanium atoms (Ge) to be contained in the intermediate layer, it is preferably 5 to 70 atomic %, most preferably 10 to 60 atomic %. Further, in the case where both carbon atoms (C) and germanium atoms (Ge) are incorporated into the intermediate layer, the sum of the amounts of the carbon and germanium atoms is desired to be preferably in the range of from 5 to 70 atomic %, more preferably in the range of from 10 to 60 atomic %.

The thickness of the intermediate layer in the pin type photovoltaic element of the present invention is also an important factor in order for the intermediate layer to provide the foregoing effects desired therefor.

In a preferred embodiment, the thickness of the intermediate layer is adjusted to be 500 Å or less. In a most preferred embodiment, it is adjusted to be in the range of from 100 to 400 Å.

In the case where the intermediate layer contains the atoms ($M_1$) and the atoms ($M_2$) in relatively large amounts, its thickness is desired to be made thin in the above range.

Likewise, in the case where the intermediate layer contains the atoms ($M_1$) and the atoms ($M_2$) in relatively small amounts, its thickness is desired to be made thick in the above range.

Now, in the case where the thickness of the intermediate layer is less than 100 Å, the foregoing effects of the intermediate layer are not satisfactorily brought about. In the case where the thickness of the intermediate layer exceeds 500 Å, reduction is caused in the characteristics of the i-type semiconductor layer which is to be situated next to the intermediate layer.

I-Type Semiconductor Layer

The i-type semiconductor layer in the pin type photovoltaic element of the present invention plays an important role of generating carrier with light impinged and transporting the carrier generated.

In a typical embodiment, the i-type semiconductor layer is formed of a non-single crystal silicon material such as amorphous silicon materials (including microcrystal silicon materials).

Among those amorphous silicon materials, an amorphous material containing silicon atoms (Si) as the matrix and at least hydrogen atoms (H) or/and halogen atoms (X) (hereinafter referred to as "a-Si(H,X) material") is the most desirable.

The halogen atom (X) includes, specifically, fluorine (F), chlorine (Cl), bromine (Br) and iodine (I).

In the case when the i-type semiconductor layer is formed of a-Si(H,X) material, the amount of hydrogen atoms (H) or/and halogen atoms (X) contained in the i-type semiconductor layer is an important factor for reducing localized level in said layer and for maintaining the electric characteristics of said layer in a desirable state.

Thus, the amount of the hydrogen atoms (H), the amount of the halogen atoms or the sum of the amounts for the hydrogen atoms and the halogen atoms (H+X) contained in the i-type semiconductor layer is preferably in the range of from 1 to 40 atomic %, and most preferably, in the range of from 5 to 20 atomic %.

It is possible for the i-type semiconductor layer to be formed of a non-single crystal silicon material containing carbon atoms (C) or/and germanium atoms (Ge) (hereinafter referred to as "atoms (C,Ge)").

As such non-single crystal silicon material, amorphous materials (including microcrystal materials) containing silicon atoms (Si), atoms (C,Ge), and hydrogen atoms (H) or/and halogen atoms (X) (these amorphous materials will be hereinafter referred to as "a-Si:(C,Ge):(H,X) material") are the most desirable.

In the case where the i-type semiconductor layer is formed of a-Si:(C,Ge):(H,X) material, the resulting pin type photovoltaic element provide a further improved open-circuit voltage.

In the case where carbon atoms (C) are incorporated into the i-type semiconductor layer, its amount is preferably in the range of from 3 to 30 atomic %, and most preferably in the range of from 5 to 15 atomic %. In the case where germanium atoms (Ge) are incorporated into the i-type semiconductor layer, it is preferably 5 to 70 atomic %, most preferably 10 to 60 atomic %. Further, in the case where both carbon atoms (C) and germanium atoms (Ge) are incorporated into the intermediate-layer, the sum of the amounts of the carbon and germanium atoms is desired to be preferably in the range of from 5 to 70 atomic %, more preferably in the range of from 10 to 60 atomic %.

The amount of the hydrogen atoms (H), the amount of the halogen atoms or the sum of the amounts for the hydrogen atoms and the halogen atoms (H+X) contained in the i-type semiconductor layer is preferably in the range of from 1 to 40 atomic %, and most preferably, in the range of from 5 to 20 atomic %.

The thickness of the i-type semiconductor layer thus formed is an important parameter to govern the characteristics of the pin type photovoltaic element of the present invention.

The thickness of the i-type semiconductor layer in the pin type photovoltaic element of the present invention is appropriately determined having due regard to the absorption constant of said layer and the spectrum of a light source and also in the relationship with the intermediate layer and other semiconductor layer.

However, in general, it is determined to be preferably in the range of from 0.1 to 1 μm, most preferably in the range of from 0.2 to 0.6 μm.

P-Type Semiconductor Layer

The p-type semiconductor layer in the pin type photovoltaic element, is an important layer for governing the electromotive force and photo-current of said element.

In a typical embodiment, the p-type semiconductor layer in the pin type photovoltaic element is formed for a non-single crystal silicon material containing at least atoms of a Group IIIA element, which exhibits an activation energy preferably of less than 0.2 eV, most preferably of less than 0.1 eV and a specific resistance preferably of less than 10 Ωcm, most preferably of less than 1 Ωcm.

As such non-single crystal silicon material, there can be mentioned amorphous semiconductor materials (including microcrystal semiconductor materials) containing silicon atoms as the matrix, atoms of a Group IIIA element (hereinafter referred to as "Mp"), and at least hydrogen atoms (H) or/and halogen atoms (X)(hereinafter referred to as "a-Si:(H,X):Mp materials").

Among those a-Si:(H,X):Mp materials, microcrystal Si:(H,X):Mp materials of a mean particle size preferably in the range of from 30 to 200 Å, most preferably in the range of from 30 to 100 Å are the most desirable.

The halogen atom (X) includes, specifically, fluorine (F), chlorine (Cl), bromine (Br) and iodine (I).

The Group IIIA element (Mp) includes, specifically, boron (B), aluminum (Al), gallium (Ga), indium (In) and thallium (Tl).

In the case where the p-type semiconductor layer is formed of a-Si:(H,X):Mp material (excluding microcrystal material), the amount of the hydrogen atoms (H), the amount of the halogen atoms or the sum of the amounts for the hydrogen atoms and the halogen atoms (H+X) contained in the p-type semiconductor layer is preferably in the range of from 1 to 40 atomic %, and most preferably, in the range of from 5 to 20 atomic %.

In the case where the p-type semiconductor layer is formed of the foregoing microcrystal Si:(H,X):Mp material, the amount of the hydrogen atoms (H), the amount of the halogen atoms or the sum of the amounts for the hydrogen atoms and the halogen atoms (H+X) contained in the p-type semiconductor layer is preferably in the range of from 1 to 10 atomic %, and most preferably, in the range of from 1 to 7 atomic %.

As for the amount of the atoms of Mp contained in the p-type semiconductor layer in any of the above cases, it is preferably in the range of from 1 to 20 atomic %, most preferably in the range of from 5 to 10 atomic %.

The p-type semiconductor layer in the pin type photovoltaic element of the present invention may be formed of an amorphous semiconductor material (including microcrystal semiconductor material) containing silicon atoms (Si), carbon atoms (C), atoms of the foregoing Group IIIA element (that is, atoms of Mp), and at least hydrogen atoms (H) or/and halogen atoms, particularly in the case where the pin type photovoltaic element is configured such that light is impinged from the side of the p-type semiconductor layer, wherein absorption of light in the p-type semiconductor layer is required to reduce as much as possible.

The amount of the carbon atoms (C) contained in the p-type semiconductor layer in this case is preferably in the range of from 5 to 50 atomic %, most preferably in the range of from 10 to 30 atomic %.

Likewise, the amount of the hydrogen atoms (H), the amount of the halogen atoms or the sum of the amounts for the hydrogen atoms and the halogen atoms (H+X) contained in the p-type semiconductor layer is preferably in the range of from 1 to 40 atomic %, and most preferably, in the range of from 5 to 20 atomic %.

As for the amount of the atoms of Mp contained in the p-type semiconductor layer in this case, it is preferably in the range of from 1 to 20 atomic %, most preferably in the range of from 5 to 10 atomic %.

The thickness of the p-type semiconductor layer in the pin type photovoltaic element is preferably in the range of from 10 to 500 Å, most preferably in the range of from 30 to 100 Å.

N-Type Semiconductor Layer

The n-type semiconductor layer in the pin type photovoltaic element is an important layer of governing the electromotive force and photo-current of said element.

In a typical embodiment, the n-type semiconductor layer in the pin type photovoltaic element is formed of a non-single crystal silicon material containing at least atoms of a Group VA element which exhibits an activation energy preferably of less than 0.2 eV, most preferably of less than 0.1 eV and a specific resistance preferably of less than 10 Ωcm, most preferably of less than 1 Ωcm.

As such non-single crystal silicon material, there can be mentioned amorphous semiconductor materials (including microcrystal semiconductor materials) containing silicon atoms as the matrix, atoms of a Group VA element (hereinafter referred to as "Mn"), and at least hydrogen atoms (H) or/and halogen atoms (X) (hereinafter referred to as "a-Si:(H,X):Mn materials").

Among those a-Si:(H,X):Mn materials, microcrystal Si:(H,X):Mn materials of a mean particle size preferably in the range of from 30 to 200 Å, most preferably in the range of from 30 to 100 Å are the most desirable.

The halogen atom (X) includes, specifically, fluorine (F), chlorine (Cl), bromine (Br) and iodine (I).

The Group VA element (Mn) includes, specifically, phosphorus (P), nitrogen (N), arseric (As), antimony (Sb) and bismuth (Bi).

In the case where the n-type semiconductor layer is formed of a-Si:(H,X):Mn material (excluding microcrystal material), the amount of the hydrogen atoms (H), the amount of the halogen atoms or the sum of the amounts for the hydrogen atoms and the halogen atoms (H+X) contained in the n-type semiconductor layer is preferably in the range of from 1 to 40 atomic %, and most preferably, in the range of from 5 to 20 atomic %.

In the case where the n-type semiconductor layer is formed of the foregoing microcrystal Si:(H,X):Mn material, the amount of the hydrogen atoms (H), the amount of the halogen atoms or the sum of the amounts for the hydrogen atoms and the halogen atoms (H+X) contained in the i-type semiconductor layer is preferably in the range of from 1 to 10 atomic %, and most preferably, in the range of from 1 to 7 atomic %.

As for the amount of the atoms of Mn contained in the n-type semiconductor layer in any of the above cases, it is preferably in the range of from 1 to 20 atomic %, most preferably in the range of from 5 to 10 atomic %.

The n-type semiconductor layer in the pin type photovoltaic element of the present invention may be formed of an amorphous semiconductor material (including microcrystal semiconductor material) containing silicon atoms (Si), carbon atoms (C), atoms of the foregoing Group VA element (that is, atoms of Mn), and at least hydrogen atoms (H) or/and halogen atoms (hereinafter referred to as "a-SiC:(H,X):Mn material"), particularly in the case where the pin type photovoltaic element is configured such that light is impinged from the side of the n-type semiconductor layer, wherein absorption of light in the n-type semiconductor layer is required to reduce as much as possible.

In a preferred embodiment of this case, the n-type semiconductor layer is formed of a microcrystal semiconductor material of a mean particle size preferably in the range of from 30 to 200 Å, most preferably in the range of from 30 to 100 Å which contains silicon atoms (Si), carbon atoms (C), atoms of the foregoing Group VA element (that is, atoms of Mn), and at least hydrogen atoms (H) or/and halogen atoms (X) (hereinafter referred to as "microcrystal SiC:(H,X): Mn material").

The amount of the carbon atoms (C) contained in the n-type semiconductor layer in any of the above two cases is preferably in the range of from 5 to 50 atomic %, most preferably in the range of from 10 to 30 atomic %.

In the case where the n-type semiconductor layer is formed of a-SiC:(H,X):Mn material (excluding microcrystal material), the amount of the hydrogen atoms (H), the amount of the halogen atoms or the sum of the amounts for the hydrogen atoms and the halogen atoms (H+X) contained in the p-type semiconductor layer is preferably in the range of from 1 to 40 atomic %, and most preferably, in the range of from 5 to 20 atomic %.

In the case where the n-type semiconductor layer is formed of a microcrystal SiC:(H,X):Mn material, the amount of the hydrogen atoms (H), the amount of the halogen atoms or the sum of the amounts for the hydrogen atoms and the halogen atoms (H+X) contained in the n-type semiconductor layer is preferably in the range of from 1 to 10 atomic %, and most preferably in the range of from 1 to 7 atomic %.

As for the amount of the atoms of Mn contained in the n-type semiconductor layer in any of the above cases, it is preferably in the range of from 1 to 20 atomic %, most preferably in the range of from 5 to 10 atomic %.

The thickness of the n-type semiconductor layer in the pin type photovoltaic element is preferably in the range of from 10 to 500 Å, most preferably in the range of from 30 to 100 Å.

Substrate

The substrate for use in this invention may be either electroconductive or insulative. The electroconductive substrate can include, for example, metals such as NiCr, stainless steels, Al, Cr, Mo, Au, Nb, Ta, V, Ti, Pt and Pb or the alloys thereof.

The electrically insulative substrate can include, for example, films or sheets of synthetic resins such as polyester, polyethylene, polycarbonate, cellulose acetate, pllypropylene, polyvinyl chloride, polyvinylidene chloride, polystyrene, and polyamide, glass, ceramic and paper. It is preferred that the electrically insulative substrate is applied with electroconductive treatment to at least one of the surfaces thereof and disposed with a photovoltaic layer on the thus treated surface.

In the case of glass, for instance, electroconductivity is applied by disposing, at the surface thereof, a thin film made of NiCr, Al, Cr, Mo, Au, Ir, Nb, Ta, V, Ti, Pt, Pd, $In_2O_3$, $SnO_2$, ITO($In_2O_3+SnO_2$), etc. In the case of the synthetic resin film such as a polyester film, the electroconductivity is provided to the surface by disposing a thin film of metal such as NiCr, Al, Ag, Pv, Zn, Ni, Au, Cr, Mo, Ir, Nb, Ta, V, Tl and Pt by means of vacuum deposition, electron beam vapor deposition, sputtering, etc., or applying lamination with the metal to the surface. The substrate may be of any configuration such as cylindrical, belt-like or plate-like shape with a surface being plane or uneven, which can be properly determined depending on the application uses.

The thickness of the substrate member is properly determined so that the photovoltaic cell as desired can be formed.

In the case where flexibility is required for the pin type photovoltaic member, it can be made as thin as possible within a range capable of sufficiently providing the function as the substrate. However, the thickness is usually greater than 10 μm is view of the fabrication and handling or mechanical strength of the substrate.

Electrodes

In the photovoltaic element according to the present invention, an appropriate electrode is optionally used in accordance with the configuration of the photovoltaic element to be prepared. As such electrode, there can be mentioned lower electrode, upper electrode (transparent electrode) and collecting electrode. Said upper electrode denotes the one to be placed at the side through which light is impinged, and said lower electrode denotes the one to be placed opposite to the upper electrode through the semiconductor layers to be arranged between the two electrodes.

These electrodes will be explained in the following.
(i) Transparent Electrode

The transparent electrode is desired to have a light transmittance of more than 85% so that it enables the semiconductor layer to efficiently absorb sun-light or fluorescent light. In addition to this, it is desired to have a sheet resistance of 100 Ω or less from the view point of preventing the internal resistance of the photovoltaic element from becoming great resulting in impaired the performance.

In view of the above, the transparent electrode is desired to comprise a thin film of a metal oxide selected from the group consisting of $SnO_2$, $In_2O_3$, $ZnO$, $CdO$, $Cd_2SnO_2$ and ITO(In$_2$O$_3$+SnO$_2$) or a semitransparent thin film of a metal selected from the group consisting of Au, Al and Cu.

In any case, it is necessary to constitute the transparent electrode with a thin film member selected from the foregoing which is good in adhesion with the layer or the substrate.

The transparent electrode comprising such thin film may be formed by way of the known resistance heating deposition technique, electron-beam heating deposition technique, reactive sputtering technique or spraying technique.

(ii) Collecting Electrode

The collecting electrode in the pin type photovoltaic element according to the present invention is disposed on the transparent electrode for the purpose of reducing power loss caused by the sheet resistance of said transparent electrode.

The collecting electrode is desired to comprise a metallic thin film of Ag, Cr, Ni, Al, Ag, Au, Pt, Cu, Zn, Sn, Mn, Mo, W or alloy of these metals, these metallic thin films, Cu thin film, Al thin film and Ag thin film being the most desirable because of their small specific resistance.

It is possible for the collecting electrode to be constituted with a member comprising a plurality of such metallic thin films being stacked.

The collecting electrode comprising such metalic thin film may be formed by way of the known vacuum deposition technique, electron-beam deposition technique or sputtering technique.

In an alternative, the collecting electrode may be constituted by an electroconductive material comprising powdery metal dispersed in an appropriate organic material.

In this case, the collecting electrode may be formed by providing a coating composition comprising, for example, powdery metal dispersed in a Ag paste and applying the coating composition onto the surface of the transparent electrode by way of the known screen-printing technique.

The shape and the area of the collecting electrode are properly designed so that a sufficient quantity of light be impinged into the semiconductor layer.

Specifically as for the shape, it is desired to be such that extends uniformly all over the light receiving face of the photovoltaic element.

(iii) Lower Electrode for the pin type photovoltaic element according to the present invention, the side through which light is impinged is determined depending upon whether there is used a transmissive member or an untransmissive member as the substrate.

In this connection, the position where the lower electrode 107 is to be placed is properly determined depending upon the kind of substrate 101 to be used. For example, in the case where an untransmissive member such as metal member is used as the substrate, light for the generation of a photoelectromotive force is impinged from the side of the transparent electrode 105.

Now, in the case where the pin type photovoltaic element is of the configuration as shown in FIG. 1(A), the lower electrode 107 is desired to be placed between the substrate 101 and the p-type (or n-type) semiconductor layer 104. In this case, if the substrate 101 is the one which comprises an electroconductive member, it can function also as the lower electrode. However, in the case where the substrate 101 is electroconductive but is of a high sheet resistance, the lower electrode may be disposed as a low-resistant electrode serving to output a photocurrent or in order to heighten the reflectivity of the incident light at the surface of the substrate so as to make it utilized more efficiently.

In the case of FIG. 1(B), there is used a transmissive member as the substrate 101 and light is impinged from the side of the substrate 101. In this connection, the lower electrode 107 serving to output a photocurrent is placed on the surface of the top semiconductor layer above the substrate 101.

The electrode 107 may be a metallic thin film of a metal selected from the group consisting of In, Sn, Cd, Zn, Sb, Si, Cr and alloys of these metals. Other than these, the electrode 107 may be constituted by a thin film comprised of a member selected from the group consisting of oxides, nitrides and carbides of the foregoing metals. Said thin film to constitute the electrode 107 may be properly formed by way of the known vacuum deposition technique, electron-beam deposition technique or sputtering technique. However, due consideration shall be given that the metallic thin film to be thus formed not to be a resistant component for the photovoltaic cell.

Formation of the p-type, n-type and i-type
semiconductor layers and the intermediate layer Each of the constituent photovoltaic layers (p-type, n-type and i-type semiconductor layers, and intermediate layer) of the pin type photovoltaic element according to the present invention is desired to be formed by a conventional glow discharge decomposition method such as DC glow discharge decomposition method, RF glow discharge method or microwave (MW) glow discharge decomposition method since control of the conditions upon forming the layers having desired properties are relatively easy, and hydrogen atoms, halogen atoms and other atoms can be introduced easily together with silicon atoms.

For instance, when a layer composed of a Non-Si(H,X) material is formed, raw material gas capable of supplying silicon atoms (Si) is introduced together with raw material gas capable of introducing hydrogen atoms (H) or/and halogen atoms (X) into a deposition chamber, the inside pressure of which can be reduced, glow discharge is generated in the deposition chamber, and a layer composed of Non-Si(H,X) is formed on the surface of a substrate placed in the deposition chamber.

In the case of incorporating the atoms of the foregoing Group IIIA element or/and Group VA element (hereinafter referred to as "atoms (IIIA, VA)") or the atoms of C or/and Ge (hereinafter referred to as "atoms (C, Ge)") into said layer, appropriate raw material capable of supplying such atoms is introduced into the deposition chamber at the time of forming the Non-Si (H,X) layer.

The gas pressure (inner pressure) of the deposition chamber, the substrate temperature and the electrical discharging power upon forming a desirable Non-Si(H,X) film to be the photovoltaic layer are required to be properly determined as desired.

In any case, the actual conditions for forming the photovoltaic layer such as substrate temperature, electric discharging power and gas pressure in the deposition chamber cannot usually be determined with ease independent of each other. Accordingly, the conditions optimal to the layer formation are desirably determined based on relative and organic relationships for forming the photovoltaic layer having desired properties.

Basically when a layer composed of Non-Si(H,X) is formed, gaseous starting material for supplying Si capable of supplying silicon atoms(Si) are introduced together with gaseous starting material capable of supplying hydrogen atoms(H) and/or halogen atoms(X) into a deposition chamber the inside pressure of which can be reduced, glow discharge is generated in the deposition chamber, and a layer composed of Non-Si(H,X) is formed on the surface of a predetermined substrate disposed previously at a predetermined position.

The gaseous starting material capable of supplying Si can include gaseous or gasifiable silicon hydrides (silanes) such as $SiH_4$, $Si_2H_6$, $Si_3H_8$, $Si_4H_{10}$, etc., $SiH_4$ and $Si_2H_6$ being particularly preferred in view of ease in layer forming work and the good efficiency for the supply of Si.

These gaseous starting materials can be diluted with a dilution gas such as $H_2$, He, Ar, Ne, etc. upon their introduction into the deposition chamber, in case where necessary.

As the gaseous starting material capable of supplying halogen atoms(X), there can be mentioned various gaseous or gasifiable halogen compounds such as halogen gases, halides, inter-halogen compounds and halogen-substituted silane derivatives. Other than these, there can also be mentioned gaseous or gasifiable silicon hydrides containing halogen atoms.

Specifically, they can include halogen gas such as of fluorine, chlorine, bromine, and iodine; inter-halogen compounds such as BrF, ClF, $ClF_3$, $BrF_2$, $BrF_3$, $IF_7$, ICl, IBr, etc.; and silicon halides such as $SiF_4$, $Si_2F_6$, $SiCl_4$, and $SiBr_4$.

The use of the gaseous or gasifiable silicon halide as described above is particularly advantageous since the layer composed of Non-Si(H,X) can be formed with no additional use of the gaseous starting silicon hydride material for supplying Si.

In the case of forming the photovoltaic layer composed of a non-single crystal silicon material containing halogen atoms by the glow discharging method, typically, a mixture of a gaseous silicon halide substance as the starting material for supplying Si and a gas such as Ar, $H_2$ or He is introduced into the deposition chamber having a substrate in a predetermined mixing ratio and at a predetermined gas flow rate, and the thus introduced gases are exposed to the action of glow discharge to thereby cause a gas plasma resulting in forming said layer on the substrate.

And, for structurally incorporating hydrogen atoms (H) into said layer, an appropriate gaseous starting material for supplying hydrogen atoms can be additionally used.

Now, the gaseous starting material usable for supplying hydrogen atoms can include those gaseous or gasifiable materials, for example, hydrogen gas ($H_2$), halides such as HF, HCl, HBr, and HI, silicon hydrides such as $SiH_4$, $Si_2H_6$, $Si_3H_8$, and $Si_4H_{10}$, or halogen-substituted silicon hydrides such as $SiH_2F_2$, $SiH_2I_2$, $SiH_2Cl_2$, $SiHCl_3$, $SiH_2Br_2$, and $SiHBr_3$. The use of these gaseous starting material is advantageous since the content of hydrogen atoms (H), which are extremely effective in controlling the electrical or photoelectronic properties, can be controlled with ease. Then, the use of the hydrogen halide or the halogen-substituted silicon hydride as described above is particularly advantageous since the hydrogen atoms (H) are also introduced together with the introduction of the halogen atoms (X).

The amount of the hydrogen atoms (H) and/or the amount of the halogen atoms (X) to be contained in a layer are adjusted properly by controlling related conditions, for example, the temperature of a substrate, the amount of a gaseous starting material capable of supplying hydrogen atoms (H) or halogen atoms (X) into the deposition chamber and the electric discharging power.

In the case of structurally introducing the atoms (IIIA, VA) into a Non-Si(H,X) film to be formed in order to form the photovoltaic layer, a gaseous starting material capable of supplying atoms of the foregoing group IIIA or VA element is introduced together with the foregoing gaseous starting materials upon forming said film. As such starting material, there is used a gaseous or easily gasifiable material. Usable as the starting material for introducing atoms of the group IIIA element are, for example, boron hydrides such as $B_2H_6$, $B_4H_{10}$, $B_5H_9$, $B_5H_{11}$, $B_6H_{10}$, $B_9H_{15}$, and $B_{10}H_{14}$: boron halides such as $BF_3$, $BCl_3$, and $BBr_3$: other than these, $AlCl_3$, $CaCl_3$, $InCl_3$, $TlCl_3$, etc.

Usable as the starting material for introducing atoms of the group VA element are, for example, phosphorus hydrides such as $PH_3$ and $P_2H_4$: phosphorus halides such as $PH_4I$, $PF_3$, $PF_5$, $PCl_3$, $PCl_5$, $PBr_3$, $PBr_5$, and $PI_3$: other than these, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, etc.

In the case of structurally introducing the atoms (C,Ge) into a Non-Si(H,X) film to be formed in order to form the photovoltaic layer, a gaseous starting material capable of supplying carbon atoms (C) or germanium atoms (Ge) is introduced together with the foregoing gaseous starting materials upon forming said film.

Usable as the starting material capable of supplying carbon atoms(C) are, for example, gaseous or gasifiable saturated hydrocarbons of 1 to 4 carbon atoms, ethylenic hydrocarbons of 2 to 4 carbon atoms and acetylenic hydrocarbons of 2 to 3 carbon atoms.

Specifically, the saturated hydrocarbons can include methane ($CH_4$), ethane ($C_2H_6$), propane ($C_3H_8$), n-butane (n-$C_4H_{10}$) and pentane ($C_5H_{12}$), the ethylenic hydrocarbons can include ethylene ($C_2H_4$), propylene ($C_3H_6$), butene-1 ($C_4H_8$), butene-2 ($C_4H_8$), isobutylene ($C_4H_8$) and pentene ($C_5H_{10}$), and the acetylenic hydrocarbons can include acetylene ($C_2H_2$), methylacetylene ($C_3H_4$) and butine ($C_4H_6$).

Other than these, alkylsilanes such as tetramethlsilane ($Si(CH_3)_4$), tetraethylsilane ($Si(C_2H_5)_4$), etc. can be used as the starting material capable of supplying carbon atoms (C). These alkylsilanes are advantageous since they can supply not only carbon atoms(C) but also silicon atoms(Si).

Usable as the starting material capable of supplying germanium atoms (Ge) are, for example, germanium hydrides such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc.; germanium hydride halides such as $GeHF_3$, $GeH_2F_2$, $GeH_3F$, $GeHCl_3$, $GeH_2Cl_2$, $GeH_3Cl$, $GeHBr3$, $GeH_2Br_2$, $GeH_3Br$, $GeHI_3$, $GeH_2I_2$, $GeH_3I$, etc.; and germanium halides such as $GeF_4$, $GeCl_4$, $GeBr_4$, $GeI_4$, $GeF_2$, $GeCl_2$, $GeBr_2$, $GeI_2$, etc.

The features and advantages of the present invention will be described in more detail by reference to the following Experiments which are provided here for illustrative purposes only, and are not intended to limit the scope of this invention.

In each of the following experiments, there was used a film forming apparatus by the microwave glow discharge decomposition method shown in FIG. 3 (hereinafter referred to as "MW-PCVD apparatus") or a film-forming apparatus by the RF glow discharge decomposition method shown in FIG. 5 (hereinafter referred to as "RF-PCVD apparatus") for the preparation of a pin type photovoltaic element.

Experiment 1-1

Figure 3:
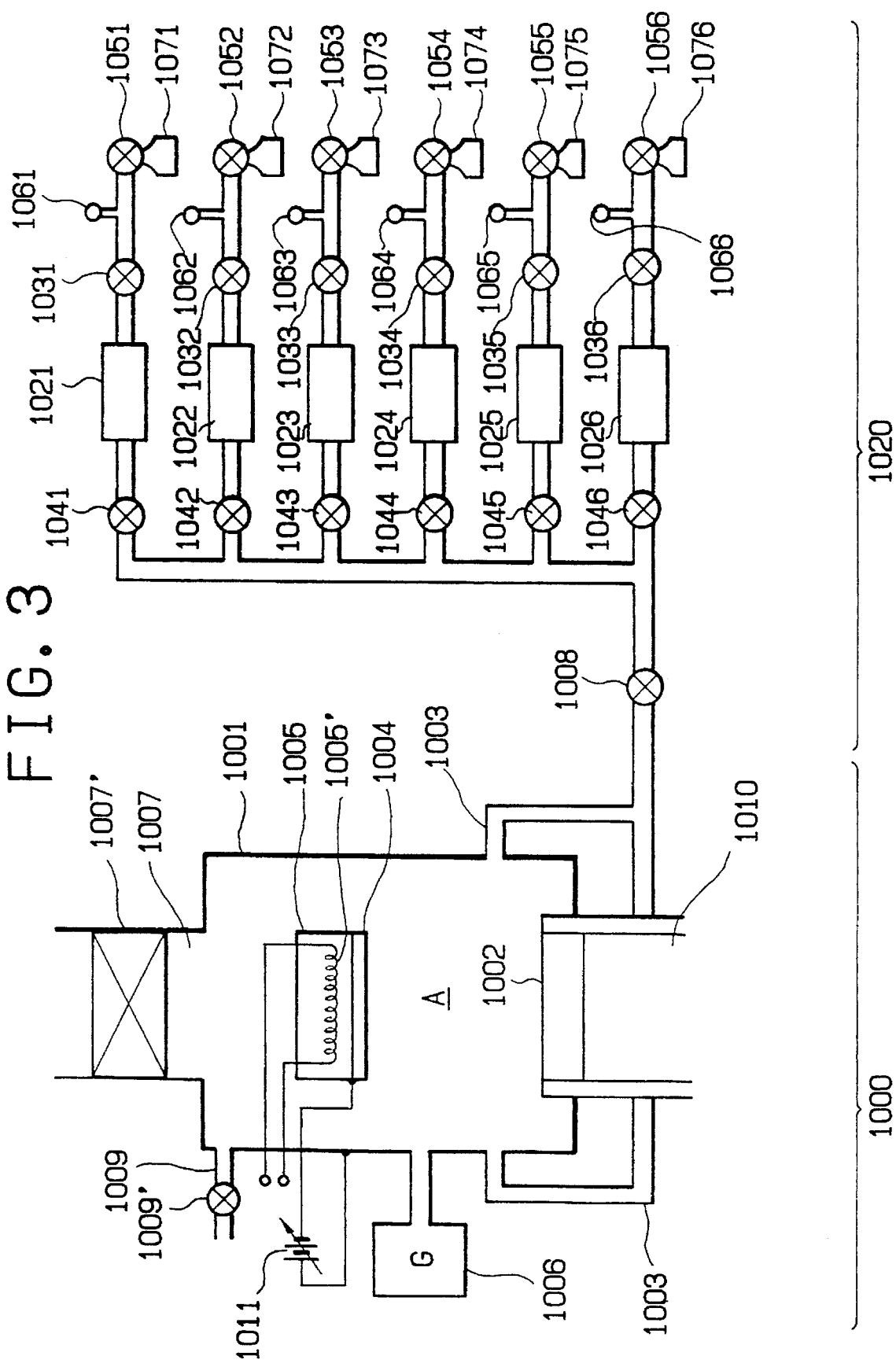
FIG. 3 is a schematic diagram to illustrate a representative apparatus suitable for preparing the pin type photovoltaic element according to the present invention by a microwave glow discharging method.

There was prepared a pin type photovoltaic element of the configuration shown in FIG. 1(A) under the conditions shown in Table 1, using the MW-PCVD apparatus shown in FIG. 3.

Referring to FIG. 3, gas reservoirs 1071, 1072, 1073, 1074, 1075, and 1076 in a gas supply system 1020 are charged with film-forming raw material gases for forming the respective layers, that is, $SiH_4$ gas (99.999% purity) in the reservoir 1071, $H_2$ gas (99.9999% purity) in the reservoir 1072, $CH_4$ gas (99.999% purity) in the reservoir 1073, $GeH_4$ gas (99.999% purity) in the reservoir 1074, $B_2H_6$ gas (99.999% purity) diluted with $H_2$ gas ($B_2H_6/H_2=10\%$) (hereinafter referred to as $B_2H_6/H_2$ gas") in the reservoir 1075, and $PH_3$ gas (99.999% purity) diluted with $H_2$ gas ($PH_3/H_2=10\%$) (hereinafter referred to as "$PH_3/H_2$ gas") in the reservoir 1076.

Numeral reference 1001 stands for a substantially enclosed deposition chamber having a reaction space A in a film formation system 1000. The deposition chamber 1001 is provided with a microwave introducing window 1002 to which a waveguide 1010 extending from a microwave power source (not shown) is connected. The deposition chamber 1001 is further provided with an exhaust pipe 1007 being connected through a conductance valve 1007' to a vacuum pump (not shown). Numeral reference 1003 is a gas feed pipe provided with a sub-valve 1008, which is extending from the gas supply system 1020 and open into the reaction space A. Numeral reference 1005 stands for a substrate holder on which a substrate 1004 is placed. Numeral reference 1005' stands for an electric heater installed in the substrate holder 1005. Numeral reference 1011 stands for a DC power source being electrically connected to the circumferential wall of the deposition chamber 1001 and the substrate holder 1005. Numeral reference 1006 stands for a vacuum gage connected to the reaction space A. Numeral reference 1009 stand for a leak pipe provided with a leak valve 1009'.

In the above apparatus, prior to the entrance of film-forming raw material gases into the reaction space A, it is confirmed that valves 1051 through 1056 of the gas reservoirs 1071 through 1076, inlet valves 1031 through 1036, and the leak valve 1009' are closed and that exit valves 1041 through 1046 and the sub-valve 1008 are opened. Then, the conductance valve 1007' is opened and the vacuum pump (not shown) is actuated to evacuate the reaction space A of the deposition chamber 1001 and the gas pipe ways. Upon observing that the reading on the vacuum gage 1006 became about $5\times10^{-4}$ Torr, the sub-valve 1008 and the outlet valves 1041 through 1046 are closed.

In the case of introducing film-forming raw material gases into the reaction space upon film formation, the apparatus is operated, for instance, in the following way.

$SiH_4$ gas from the reservoir 1071, $H_2$ gas from the reservoir 1072, $CH_4$ gas from the reservoir 1073, $GeH_4$ gas from the reservoir 1074, $B_2H_6/H_2$ gas from the reservoir 1075 and $PH_3/H_2$ gas from the reservoir 1076 are caused to flow into mass flow controllers 1021 through 1026 by opening the valves 1051 through 1056 and the inlet valves 1031 through 1036 while controlling each of the pressures of exit gages 1061 through 1066 to about 2 kg/cm².

Subsequently, the exit valves 1041 through 1046, and the sub-valve 1008 are gradually opened to enter the gases into the reaction space A through the gas feed pipe 1003. In this case, the exit valves 1041 through 1046 are adjusted so as to attain a desired value for the ratio among the flow rates of the gases, and the opening of the conductance valve 1007' is adjusted while observing the reading on the vacuum gage 1006 so as to attain a desired value for the gas pressure of the reaction space A. Then, after confirming that the temperature of the substrate 1004 is maintained at a predetermined temperature (for example at about 280° C.) by the electric heater 1014, a predetermined bias voltage is applied by the DC power source 1011 to the substrate 1004, and at the same time, the microwave power source (not shown) is switched on to apply a predetermined microwave power through the microwave introducing window 1002 into the reaction space A, to thereby cause microwave glow discharge in said reaction space while controlling the flow rates of the gases by using a microcomputer.

Now, reference is made to the preparation of the foregoing pin type photovoltaic element.

First, there was provided a stainless steel substrate (SUS 304) of 80 mm by 80 mm in size and 1 mm in thickness, having a mirror-ground surface as the substrate 1004. A 0.1 μm thick Ag film was formed on the surface of the substrate by a conventional sputtering method. Subsequently, a 1 μm thick ZnO film was laminated on the surface of the previously formed Ag film by a conventional vacuum evaporation method.

Thus, there was formed a lower electrode 107 comprising said Ag thin film and said ZnO thin film on the substrate 1004.

The substrate 1004 was fixed, with the lower electrode 107 facing downward, on the substrate holder 1005 in the deposition chamber 1001 of the MW-PCVD apparatus shown in FIG. 3.

An n-type semiconductor layer 102, an i-type semiconductor layer 103, an intermediate layer 106 and a p-type semiconductor layer 104 were successively formed on the substrate 1004 in accordance with the foregoing layer-forming procedures. That is, the exit valves 1041, 1042 and 1046, and the sub-valve 1008 were gradually opened to introduce $SiH_4$ gas, $H_2$ gas and $PH_3/H_2$ gas through the gas feed pipe 1003 into the reaction space A of the deposition chamber 1001. In this case, the flow rate of the $SiH_4$ gas, the flow rate of the $H_2$ gas and the flow rate of the $PH_3/H_2$ gas were controlled to 5 SCCM, 5 SCCM and 5 SCCM respectively by adjusting the mass flow controllers 1021, 1022 and 1026.

The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 0.1 W/cm³ through the microwave introducing window 1002 into the reaction space A to cause microwave glow discharge in the reaction space A, whereby forming a 0.01 μm thick a-Si:H:P film to be the n-type semiconductor layer 102 on the lower electrode 107.

After the formation of the n-type semiconductor layer being completed, the application of the bias voltage and the application of the microwave power were suspended, and the exit valves 1041, 1042 and 1046 and the sub-valve 1008 were closed.

Then, a semiconductor layer to be the i-type semiconductor layer 103 was formed on the previously formed n-type semiconductor layer 102. Subsequent to the procedures as above described, the exit valves 1041 and 1042 and the subvalve 1008 were opened to introduce $SiH_4$ gas and $H_2$ gas into the reaction space A of the deposition chamber 1001 at respective flow rates of 50 SCCM and 100 SCCM by adjusting the mass flow controllers 1021 and 1022. The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 0.5 W/cm³ through the microwave introducing window 1002 into the reaction space A to cause microwave glow discharge in the reaction space A, whereby forming a 0.4 μm thick a-Si:H film to be the i-type semiconductor layer 103 on the previously formed n-type semiconductor layer 102.

After the formation of the i-type semiconductor layer being completed, the application of the bias voltage and the application of the microwave power were suspended, and the exit valves 1041 and 1042 and the sub-valve 1008 were closed.

Successively, a layer to be the intermediate layer 106 was formed on the previously formed i-type semiconductor layer 103. That is, the exit valves 1041, 1042, 1045 and 1046, and the sub-valve 1008 were opened to introduce $SiH_4$ gas, $H_2$ gas, $B_2H_6/H_2$ gas and $PH_3/H_2$ gas through the gas feed pipe 1003 into the reaction space A of the deposition chamber 1001. In this case, the flow rate of the $SiH_4$ gas, the flow rate of the $H_2$ gas, the flow rate of the $B_2H_6/H_2$ gas and the flow rate of the $PH_3/H_2$ gas were controlled to 10 SCCM, 20 SCCM, 0.5 SCCM and 0.5 SCCM respectively by adjusting the mass flow controllers 1021, 1022, 1025 and 1026.

The gas pressure (inner pressure) of the reaction space of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 0.1 W/cm³ through the microwave introducing window 1002 into the reaction space A to cause microwave glow discharge in the reaction space A, whereby forming a 0.02 μm thick a-Si:H:B:P film to be the intermediate layer 106 on the previously formed i-type semiconductor layer 103.

After the formation of the intermediate layer being completed, the application of the bias voltage and the application of the microwave power were suspended, and the exit valves 1041, 1042, 1045 and 1046 and the sub-valve 1008 were closed.

Thereafter, a semiconductor layer to be the p-type semiconductor layer 104 was formed on the previously formed intermediate layer 106. That is, the exit valves 1041, 1042 and 1045, and the sub-valve 1008 were opened to introduce $SiH_4$ gas, $H_2$ gas and $B_2H_6/H_2$ gas through the gas feed pipe 1003 into the reaction space A of the deposition chamber 1001. In this case, the flow rate of the $SiH_4$ gas, the flow rate of the $H_2$ gas and the flow rate of the $B_2H_6/H_2$ gas were controlled to 5 SCCM, 500 SCCM and 5 SCCM respectively by adjusting the mass flow controllers 1021, 1022 and 1025.

The gas pressure (inner pressure) of the reaction space A of the deposition chamber 1001 was controlled to 20 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 1 W/cm³ through the microwave introducing window 1002 into the reaction space A to cause microwave glow discharge in the reaction space A, whereby forming a 0.005 μm thick microcrystal Si:H:B film to be the p-type semiconductor layer 104 on the previously formed intermediate layer 106.

After the formation of the p-type semiconductor layer was completed, the application of the bias voltage and the application of the microwave power were suspended, and the exit valves 1041, 1042 and 1045 and the sub-valve 1008 were closed.

The conditions for forming each of the above layers were collectively shown in Table 1.

In the above procedures of forming each constituent layer, all the exit valves other than those required for upon forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1007' to avoid the gases used for the formation of the previous layer left in the deposition chamber 1001 and in the pipe ways passes from the exit valves 1041 through 1046 to the inside of the deposition chamber 1001.

After being cooled to room temperature, the substrate was taken out from the deposition chamber 1001.

Then the substrate was placed in a known vacuum deposition apparatus, which was evacuated to $10^{-5}$ Torr or below. On the foregoing p-type semiconductor layer 104 was deposited an ITO thin film of about 0.085 μm in thickness in an oxygen atmosphere with about $1 \times 10^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formd a 2 μm thick comb-shaped collecting electrode. Thus there was obtained a pin type photovoltaic element (Sample No. 1).

Comparative Experiment 1-1

The procedures of Experiment 1-1 were repeated, except that neither the $B_2H_6/H_2$ gas nor the $PH_3/H_2$ gas were used for the formation of an intermediate layer, to thereby obtain a comparative pin type photovoltaic element (Comparative Sample No. 1).

Evaluations

Evaluation (1):

Each of Sample No. 1 and Comparative Sample No. 1 was evaluated with respect to open-circuit voltage (Voc) with irradiation of AM-1.5 light (100 mW/cm²) (hereinafter referred to as "evaluation item (a)"), short-circuit current (Isc) with irradiation of AM-1.5 light (100 mW/cm²) (hereinafter referred to as "evaluation item (b)"), photoelectric conversion efficiency with irradiation of AM-1.5 light (100 mW/cm²) (hereinafter referred to as "evaluation item (c)"), photoelectric conversion efficiency with irradiation of AM-1.5 light (100 mW/cm²) through an interference filter of 400 nm (hereinafter referred to as "evaluation item (d)"), and photoelectric conversion efficiency with irradiation of AM-1.5 light (100 mW/cm²) through an interference filter of 700 nm (hereinafter referred to as "evaluation item (e)"), respectively by a conventional measuring method.

As a result, it was found that Sample No. 1 is surpassing Comp. Sample No. 1 by 1.05 fold for the evaluation item (a), 1.07 fold for the evaluation item (b), 1.2 fold for the evaluation item (c), 1.25 fold for the evaluation item (d), and 1.05 fold for the evaluation item (e).

Evaluation (2):

The procedures of Experiment 1-1 for the formation of the i-type semiconductor layer were repeated to form a 0.05 µm thick a-Si:H film an a stainless steel substrate (hereinafter referred to as "i-type layer sample"). Separately, the procedures of Experiment 1-1 for the formation of the intermediate layer were repeated to form a 0.05 µm thick a-Si:H:B:P film on a stainless steel substrate (hereinafter referred to as "intermediate layer sample").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 4600 atomic ppm of the B and about 4000 atomic ppm of the P.

As for the contents of the H in each of the two layer samples, it was found that the content of the H in the intermediate layer sample is an amount of 1.27 holds over that in the i-type layer sample.

Evaluation (3):

The procedures of Experiment 1-1 for the formation of the intermediate layer were repeated to form a 0.5 µm thick a-Si:H:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.71 eV.

Then, a Cr gap electrode of 0.1 µm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.84 eV. From this result, it was found that the conduction type of the intermediate layer is substantially intrinsic.

Evaluation (4):

The procedures of Experiment 1-1 for the formation of the intermediate layer were repeated to form a 0.02 µm thick layer on a stainless steel substrate (hereinafter referred to as "intermediate layer sample"). Likewise, the procedures of Experiment 1-1 for the formation of the p-type semiconductor layer were repeated to form a 0.005 µm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEED device (product by JEOL Ltd.).

As a result, it was found that the intermediate layer sample is amorphous and the p-type semiconductor layer sample is microcrystalline.

The evaluated results obtained in the above evaluations (1) and (2) were collectively shown in FIG. 4 (A).

Experiment 1-2

The procedures of Experiment 1-1 were repeated, except that the flow rate of the $B_2H_6/H_2$ gas and the flow rate of the $PH_3/H_2$ gas were changed to those shown in Table 2, to thereby obtain three pin type photovoltaic elements (Sample Nos. 2-1 to 2-3). Each of the three samples obtained was evaluated in the same manner as in the foregoing evaluation (1).

The results obtained were collectively shown in FIG. 4(A).

Separately, there were prepared evaluation samples in order to perform the foregoing evaluations (2) to (4) with respect to each of the above three element samples Nos. 2-1 to 2-3. And using these evaluation samples, the foregoing evaluations (2) to (4) were performed.

The results obtained in the evaluation (2) were collectively shown in FIG. 4(A).

It was found that the amount of hydrogen atoms (H) contained in the intermediate layer is of a value corresponding to 1.2 to 1.35 fold over that contained in the i-type semiconductor layer for each of the three element samples.

It was also found with respect to the intermediate layer of each of the three element samples that the activation energy is of a value corresponding to about one second of the optical band gap and the intermediate layer is intrinsic.

Comparative Experiment 1-2

The procedures of Experiment 1-1 were repeated, except that the flow rate of the $B_2H_6/H_2$ gas and the flow rate of the $PH_3/H_2$ gas were changed to those shown in Table 3, to thereby obtain two comparative pin type photovoltaic elements (Comp. Samples Nos. 2-1 to 2-2).

Each of the two comparative samples was evaluated in the same manner as in the foregoing evaluation (1).

The results obtained were collectively shown in FIG. 4(A).

Separately, there were prepared evaluation samples in order to perform the foregoing evaluations (2) to (4) with respect to each of the above two comparative element samples (Comp. Samples Nos. 2-1 to 2-2).

Using these evaluation samples, the foregoing evaluations (2) to (4) were performed. The results obtained in the evaluation (2) were collectively shown in FIG. 4(A).

It was found that the amount of hydrogen atoms (H) contained in the intermediate layer is of a value corresponding to 1.2 to 1.35 fold over that contained in the i-type semiconductor layer for each of the two comparative element samples.

It was also found with respect to the intermediate layer of each of the two element samples that the activation energy is of a value corresponding to about one second of the optical band gap and the intermediate layer is intrinsic.

Comparative Experiment 1-3

The procedures of Experiment 1-1 were repeated, except that the thickness of the i-type semiconductor layer was changed to 0.42 µm, to thereby obtain a comparative pin type photovoltaic element (Comp. Sample No. 3).

The comparative element sample thus obtained was evaluated in the same manner as in the foregoing evaluation (1).

The results obtained were collectively shown in FIG. 4(A).

Conclusion

From the results shown in FIG. 4(A) and other results obtained in the foregoing Experiments 1-1 to 1-2 and Comparative Experiments 1-1 to 1-3, it was found that any of the pin type photovoltaic elements according to the present invention which were obtained in the foregoing Experiments 1-1 to 1-2 are surpassing the comparative pin type photovoltaic elements obtained in the foregoing Comparative Experiments 1-1 to 1-3 with respect to the characteristics required for a pin type photovoltaic element.

Experiment 1-3

Figure 5:
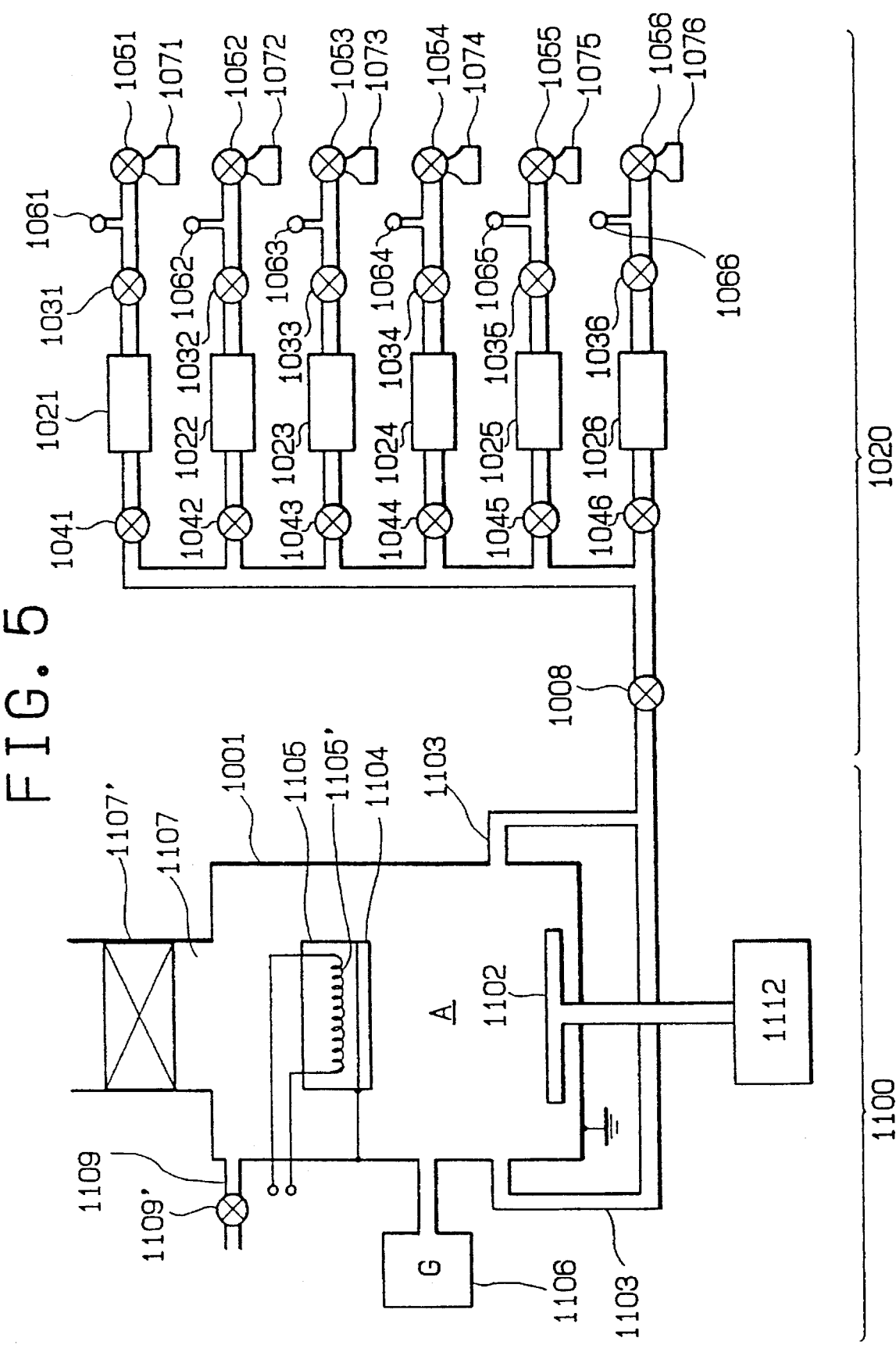
FIG. 5 is a schematic diagram to illustrate a representative apparatus suitable for the preparation of the pin type photovoltaic element according to the present invention by a RF glow discharging method.

There was prepared a pin type photovoltaic element of the configuration shown in FIG. 1(A) under the conditions shown in Table 4, using the RF-PCVD apparatus shown in FIG. 5.

In FIG. 5, numeral reference 1020 stands for a gas supply system of the same constitution as the gas supply system 1020 of the MW-PCVD apparatus shown in FIG. 3. Numeral reference 1100 stands for a film formation system containing a substantially enclosed deposition chamber which is different from the deposition chamber 1001 of the MW-PCVD apparatus shown in FIG. 3 with the point that the microwave introducing means comprising the waveguide 1010 and the microwave introducing window 1002 in the latter is changed to a RF power introducing system including a cathode 1102 and a high frequency matching box 112 and the DC bias voltage applying system including the DC power source 1011 in the latter is not provided.

The deposition chamber 1101 of the RF-PCVD apparatus shown in FIG. 5 has a reaction space A. The deposition chamber 1101 is provided with the cathode 1102 positioned to be opposite to a substrate 1104 placed on a substrate holder 1105 having an electric heater 1105' in the reaction space A. The cathode 1102 is extending from the high frequency matching box 1112 connected to a RF power source (not shown). The substrate holder 1105 is electrically connected to the circumferential wall of the deposition chamber 1101 which is electrically grounded.

The deposition chamber 1101 is provided with an exhaust pipe 1107 being connected through a conductance valve 1107' to a vacuum pump (not shown). Numeral reference 1103 is a gas feed pipe provided with a sub-valve 1008, which is extending from the gas supply system 1020. Numeral reference 1106 stands for a vacuum gage connected to the reaction space A. Numeral reference 1109 stands for a leak pipe provided with a leak valve 1109'.

Film formation in the RF-PCVD apparatus shown in FIG. 5 is carried out in the same manner as that in the MW-PCVD apparatus shown in FIG. 3, except for the procedures of applying a discharging power (RF power) into the reaction space.

The preparation of the foregoing pin type photovoltaic element using the RF-PCVD apparatus shown in FIG. 5 was carried out as follows.

Firstly, there was provided a stainless steel substrate (SUS 304) of 80 mm by 80 mm in size and 1 mm in thickness, having a mirror-ground surface as the substrate 1104. A 0.1 μm thick Ag film was formed on the surface of the substrate by a conventional sputtering method. Subsequently, a 1 μm thick ZnO film was laminated on the surface of the previously formed Ag film by a conventional vacuum evaporation method.

Thus, there was formed a lower electrode 107 comprising said Ag thin film and said ZnO thin film on the substrate 1104.

The substrate 1104 was fixed, with the lower electrode 107 facing downward, on the substrate holder 1105 in the deposition chamber 1101 of the RF-PCVD apparatus shown in FIG. 5.

An n-type semiconductor layer 102, an i-type semiconductor layer 103, an intermediate layer 106 and a p-type semiconductor layer 104 were successively formed on the substrate 1104. That is, the exit valves 1041, 1042 and 1046, and the sub-valve 1008 were gradually opened to introduce $SiH_4$ gas, $H_2$ gas and $PH_3/H_2$ gas through the gas feed pipe 1103 into the reaction space A of the deposition chamber 1101. In this case, the flow rate of the $SiH_4$ gas, the flow rate of the $H_2$ gas and the flow rate of the $PH_3/H_2$ gas were controlled to 1 SCCM, 50 SCCM and 1 SCCM respectively by adjusting the mass flow controllers 1021, 1022 and 1026.

The gas pressure (inner pressure) of the reaction space A of the deposition chamber 1101 was controlled to 1 Torr by regulating the opening of the conductance valve 1107' while observing the reading on the vacuum gage 1106. The substrate was maintained at 250° C.

The RF power source (not shown) was then switched on to apply RF power of 5 $mW/cm^2$ through the high frequency matching box 1112 and the cathode 1102 into the reaction space A to cause RF glow discharge in the reaction space A, whereby forming a 0.01 μm thick a-Si:H:P film to be the n-type semiconductor layer 102 on the lower electrode 107.

After the formation of the n-type semiconductor layer being completed, the application of the RF power was suspended, and the exit valves 1041, 1042 and 1046 and the sub-valve 1008 were closed.

Then, a semiconductor layer to be the i-type semiconductor layer 103 was formed on the previously formed n-type semiconductor layer 102. Subsequent to the procedures as above described, the exit valves 1041 and 1042 and the subvalve 1008 were opened to introduce $SiH_4$ gas and $H_2$ gas into the reaction space A of the deposition chamber 1101 at respective flow rates of 4 SCCM and 50 SCCM by adjusting the mass flow controllers 1021 and 1022. The gas pressure (inner pressure) of the reaction space A of the deposition chamber 1101 was controlled to 1 Torr by regulating the opening of the conductance valve 1107' while observing the reading on the vacuum gage 1106. The substrate was maintained at 250° C.

The RF power source (not shown) was then switched on the apply RF power of 10 $mW/cm^2$ through the high frequency matching box 1112 and the cathode 1102 into the reaction space A to cause RF glow discharge in the reaction space A, whereby forming a 0.4 μm thick a-Si:H film to be the i-type semiconductor layer 103 on the previously formed n-type semiconductor layer 102.

After the formation of the i-type semiconductor layer being completed, the application of the RF power was suspended, and the exit valves 1041 and 1042 and the sub-valve 1008 were closed.

Successively, a layer to be the intermediate layer 106 was formed on the previously formed i-type semiconductor layer 103. That is, the exit valves 1041, 1042, 1045 and 1046, and the sub-valve 1008 were opened to introduce $SiH_4$ gas, $H_2$ gas, $B_2H_6/H_2$ gas and $PH_3/H_2$ gas through the gas feed pipe 1103 into the reaction space A of the deposition chamber 1101. In this case, the flow rate of the $SiH_4$ gas, the flow rate of the $H_2$ gas, the flow rate of the $B_2H_6/H_2$ gas and the flow rate of the $PH_3/H_2$ were controlled to 2 SCCM, 50 SCCM, 0.1 SCCM and 0.1 SCCM respectively by adjusting the mass flow controllers 1021, 1022, 1025 and 1026.

The gas pressure (inner pressure) of the reaction space of the deposition chamber 1001 was controlled to 1 Torr by regulating the opening of the conductance valve 1107' while observing the reading on the vacuum gage 1106. The substrate was maintained at 250° C.

The RF power source (not shown) was then switched on to apply RF power of 5 mW/cm$^2$ through the high frequency matching box 1112 and the cathode 1102 into the reaction space A to cause RF glow discharge in the reaction space A, whereby forming a 0.03 μm thick a-Si:H:B:P film to be the intermediate layer 106 on the previously formed i-type semiconductor layer 103.

After the formation of the intermediate layer being completed, the application of the RF power was suspended, and the exit valves 1041, 1042, 1045 and 1046 and the sub-valve 1008 were closed.

Thereafter, a semiconductor layer to be the p-type semiconductor layer 104 was formed on the previously formed intermediate layer 106. That is, the exit valves 1041, 1042 and 1045, and the sub-valve 1008 were opened to introduce SiH$_4$ gas, H$_2$ gas and B$_2$H$_6$/H$_2$ gas through the gas feed pipe 1103 into the reaction space A of the deposition chamber 1101. In this case, the flow rate of the SiH$_4$ gas, the flow rate of the H$_2$ gas and the flow rate of the B$_2$H$_6$/H$_2$ gas were controlled to 1 SCCM, 150 SCCM and 1 SCCM respectively by adjusting the mass flow controllers 1021, 1022 and 1025.

The gas pressure (inner pressure) of the reaction space A of the deposition chamber 1101 was controlled to 1.5 Torr by regulating the opening of the conductance valve 1107' while observing the reading on the vacuum gage 1106. The substrate was maintained at 250° C.

The RF power source (not shown) was then switched on to apply RF power of 80 mW/cm$^2$ through the high frequency matching box 1112 and the cathode 1102 into the reaction space A to cause RF glow discharge in the reaction space A, whereby forming a 0.005 μm thick a-Si:H:B film to be the p-type semiconductor layer 104 on the previously formed intermediate layer 106.

After the formation of the p-type semiconductor layer was completed, the application of the RF power was suspended, and the exit valves 104, 1042, 1045 and the sub-valve 1008 were closed.

The conditions for forming each of the above layers were collectively shown in Table 4.

In the above procedures of forming each constituent layer, all the exit valves other than those required for forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1107' for avoiding the gases having been used for the formation of the previous layer were left in the deposition chamber 1101 and in the pipe ways from the exit valves 1041 through 1046 to the inside of the deposition chamber 1101.

After being cooled to room temperature, the substrate was taken out from the deposition chamber 1101.

Then, the substrate was placed in a known vacuum deposition apparatus, which was evacuated to 10$^{-5}$ Torr or below. On the foregoing p-type semiconductor layer 104 was deposited an ITO thin film of about 0.085 μm in thickness in an oxygen atmosphere with about 1×10$^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formed a 2 μm thick comb-shaped collecting electrode. Thus there was obtained a pin type photovoltaic element (Sample No. 3).

Comparative Experiment 1-4

The procedures of Experiment 1-3 were repeated, except that neither the B$_2$H$_6$/H$_2$ gas nor the PH$_3$/H$_2$ gas were used for the formation of an intermediate layer, to thereby obtain a comparative pin type photovoltaic element (Comp. Sample No. 4).

Evaluations

Evaluation (1):

Each of Sample No. 1 and Comparative Sample No. 4 was evaluated with respect to open-circuit voltage (Voc) with irradiation of AM-1.5 light (100 mW/cm$^2$) (hereinafter referred to as "evaluation item (a)"), short-circuit current (Isc) with irradiation of AM-1.5 light (100 mW/cm$^2$) (hereinafter referred to as "evaluation item (b)"), photoelectric conversion efficiency with irradiation of AM-1.5 light (100 mW/cm$^2$) (hereinafter referred to as "evaluation item (c)"), photoelectric conversion efficiency with irradiation of AM-1.5 light (100 mW/cm$^2$) through an interference filter of 400 nm (hereinafter referred to as "evaluation item (d)"), and photoelectric conversion efficiency with irradiation of AM-1.5 light (100 mW/cm$^2$) through an interference filter of 700 nm (hereinafter referred to as "evaluation item (e)"), respectively by a conventional measuring method.

As a result, it was found that Sample No. 3 is surpassing Comp. Sample No. 4 by 1.04 holds for the evaluation item (a), 1.06 holds for the evaluation item (b), 1.18 holds for the evaluation item (c), 1.21 holds for the evaluation item (d), and 1.1 holds for the evaluation item (e).

Evaluation (2):

The procedures of Experiment 1-3 for the formation of the i-type semiconductor layer were repeated to form a 0.05 μm thick a-Si:H film an a stainless steel substrate (hereinafter referred to as "i-type layer sample"). Separately, the procedures of Experiment 1-3 for the formation of the intermediate layer were repeated to form a 0.05 μm thick a-Si:H:B:P film on a stainless steel substrate (hereinafter referred to as "intermediate layer sample").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 5600 atomic ppm of the B and about 4800 atomic ppm of the P.

As for the contents of the H in each of the two layer samples, it was found that the content of the H in the intermediate layer sample is an amount of 1.19 holds over that in the i-type layer sample.

Evaluation (3):

The procedures of Experiment 1-3 for the formation of the intermediate layer were repeated to form a 0.5 μm thick a-Si:H:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.70 eV.

Then, a Cr gap electrode of 0.1 μm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.82 eV. From this result, it was found that the conduction type of the intermediate layer is substantially intrinsic.

Evaluation (4):

The procedures of Experiment 1-3 for the formation of the intermediate layer were repeated to form a 0.02 μm thick layer on a stainless steel substrate (hereinafter referred to as "intermediate layer sample"). Likewise, the procedures of Experiment 1-3 for the formation of the p-type semiconductor layer were repeated to form a 0.005 μm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEE device (product by JEOL Ltd.).

As a result, it was found that the intermediate layer sample is amorphous and the p-type semiconductor layer sample is also amorphous.

Experiment 1-4 and Comparative Experiment 1-5

(Experiment 1-4)

The procedures of Experiment 1-1 were repeated, except that the thickness of the intermediate layer to be formed was changed to 0.01, 0.04 and 0.05 μm respectively, to thereby obtain three pin type photovoltaic elements (Samples Nos. 4-1 to 4-3).

Comparative Experiment 1-5

The procedures of Experiment 1-1 were repeated, except that the thickness of the intermediate layer to be formed was changed to 0.005 and 0.07, to thereby obtain two comparative pin type photovoltaic elements (Comp. Samples Nos. 5-1 to 5-2).

Each of the samples obtained was evaluated with respect to photoelectric conversion efficiency with irradiation of AM-1.5 light (100 mW/cm$^2$) through an interference filter of 400 nm.

The evaluated results obtained were collectively shown in FIG. 6(A), in which the evaluated result of the pin type photovoltaic element (Sample No. 1) obtained in the foregoing Experiment 1-1 was together shown.

From the results shown in FIG. 6(A), it was found that any of the pin type photovoltaic elements respectively having the specific intermediate layer with a thickness in the range of 0.01 to 0.05 μm provides an improved photoelectric conversion efficiency. It was also found that the pin type photovoltaic elements with the specific intermediate layer having a thickness in the range of 0.01 to 0.04 μm provide a marked photoelectric conversion efficiency.

Experiment 1-5 and Comparative Experiment 1-6

(Experiment 1-5)

The procedures of Experiment 1-1 were repeated, except that the conditions for the formation of the intermediate layer were varied as shown in Table 5, to thereby obtain four pin type photovoltaic elements (Samples Nos. 5-1 to 5-4).

Each of the resultant Samples Nos. 5-1 to 5-4 was evaluated with respect to photoelectric conversion efficiency with irradiation of AM-1.5 light (100 mW/cm$^2$) through an interference filter of 400 nm.

The evaluated results obtained were collectively shown in FIG. 7(A), in which the evaluated result of the pin type photovoltaic element (Sample No. 1) obtained in the foregoing Experiment 1-1 was together shown.

Separately, evaluation samples for the foregoing evaluations (2) to (4) described in the foregoing Experiment 1-1 or 1-3 were prepared for each of the Samples No. 5-1 to 5-4. And using those samples prepared, said evaluations (2) to (4) were carried out.

The evaluated results with respect to the ratio of the H-content in the intermediate layer to the H-content in the i-type semiconductor layer were collectively shown in FIG. 7(A), in which the evaluated result for the pin type photovoltaic element (Sample No. 1) obtained in the foregoing Experiment 1-1 with respect to said ratio was together shown.

As for the content of boron atoms (B) and the content of phosphorus atoms (P) in the intermediate layer of each of the Samples Nos. 5-1 to 5-4, it was found that each of the four samples contains the B and P respectively in an amount in the range of 3500 to 6000 ppm. It was then found that the intermediate layer of each of the four samples (Samples Nos. 5-1 to 5-4) is substantially intrinsic.

Comparative Experiment 1-6

The procedures of Experiment 1-1 were repeated, except that the conditions for the formation of the intermediate layer were varied as shown in Table 5, to thereby obtain two comparative pin type photovoltaic elements (Comp. Samples Nos. 6-1 to 6-2).

Each of the resultant Comp. Samples Nos. 6-1 to 6-2 was evaluated with respect to photoelectric conversion efficiency with irradiation of AM-1.5 light (100 mW/cm$^2$) through an interference filter of 400 nm.

The evaluated results obtained were collectively shown in FIG. 7(A).

Separately, evaluation samples for the foregoing evaluations (2) to (4) described in the foregoing Experiment 1-1 or 1-3 were prepared for each of the Comp. Samples No. 6-1 to 6-2. And using those prepared samples, said evaluations (2) to (4) were carried out.

The evaluated results with respect to the ratio of the H-content in the intermediate layer to the H-content in the i-type semiconductor layer were collectively shown in FIG. 7(A).

As for the content of boron atoms (B) and the content of phosphorus atoms (P) in the intermediate layer of each of the Samples Nos. 6-1 to 6-2, it was found that each of the two comparative samples contains the B and P respectively in an amount in the range of 3500 to 6000 ppm. It was then found that the intermediate layer of each of the two comparative samples is intrinsic.

From the results shown in FIG. 7(A), it was found that each of the pin type photovoltaic elements in which the ratio of the H-content in the intermediate layer to the H-content in the i-type semiconductor layer is in the range of from 1.05 to 1.5 excels in photoelectric conversion efficiency.

Experiment 2-1

There was prepared a pin type photovoltaic element of the configuration shown in FIG. 1(A) under the conditions shown in Table 8, in the same manner as in the foregoing Experiment 1-1 using MW-PCVD apparatus shown in FIG. 3.

First, there was provided a stainless steel substrate (SUS 304) of 80 mm by 80 mm in size and 1 mm in thickness, having a mirror-ground surface as the substrate 1004. A 0.1 μm thick Ag film was formed on the surface of the substrate by a conventional sputtering method. Subsequently, a 1 μm thick ZnO film was laminated on the surface of the previously formed Ag film by a conventional vacuum evaporation method.

Thus, there was formed a lower electrode 107 comprising said AG thin film and said ZnO thin film on the substrate 1004.

The Substrate 1004 was fixed, with the lower electrode facing downward, on the substrate holder 1005 in the deposition chamber 1001 of the Mw-PCVD apparatus shown in FIG. 3.

An n-type semiconductor layer 102, an i-type semiconductor layer 103, an intermediate layer 106 and a p-type semiconductor layer 104 were successively formed on the substrate 1004 in the same manner as in the foregoing Experiment 1-1. That is, the exit valves 1041, 1042 and 1046, and the sub-valve 1008 were gradually opened to introduce $SiH_4$ gas, $H_2$ gas and $PH_3/H_2$ gas through the gas feed pipe 1003 into the reaction space A of the deposition chamber 1001. In this case, the flow rate of the $SiH_4$ gas, the flow rate of the $H_2$ gas and the flow rate of the $PH_3/H_2$ gas were controlled to 5 SCCM, 5 SCCM and 5 SCCM respectively by adjusting the mass flow controllers 1021, 1022 and 1026.

The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of –40 V into the reaction space A. Then, the microwave power source (not shown) was switched on to apply microwave power of 0.1 W/cm³ through the microwave introducing window 1002 into the reaction space A to cause microwave glow discharge in the reaction space A, whereby forming a 0.01 μm thick a-Si:H:P film to be the n-type semiconductor layer 102 on the lower electrode 107.

After the formation of the n-type semiconductor layer being completed, the application of the bias voltage and the application of the microwave power were suspended, and the exit valves 1041, 1042 and 1046 and the sub-valve 1008 were closed.

Then, a semiconductor layer to be the i-type semiconductor layer 103 was formed on the previously formed n-type semiconductor layer 102. This is, the exit valves 1041, 1042 and 1043 and the sub-valve 1008 were opened to introduce $SiH_4$ gas, $H_2$ gas and $CH_4$ gas into the reaction space A of the deposition chamber 1001 at respective flow rates of 50 SCCM, 100 SCCM and 2.5 SCCM by adjusting the mass flow controllers 1021, 1022 and 1023. The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of –40 V into the reaction space A. Then, the microwave power source (not shown) was switched on to apply microwave power of 0.75 W/cm³ through the microwave introducing window 1002 into the reaction space A to cause microwave glow discharge in the reaction space A, whereby forming a 0.4 μm thick a-Si:H:C film to be the i-type semiconductor layer 103 on the previously formed n-type semiconductor layer 102.

After the formation of the i-type semiconductor layer being completed, the application of the bias voltage and the application of the microwave power were suspended, and the exit valves 1041, 1042 and 1043 and the sub-valve 1008 were closed.

Successively, a layer to be the intermediate layer 106 was formed on the previously formed i-type semiconductor layer 103. That is, the exit valves 1041, 1042, 1043, 1045 and 1046, and the sub-valve 1008 were opened to introduce $SiH_4$ gas, $H_2$ gas, $CH_4$ gas, $B_2H_6/H_2$ gas and $PH_3/H_2$ gas through the gas feed pipe 1003 into the reaction space A of the deposition chamber 1001. In this case, the flow rate of the $SiH_4$ gas, the flow rate of the $H_2$ gas, the flow rate of the $CH_4$ gas, the flow rate of the $B_2H_6/H_2$ gas and the flow rate of the $PH_3/H_2$ were controlled to 10 SCCM, 20 SCCM, 0.5 SCCM, 0.5 SCCM and 0.5 SCCM respectively by adjusting the mass flow controllers 1021, 1022, 1023, 1025 and 1026.

The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of –40 V into the reaction space A. Then, the microwave power source (not shown) was switched on to apply microwave power of 0.15 W/cm³ through the microwave introducing window 1002 into the reaction space A to cause microwave glow discharge in the reaction space A, whereby forming a 0.02 μm thick a-Si:H:C:B:P film to be the intermediate layer 106 on the previously formed i-type semiconductor layer 103.

After the formation of the intermediate layer being completed, the application of the bias voltage and the application of the microwave power were suspended, and the exit valves 1041, 1042, 1043, 1045 and 1046 and the subvalve 1008 were closed.

Thereafter, a semiconductor layer to be the p-type semiconductor layer 104 was formed on the previously formed intermediate layer 106. That is, the exit valves 1041, 1042, 1043 and 1045, and the sub-valve 1008 were opened to introduce $SiH_4$ gas, $H_2$ gas and $CH_4$ gas and $B_2H_6/H_2$ gas through the gas feed pipe 1003 into the reaction space A of the deposition chamber 1001. In this case, the flow rate of the $SiH_4$ gas, the flow rate of the $H_2$ gas, the flow rate of the $CH_4$ gas and the flow rate of the $B_2H_6/H_2$ gas were controlled to 5 SCCM, 500 SCCM and 0.5 SCCM and 5 SCCM respectively by adjusting the mass flow controllers 1021, 1022, 1023 and 1025.

The gas pressure (inner pressure) of the reaction space A of the deposition chamber 1001 was controlled to 20 mTorr by regulating the opening of the conductance valve 1007' while observing the reading on the vacuum gage 1006. The substrate was maintained at 280° C.

The DC power source 1011 was switched on to apply a DC bias voltage of −40 V into the reaction space A. Then, the microwave power source (not shown) was switched on to apply microwave power of 1.5 W/cm$^3$ through the microwave introducing window 1002 into the reaction space A to cause microwave glow discharge in the reaction space A, whereby forming a 0.005 μm thick microcrystal Si:H:C:B film to be the p-type semiconductor layer 104 on the previously formed intermediate layer 106.

After the formation of the p-type semiconductor layer being completed, the application of the bias voltage and the application of the microwave power were suspended, and the exit valves 1041, 1042, 1043 and 1045 and the sub-valve 1008 were closed.

The conditions for forming each of the above layers were collectively shown in Table 8.

In the above procedures of forming each constituent layer, all the exit valves other than those required for upon forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1007' for avoiding the gases having been used for the formation of the previous layer were left in the deposition chamber 1001 and in the pipe ways from the exit valves 1041 through 1046 to the inside of the deposition chamber 1001.

After being cooled to room temperature, the substrate was taken out from the deposition chamber 1001.

Then the substrate was placed in a known vacuum deposition apparatus, which was evacuated to 10$^{-5}$ Torr or below. On the foregoing p-type semiconductor layer 104 was deposited an ITO thin film of about 0.085 μm in thickness in an oxygen atmosphere with about 1×10$^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formd a 2 μm thick comb-shaped collecting electrode. Thus there was obtained a pin type photovoltaic element (Sample No. 6).

Comparative Experiment 2-1

The procedures of Experiment 2-1 were repeated, except that neither the B$_2$H$_6$/H$_2$ gas nor the PH$_3$/H$_2$ gas were used for the formation of an intermediate layer, to thereby obtain a comparative pin type photovoltaic element (Comparative Sample No. 7).

Evaluations

Evaluation (1):

Each of Sample No. 6 and Comparative Sample No. 7 was evaluated with respect to open-circuit voltage (Voc) with irradiation of AM-1.5 light (100 mW/cm$^2$) (hereinafter referred to as "evaluation item (a)"), short-circuit current (Isc) with irradiation of AM-1.5 light (100 mW/cm$^2$) (hereinafter referred to as "evaluation item (b)"), photoelectric conversion efficiency with irradiation of AM-1.5 light (100 mW/cm$^2$)(hereinafter referred to as "evaluation item (c)"), photoelectric conversion efficiency with irradiation of AM-1.5 light (100 mW/cm$^2$) through an interference filter of 400 nm (hereinafter referred to as "evaluation item (d)"), and photoelectric conversion efficiency with irradiation of AM-1.5 light (100 mW/cm$^2$) through an interference filter of 700 nm (hereinafter referred to as "evaluation item (e)"), respectively by a conventional measuring method.

As a result, it was found that Sample No. 6 is surpassing Comp. Sample No. 7 by 1.06 holds for the evaluation item (a), 1.08 holds for the evaluation item (b), 1.21 holds for the evaluation item (c), 1.27 holds for the evaluation item (d), and 1.04 holds for the evaluation item (e).

Evaluation (2):

The procedures of Experiment 2-1 for the formation of the i-type semiconductor layer were repeated to form a 0.05 um thick a-Si:H:C film an a stainless steel substrate (hereinafter referred to as "i-type layer sample"). Separately, the procedures of Experiment 2-1 for the formation of the intermediate layer were repeated to form a 0.05 μm thick a-Si:H:C:B:P film on a stainless steel substrate (hereinafter referred to as "intermediate layer sample ").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 4200 atomic ppm of the B and about 3800 atomic ppm of the P.

As for the contents of the H in each of the two layer samples, it was found that the content of the H in the intermediate layer sample is an amount of 1.22 folds over that in the i-type layer sample.

Evaluation (3):

The procedures of Experiment 2-1 for the formation of the intermediate layer were repeated to form a 0.5 um thick a-Si:H:C:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.94 eV.

Then, a Cr gap electrode of 0.1 μm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.96 eV. From this result, it was found that the conduction type of the intermediate layer is substantially intrinsic.

Evaluation (4):

The procedures of Experiment 2-1 for the formation of the intermediate layer were repeated to form a 0.02 μm thick layer on a stainless steel substrate (hereinafter referred to as "intermediate layer sample"). Likewise, the procedures of Experiment 2-1 for the formation of the p-type semiconductor layer were repeated to form a 0.005 μm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEED device (product by JEOL Ltd.).

As a result, it was found that the intermediate layer sample is amorphous and the p-type semiconductor layer sample is microcrystalline.

The evaluated results obtained in the above evaluations (1) and (2) were collectively shown in FIG. 4(B).

Experiment 2-2

The procedures of Experiment 2-1 were repeated, except that the flow rate of the $B_2H_6/H_2$ gas and the flow rate of the $PH_3/H_2$ gas were changed to those shown in Table 9, to thereby obtain three pin type photovoltaic elements (Sample Nos. 7-1 to 7-3). Each of the three samples obtained was evaluated in the same manner as in the foregoing evaluation The results obtained were collectively shown in FIG. 4(B).

Separately, there were prepared evaluation samples in order to perform the foregoing evaluations (2) to (4) with respect to each of the above three element samples Nos. 7-1 to 7-3. And using these evaluation samples, the foregoing evaluations (2) to (4) were performed.

The results obtained in the evaluation (2) were collectively shown in FIG. 4(B).

It was found that the amount of hydrogen atoms (H) contained in the intermediate layer is of a value corresponding to 1.15 to 1.35 holds over that contained in the i-type semiconductor layer for each of the three element samples.

It was also found with respect to the intermediate layer of each of the three element samples that the activation energy is of a value corresponding to about one second of the optical band gap and the intermediate layer is intrinsic.

Comparative Experiment 2-2

The procedures of Experiment 2-1 were repeated, except that the flow rate of the $B_2H_6/H_2$ gas and the flow rate of the $PH_3/H_2$ gas were changed to those shown in Table 10, to thereby obtain two comparative pin type photovoltaic elements (Comp. Samples Nos. 8-1 to 8-2).

Each of the two comparative samples was evaluated in the same manner as in the foregoing evaluation (1).

The results obtained were collectively shown in FIG. 4(B).

Separately, there were prepared evaluation samples in order to perform the foregoing evaluations (2) to (4) with respect to each of the above two comparative element samples (Comp. Samples Nos. 8-1 to 8-2).

Using these evaluation samples, the foregoing evaluations (2) to (4) were performed. The results obtained in the evaluation (2) were collectively shown in FIG. 4(B).

It was found that the amount of hydrogen atoms (H) contained in the intermediate layer is of a value corresponding to 1.2 to 1.35 fold over that contained in the i-type semiconductor layer for each of the two comparative element samples.

It was also found with respect to the intermediate layer of each of the two comparative element samples that the activation energy is of a value corresponding to about one second of the optical band gap and the intermediate layer is intrinsic.

Comparative Experiment 2-3

The procedures of Experiment 2-1 were repeated, except that the thickness of the i-type semiconductor layer, to be formed was changed to 0.42 μm, to thereby obtain a comparative pin type photovoltaic element (Comp. Sample No. 9).

The comparative element sample obtained was evaluated in the same manner as in the foregoing evaluation (1).

The results obtained were collectively shown in FIG. 4(B).

Conclusion

From the results shown in FIG. 4(B) and other results obtained in the foregoing Experiments 2-1 to 2-2 and Comparative Experiments 2-1 to 2-3, it was found that any of the pin type photovoltaic elements according to the present invention which were obtained in the foregoing Experiments 2-1 to 2-2 are surpassing the comparative pin type photovoltaic elements obtained in the foregoing Comparative Experiments 2-1 to 2-3 with respect to the characteristics required for a pin type photovoltaic element.

Experiment 2-3

There was prepared a pin type photovoltaic element of the configuration shown in FIG. 1(A) under the conditions shown in Table 11, in the same amnner as in the foregoing Experiment 1-3 using the RF-PCVD apparatus shown in FIG. 5.

Firstly, there was provided a stainless steel substrate (SUS 304) of 80 mm by 80 mm in size and 1 mm in thickness, having a mirror-ground surface as the substrate 1104. A 0.1 μm thick Ag film was formed on the surface of the substrate by a conventional sputtering method. Subsequently, a 1 μm thick ZnO film was laminated on the surface of the previously formed Ag film by a conventional vacuum evaporation method.

Thus, there was formed a lower electrode 107 comprising said Ag thin film and said ZnO thin film on the substrate 1004.

The substrate 1104 was fixed, with the lower electrode 107 facing downward, on the substrate holder 1105 in the deposition chamber 1101 of the RF-PCVD apparatus shown in FIG. 5.

An n-type semiconductor layer 102, an i-type semiconductor layer 103, an intermediate layer 106 and a p-type semiconductor layer 104 were successively formed on the substrate 1104.

First, a semiconductor layer to be the n-type semiconductor layer 102 in the way as follows. That is, the exit valves 1041, 1042 and 1046, and the sub-valve 1008 were opened to introduce $SiH_4$ gas, $H_2$ gas and $PH_3/H_2$ gas through the gas feed pipe 1103 into the reaction space A of the deposition chamber 1101. In this case, the flow rate of the $SiH_4$ gas, the flow rate of the $H_2$ gas and the flow rate of the $PH_3/H_2$ gas were controlled to 1 SCCM, 50 SCCM and 1 SCCM respectively by adjusting the mass flow controllers 1021, 1022 and 1026.

The gas pressure (inner pressure) of the reaction space A of the deposition chamber 1101 was controlled to 1 Torr by regulating the opening of the conductance valve 1107' while observing the reading on the vacuum gage 1106. The substrate 1104 was maintained at 250° C.

The RF power source (not shown) was then switched on to apply RF power of 5 mW/cm² through the high frequency matching box 1112 and the cathode 1102 into the reaction space A to cause RF glow discharge in the reaction space A, whereby forming a 0.01 μm thick a-Si:H:P film to be the n-type semiconductor layer 102 on the lower electrode 107.

After the formation of the n-type semiconductor layer being completed, the application of the RF power was suspended, and the exit valves 1041, 1042 and 1046 and the sub-valve 1008 were closed.

Then, a semiconductor layer to be the i-type semiconductor layer 103 was formed on the previously formed n-type semiconductor layer 102. That is, the exit valves 1041, 1042 and 1043 and the sub-valve 1008 were opened to introduce SiH$_4$ gas, H$_2$ gas and CH$_4$ gas into the reaction space A of the deposition chamber 1101 at respective flow rates of 4 SCCM, 50 SCCM and 1 SCCM by adjusting the mass flow controllers 1021, 1022 and 1023. The gas pressure (inner pressure) of the reaction space A of the deposition chamber 1101 was controlled to 1 Torr by regulating the opening of the conductance valve 1107' while observing the reading on the vacuum gage 1106. The substrate was maintained at 250° C.

The RF power source (not shown) was then switched on the apply RF power of 16 mW/cm$^2$ through the high frequency matching box 1112 and the cathode 1102 into the reaction space A to cause RF glow discharge in the reaction space A, whereby forming a 0.4 μm thick a-Si: H: C film to be the i-type semiconductor layer 103 on the previously formed n-type semiconductor layer 102.

After the formation of the i-type semiconductor layer being completed, the application of the RF power was suspended, and the exit valves 1041, 1042 and 1043 and the sub-valve 1008 were closed.

Successively, a layer to be the intermediate layer 106 was formed on the previously formed i-type semiconductor layer 103. That is, the exit valves 1041, 1042, 1043, 1045 and 1046, and the sub-valve 1008 were opened to introduce SiH$_4$ gas, H$_2$ gas, CH$_4$ gas, B$_2$H$_6$/H$_2$ gas and PH$_3$/H$_2$ gas through the gas feed pipe 1103 into the reaction space A of the deposition chamber 1101. In this case, the flow rate of the SiH$_4$ gas, the flow rate of the H$_2$ gas, the flow rate of the CH$_4$ gas, the flow rate of the B$_2$H$_6$/H$_2$ gas and the flow rate of the PH$_3$/H$_2$ were controlled to 2 SCCM, 50 SCCM, 0.5 SCCM, 0.1 SCCM and 0.1 SCCM respectively by adjusting the mass flow controllers 1021, 1022, 1023, 1025 and 1026.

The gas pressure (inner pressure) of the reaction space A of the deposition chamber 1001 was controlled to 1 Torr by regulating the opening of the conductance valve 1107' while observing the reading on the vacuum gage 1106. The substrate was maintained at 250° C.

The RF power source (not shown) was then switched on to apply RF power of 8 mW/cm$^2$ through the high frequency matching box 1112 and the cathode 1102 into the reaction space A to cause RF glow discharge in the reaction space A, whereby forming a 0.03 μm thick a-Si:H:C:B:P film to be the intermediate layer 106 on the previously formed i-type semiconductor layer 103.

After the formation of the intermediate layer being completed, the application of the RF power was suspended, and the exit valves 1041, 1042, 1043, 1045 and 1046 and the sub-valve 1008 were closed.

Thereafter, a semiconductor layer to be the p-type semiconductor layer 104 was formed on the previously formed intermediate layer 106. That is, the exit valves 1041, 1042, 1043 and 1045, and the sub-valve 1008 were opened to introduce SiH$_4$ gas, H$_2$ gas, CH$_4$ gas and B$_2$H$_6$/H$_2$ gas through the gas feed pipe 1103 into the reaction space A of the deposition chamber 1101. In this case, the flow rate of the SiH$_4$ gas, the flow rate of the H$_2$ gas, the flow rate of the CH$_4$ gas and the flow rate of the B$_2$H$_6$/H$_2$ gas were controlled to 1 SCCM, 150 SCCM, 0.1 SCCM and 1 SCCM respectively by adjusting the mass flow controllers 1021, 1022, 1023 and 1025.

The gas pressure (inner pressure) of the reaction space A of the deposition chamber 1101 was controlled to 1.5 Torr by regulating the opening of the conductance valve 1107' while observing the reading on the vacuum gage 1106. The substrate was maintained at 250° C.

The RF power source (not shown) was then switched on to apply RF power of 130 mW/cm$^2$ through the high frequency matching box 1112 and the cathode 1102 into the reaction space A to cause RF glow discharge in the reaction space A, whereby forming a 0.005 μm thick a-Si:H:C:B film to be the p-type semiconductor layer 104 on the previously formed intermediate layer 106.

After the formation of the p-type semiconductor layer being completed, the application of the RF power was suspended, and the exit valves 104, 1042, 1043 and 1045 and the sub-valve 1008 were closed.

The conditions for forming each of the above layers were collectively shown in Table 11.

In the above procedures of forming each constituent layer, all the exit valves other than those required for upon forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1107' to avoid the gases used for the formation of the previous layer left in the deposition chamber 1101 and in the pipe ways from passing the exit valves 1041 through 1046 to the inside of the deposition chamber 1101.

After being cooled to room temperature, the substrate was taken out from the deposition chamber 1101.

Then, the substrate was placed in a known vacuum deposition apparatus, which was evacuated to 10$^{-5}$ Torr or below. On the foregoing p-type semiconductor layer 104 was deposited an ITO thin film of about 0.085 μm in thickness in an oxygen atmosphere with about 1×10$^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formed a 2 μm thick comb-shaped collecting electrode. Thus there was obtained a pin type photovoltaic element (Sample No. 8).

Comparative Experiment 2-4

The procedures of Experiment 2-3 were repeated, except that neither the B$_2$H$_6$/H$_2$ gas nor the PH$_3$/H$_2$ gas were used for the formation of an intermediate layer, to thereby obtain a comparative pin type photovoltaic element (Comparative Sample No. 10).

Evaluations

Evaluation (1):

Each of Sample No. 8 and Comparative Sample No. 10 was evaluated with respect to open-circuit voltage (Voc) with irradiation of AM-1.5 light (100 mW/cm$^2$) (hereinafter referred to as "evaluation item (a)"), short-circuit current (Isc) with irradiation of AM-1.5 light (100 mW/cm$^2$) (hereinafter after referred to as "evaluation item (b)"), photoelectric conversion efficiency with irradiation of AM-1.5 light (100 mW/cm$^2$) (hereinafter referred to as "evaluation item (c)"), photoelectric conversion efficiency with irradiation of AM-1.5 light (100 mW/cm$^2$) through an interference filter of 400 nm (hereinafter referred to as "evaluation item (d)"), and photoelectric conversion efficiency with irradiation of AM-1.5 light (100 mW/cm$^2$) through an interference filter of 700 nm (hereinafter referred to as "evaluation item (e)"), respectively by a conventional measuring method.

As a result, it was found that Sample No. 8 is surpassing Comp. Sample No. 10 by 1.05 fold for the evaluation item (a), 1.07 fold for the evaluation item (b), 1.19 fold for the evaluation item (c), 1.24 holds for the evaluation item (d), and 1.04 fold for the evaluation item (e).

Evaluation (2):

The procedures of Experiment 2-3 for the formation of the i-type semiconductor layer were repeated to form a 0.05 um thick a-Si:H:C film an a stainless steel substrate (hereinafter referred to as "i-type layer sample"). Separately, the procedures of Experiment 2-3 for the formation of the intermediate layer were repeated to form a 0.05 μm thick aSi:H:C:B:P film on a stainless steel substrate (hereinafter referred to as "intermediate layer sample").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 5400 atomic ppm of the B and about 4400 atomic ppm of the P.

As for the contents of the H in each of the two layer samples, it was found that the content of the H in the intermediate layer sample is an amount of 1.21 fold over that in the i-type layer sample.

Evaluation (3):

The procedures of Experiment 2-3 for the formation of the intermediate layer were repeated to form a 0.5 μm thick a-Si:H:C:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.81 eV.

Then, a Cr gap electrode of 0.1 μm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.91 eV. From this result, it was found that the conduction type of the intermediate layer is substantially intrinsic.

Evaluation (4):

The procedures of Experiment 2-3 for the formation of the intermediate layer were repeated to form a 0.03 μm thick layer on a stainless steel substrate (hereinafter referred to as "intermediate layer sample"). Likewise, the procedures of Experiment 2-3 for the formation of the p-type semiconductor layer were repeated to form a 0.005 μm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEE device (product by JEOL Ltd.).

As a result, it was found that the intermediate layer sample is amorphous and the p-type semiconductor layer sample is also amorphous.

Experiment 2-4 and Comparative Experiment 2-5

(Experiment 2-4)

The procedures of Experiment 2-1 were repeated, except that the thickness of the intermediate layer to be formed was changed to 0.01, 0.04 and 0.05 μm respectively, to thereby obtain three pin type photovoltaic elements (Samples Nos. 9-1 to 9-3).

Comparative Experiment 2-5

The procedures of Experiment 2-1 were repeated, except that the thickness of the intermediate layer to be formed was changed to 0.005 and 0.07, to thereby obtain two comparative pin type photovoltaic elements (Comp. Samples Nos. 11-1 to 11-2).

Each of the samples obtained was evaluated with respect to photoelectric conversion efficiency with irradiation of AM-1.5 light (100 mW/cm$^2$) through an interference filter of 400 nm.

Figure 6B:
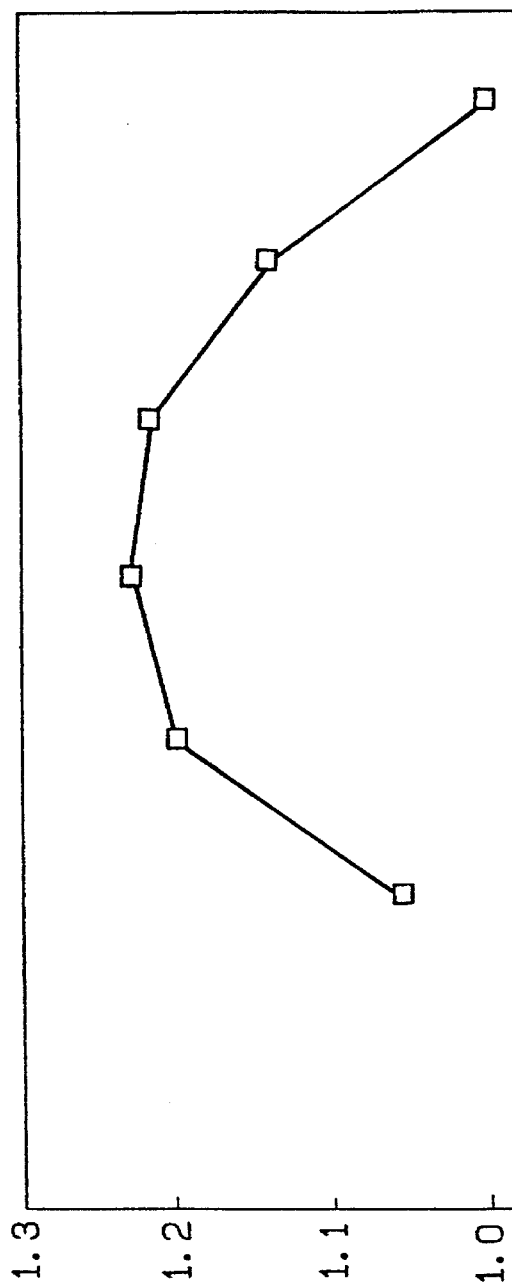

The evaluated results obtained were collectively shown in FIG. 6(B), in which the evaluated result of the pin type photovoltaic element (Sample No. 6) obtained in the foregoing Experiment 2-1 was together shown.

From the results shown in FIG. 6(B), it was found that any of the pin type photovoltaic elements respectively having the specific intermediate layer with a thickness in the range of 0.01 to 0.05 μm provides an improved photoelectric conversion efficiency. It was also found that the pin type photovoltaic elements with the specific intermediate layer having a thickness in the range of 0.01 to 0.04 μm provide a marked photoelectric conversion efficiency.

Experiment 2-5 and Comparative Experiment 2-6

(Experiment 2-5)

The procedures of Experiment 2-1 were repeated, except that the conditions for the formation of the intermediate layer were varied as shown in Table 12, to thereby obtain four pin type photovoltaic elements (Samples Nos. 10-1 to 10-4).

Each of the resultant Samples Nos. 10-1 to 10-4 was evaluated with respect to photoelectric conversion efficiency with irradiation of AM-1.5 light (100 mW/cm$^2$) through interference filter of 400 nm.

The evaluated results obtained were collectively shown in FIG. 7(B), in which the evaluated result of the pin type photovoltaic element (Sample No. 6) obtained in the foregoing Experiment 2-1 was together shown.

Separately, evaluation samples for the foregoing evaluations (2) to (4) described in the foregoing Experiment 2-1 or 2-3 were prepared for each of the Samples No. 10-1 to 10-4.

And using those samples prepared, said evaluations (2) to (4) were carried out.

The evaluated results with respect to the ratio of the H-content in the intermediate layer to the H-content in the i-type semiconductor layer were collectively shown in FIG. 7(B), in which the evaluated result for the pin type photovoltaic element (Sample No. 6) obtained in the foregoing Experiment 2-1 with respect to said ratio was together shown.

As for the content of boron atoms (B) and the content of phosphorus atoms (P) in the intermediate layer of each of the Samples Nos. 10-1 to 10-4, it was found that each of the four samples contains the B and P respectively in an amount in the range of 3200 to 5600 ppm. It was then found that the intermediate layer of each of the four samples (Samples Nos. 10-1 to 10-4) is substantially intrinsic.

Comparative Experiment 2-6

The procedures of Experiment 2-1 were repeated, except that the conditions for the formation of the intermediate layer were varied as shown in Table 12, to thereby obtain two comparative pin type photovoltaic elements (Comp. Samples Nos. 12-1 to 12-2).

Each of the resultant Comp. Samples Nos. 12-1 to 12-2 was evaluated with respect to photoelectric conversion efficiency with irradiation of AM-1.5 light (100 mW/cm$^2$) through an interference filter of 400 nm.

The evaluated results obtained were collectively shown in FIG. 7(B).

Separately, evaluation samples for the foregoing evaluations (2) to (4) described in the foregoing Experiment 2-1 or 2-3 were prepared for each of the Comp. Samples No. 12-1 to 12-2.

And using those samples prepared, said evaluations (2) to (4) were carried out.

The evaluated results with respect to the ratio of the H-content in the intermediate layer to the H-content in the i-type semiconductor layer were collectively shown in FIG. 7(B).

As for the content of boron atoms (B) and the content of phosphorus atoms (P) in the intermediate layer of each of the Samples Nos. 12-1 to 12-2, it was found that each of the two comparative samples contains the B and P respectively in an amount in the range of 3200 to 5600 ppm. It was then found that the intermediate layer of each of the two comparative samples is intrinsic.

From the results shown in FIG. 7(B), it was found that each of the pin type photovoltaic elements in which the ratio of the H-content in the intermediate layer to the H-content in the i-type semiconductor layer is in the range of from 1.05 to 1.5 excels in photoelectric conversion efficiency.

Experiment 3-1

There was prepared a pin type photovoltaic element of the configuration shown in FIG. 1(A) under the conditions shown in Table 17, in the same manner as in the foregoing Experiment 1-1 using MW-PCVD apparatus shown in FIG. 3.

Firstly, there was provided a stainless steel substrate (SUS 304) of 80 mm by 80 mm in size and 1 mm in thickness, having a mirror-ground surface as the substrate 1004. A 0.1 μm thick Ag film was formed on the surface of the substrate by a conventional sputtering method. Subsequently, a 1 μm thick ZnO film was laminated on the surface of the previously formed Ag film by a conventional vacuum evaporation method.

Thus, there was formed a lower electrode 107 comprising said AG thin film and said ZnO thin film on the substrate 1004.

The Substrate 1004 was fixed, with the lower electrode 107 facing downward, on the substrate holder 1005 in the deposition chamber 1001 of the Mw-PCVD apparatus shown in FIG. 3.

An n-type semiconductor layer 102, an i-type semiconductor layer 103, an intermediate layer 106 and a p-type semiconductor layer 104 were successively formed on the substrate 1004 in the same manner as in the foregoing Experiment 1-1. That is, the exit valves 1041, 1042 and 1046, and the sub-valve 1008 were gradually opened to introduce SiH$_4$ gas, H$_2$ gas and PH$_3$/H$_2$ gas through the gas feed pipe 1003 into the reaction space A of the deposition chamber 1001. In this case, the flow rate of the SiH$_4$ gas, the flow rate of the H$_2$ gas and the flow rate of the PH$_3$/H$_2$ gas were controlled to 5 SCCM, 5 SCCM and 5 SCCM respectively by adjusting the mass flow controllers 1021, 1022 and 1026.

The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of –50 V into the reaction space A. Then, the microwave power source (not shown) was switched on to apply microwave power of 0.1 W/cm$^3$ through the microwave introducing window 1002 into the reaction space A to cause microwave glow discharge in the reaction space A, whereby forming a 0.01 μm thick a-Si:H:P film to be the n-type semiconductor layer 102 on the lower electrode 107.

After the formation of the n-type semiconductor layer being completed, the application of the bias voltage and the application of the microwave power were suspended, and the exit valves 1041, 1042 and 1046 and the sub-valve 1008 were closed.

Then, a semiconductor layer to be the i-type semiconductor layer 103 was formed on the previously formed n-type semiconductor layer 102. This is, the exit valves 1041, 1042 and 1044 and the sub-valve 1008 were opened to introduce SiH$_4$ gas, H$_2$ gas and GeH$_4$ gas into the reaction space A of the deposition chamber 1001 at respective flow rates of 40 SCCM, 100 SCCM and 20 SCCM by adjusting the mass flow controllers 1021, 1022 and 1024. The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of –50 V into the reaction space A. Then, the microwave power source (not shown) was switched on to apply microwave power of 0.5 W/cm$^3$ through the microwave introducing window 1002 into the reaction space A to cause microwave glow discharge in the reaction space A, thereby forming a 0.3 μm thick a-Si:H:Ge film to be the i-type semiconductor layer 103 on the previously formed n-type semiconductor layer 102.

After the formation of the i-type semiconductor layer being completed, the application of the bias voltage and the application of the microwave power were suspended, and the exit valves 1041, 1042 and 1044 and the sub-valve 1008 were closed.

Successively, a layer to be the intermediate layer 106 was formed on the previously formed i-type semiconductor layer 103. That is, the exit valves 1041, 1042, 1044, 1045 and 1046, and the sub-valve 1008 were opened to introduce SiH$_4$ gas, H$_2$ gas, GeH$_4$ gas, B$_2$H$_6$/H$_2$ gas and PH$_3$/H$_2$ gas through the gas feed pipe 1003 into the reaction space A of the deposition chamber 1001. In this case, the flow rate of the SiH$_4$ gas, the flow rate of the H$_2$ gas, the flow rate of the GeH$_4$ gas, the flow rate of the B$_2$H$_6$/H$_2$ gas and the flow rate of the PH$_3$/H$_2$ were controlled to 8 SCCM, 20 SCCM, 2 SCCM, 0.5 SCCM and 0.5 SCCM respectively by adjusting the mass flow controllers 1021, 1022, 1024, 1025 and 1026.

The gas pressure (inner pressure) of the reaction space A of the deposition chamber 1001 was controlled to 10 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 0.1 W/cm$^3$ through the microwave introducing window 1002 into the reaction space A to cause microwave glow discharge in the reaction space A, whereby forming a 0.02 μm thick a -Si:H:Ge:B:P film to be the intermediate layer 106 on the previously formed i-type semiconductor layer 103.

After the formation of the intermediate layer being completed, the application of the bias voltage and the application of the microwave power were suspended, and the exit valves 1041, 1042, 1044, 1045 and 1046 and the subvalve 1008 were closed.

Thereafter, a semiconductor layer to be the p-type semiconductor layer 104 was formed on the previously formed intermediate layer 106. That is, the exit valves 1041, 1042 and 1045, and the sub-valve 1008 were opened to introduce SiH$_4$ gas, H$_2$ gas and B$_2$H$_6$/H$_2$ gas through the gas feed pipe 1003 into the reaction space A of the deposition chamber 1001. In this case, the flow rate of the SiH$_4$ gas, the flow rate of the H$_2$ gas and the flow rate of the B$_2$H$_6$/H$_2$ gas were controlled to 5 SCCM, 500 SCCM and 5 SCCM respectively by adjusting the mass flow controllers 1021, 1022 and 1025.

The gas pressure (inner pressure) of the reaction space A of the deposition chamber 1001 was controlled to 20 mTorr by regulating the opening of the conductance valve 1007' while observing the reading on the vacuum gage 1006. The substrate was maintained at 280° C.

The DC power source 1011 was switched on to apply a DC bias voltage of −50 V into the reaction space A. Then, the microwave power source (not shown) was switched on to apply microwave power of 1 W/cm$^3$ through the microwave introducing window 1002 into the reaction space A to cause microwave glow discharge in the reaction space A, whereby forming a 0.005 μm thick microcrystal Si:H:B film to be the p-type semiconductor layer 104 on the previously formed intermediate layer 106.

After the formation of the p-type semiconductor layer being completed, the application of the bias voltage and the application of the microwave power were suspended, and the exit valves 1041, 1042 and 1045 and the sub-valve 1008 were closed.

The conditions for forming each of the above layers were collectively shown in Table 17.

In the above procedures of forming each constituent layer, all the exit valves other than those required for upon forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1007' for avoiding the gases having been used for the formation of the previous layer were left in the deposition chamber 1001 and in the pipe ways from the exit valves 1041 through 1046 to the inside of the deposition chamber 1001.

After being cooled to room temperature, the substrate was taken out from the deposition chamber 1001.

Then the substrate was placed in a known vacuum deposition apparatus, which was evacuated to 10$^{-5}$ Torr or below. On the foregoing p-type semiconductor layer 104 was deposited an ITO thin film of about 0.085 μm in thickness in an oxygen atmosphere with about 1×10$^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formd a 2 μm thick comb-shaped collecting electrode. Thus there was obtained a pin type photovoltaic element (Sample No.11).

Comparative Experiment 3-1

The procedures of Experiment 3-1 were repeated, except that neither the B$_2$H$_6$/H$_2$ gas nor the PH$_3$/H$_2$ gas were used for the formation of an intermediate layer, to thereby obtain a comparative pin type photovoltaic element (Comparative Sample No. 13).

Evaluations

Evaluation (1):

Each of Sample No. 11 and Comparative Sample No. 13 was evaluated with respect to open-circuit voltage (Voc) with irradiation of AM-1.5 light (100 mW/cm$^2$) (hereinafter referred to as "evaluation item (a)"), short-circuit current (Isc) with irradiation of AM-1.5 light (100 mW/cm$^2$)(hereinafter referred to as "evaluation item (b)"), photoelectric conversion efficiency with irradiation of AM-1.5 light (100 mW/cm$^2$) (hereinafter referred to as "evaluation item (c)"), photoelectric conversion efficiency with irradiation of AM-1.5 light (100 mW/cm$^2$) through an interference filter of 400 nm (hereinafter referred to as "evaluation item (d)"), and photoelectric conversion efficiency with irradiation of AM-1.5 light (100 mW/cm$^2$) through an interference filter of 700 nm (hereinafter referred to as "evaluation item (e)"), respectively by a conventional measuring method.

As a result, it was found that Sample No. 11 is surpassing Comp. Sample No. 13 by 1.06 holds for the evaluation item (a), 1.06 holds for the evaluation item (b), 1.22 holds for the evaluation item (c), 1.28 holds for the evaluation item (d), and 1.03 holds for the evaluation item (e).

Evaluation (2):

The procedures of Experiment 3-1 for the formation of the i-type semiconductor layer were repeated to form a 0.05 μm thick a-Si:H:Ge film an a stainless steel substrate (hereinafter referred to as "i-type layer sample"). Separately, the procedures of Experiment 2-1 for the formation of the intermediate layer were repeated to form a 0.05 μm thick a-Si:H:Ge:B:P film on a stainless steel substrate (hereinafter referred to as "intermediate layer sample").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 5200 atomic ppm of the B and about 5000 atomic ppm of the P.

As for the contents of the H in each of the two layer samples, it was found that the content of the H in the intermediate layer sample is an amount of 1.25 holds over that in the i-type layer sample.

Evaluation (3):

The procedures of Experiment 3-1 for the formation of the intermediate layer were repeated to form a 0.5 μm thick a-Si:H:Ge:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.47 eV.

Then, a Cr gap electrode of 0.1 μm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.74 eV. From this result, it was found that the conduction type of the intermediate layer is substantially intrinsic.

Evaluation (4):

The procedures of Experiment 3-1 for the formation of the intermediate layer were repeated to form a 0.02 um thick layer on a stainless steel substrate (hereinafter referred to as "intermediate layer sample"). Likewise, the procedures of Experiment 3-1 for the formation of the p-type semiconductor layer were repeated to form a 0.005 μm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEED device (product by JEOL Ltd.).

As a result, it was found that the intermediate layer sample is amorphous and the p-type semiconductor layer sample is microcrystalline.

The evaluated results obtained in the above evaluations (1) and (2) were collectively shown in FIG. 4 (C).

Experiment 3-2

The procedures of Experiment 3-1 were repeated, except that the flow rate of the $B_2H_6/H_2$ gas and the flow rate of the $PH_3/H_2$ gas were changed to those shown in Table 18, to thereby obtain three pin type photovoltaic elements (Sample Nos. 12-1 to 12-3). Each of the three samples obtained was evaluated in the same manner as in the foregoing evaluation (1).

The results obtained were collectively shown in FIG. 4(C).

Separately, there were prepared evaluation samples in order to perform the foregoing evaluations (2) to (4) with respect to each of the above three element samples Nos. 12-1 to 12-3. And using these evaluation samples, the foregoing evaluations (2) to (4) were performed.

The results obtained in the evaluation (2) were collectively shown in FIG. 4(C).

It was found that the amount of hydrogen atoms (H) contained in the intermediate layer is of a value corresponding to 1.15 to 1.3 fold over that contained in the i-type semiconductor layer for each of the three element samples.

It was also found with respect to the intermediate layer of each of the three element samples that the activation energy is of a value corresponding to about one second of the optical band gap and the intermediate layer is intrinsic.

Comparative Experiment 3-2

The procedures of Experiment 3-1 were repeated, except that the flow rate of the $B_2H_6/H_2$ gas and the flow rate of the $PH_3/H_2$ gas were changed to those shown in Table 19, to thereby obtain two comparative pin type photovoltaic elements (Comp. Samples Nos. 14-1 to 14-2).

Each of the two comparative samples was evaluated in the same manner as in the foregoing evaluation (1).

The results obtained were collectively shown in FIG. 4(C).

Separately, there were prepared evaluation samples in order to perform the foregoing evaluations (2) to (4) with respect to each of the above two comparative element samples (Comp. Samples Nos. 14-1 to 14-2).

Using these evaluation samples, the foregoing evaluations (2) to (4) were performed. The results obtained in the evaluation (2) were collectively shown in FIG. 4(C).

It was found that the amount of hydrogen atoms (H) contained in the intermediate layer is of a value corresponding to 1.2 to 1.3 fold over that contained in the i-type semiconductor layer for each of the two comparative element samples.

It was also found with respect to the intermediate layer of each of the two comparative element samples that the activation energy is of a value corresponding to about one second of the optical band gap and the intermediate layer is intrinsic.

Comparative Experiment 3-3

The procedures of Experiment 3-1 were repeated, except that the thickness of the i-type semiconductor layer, to be formed was changed to 0.32 μm, to thereby obtain a comparative pin type photovoltaic element (Comp. Sample No. 15).

The comparative element sample obtained was evaluated in the same manner as in the foregoing evaluation (1).

The results obtained were collectively shown in FIG. 4(C).

Conclusion

From the results shown in FIG. 4(C) and other results obtained in the foregoing Experiments 3-1 to 3-2 and Comparative Experiments 3-1 to 3-3, it was found that any of the pin type photovoltaic elements according to the present invention which were obtained in the foregoing Experiments 3-1 to 3-2 are surpassing the comparative pin type photovoltaic elements obtained in the foregoing Comparative Experiments 3-1 to 3-3 with respect to the characteristics required for a pin type photovoltaic element.

Experiment 3-3

There was prepared a pin type photovoltaic element of the configuration shown in FIG. 1(A) under the conditions shown in Table 20, in the same manner as in the foregoing Experiment 1-3 using the RF-PCVD apparatus shown in FIG. 5.

First, there was provided a stainless steel substrate (SUS 304) of 80 mm by 80 mm in size and 1 mm in thickness, having a mirror-ground surface as the substrate 1104. A 0.1 µm thick Ag film was formed on the surface of the substrate by a conventional sputtering method. Subsequently, a 1 µm thick ZnO film was laminated on the surface of the previously formed Ag film by a conventional vacuum evaporation method.

Thus, there was formed a lower electrode 107 comprising said Ag thin film and said ZnO thin film on the substrate 1104.

The substrate 1104 was fixed, with the lower electrode 107 facing downward, on the substrate holder 1105 in the deposition chamber 1101 of the RF-PCVD apparatus shown in FIG. 5.

An n-type semiconductor layer 102, an i-type semiconductor layer 103, an intermediate layer 106 and a p-type semiconductor layer 104 were successively formed on the substrate 1104.

First, a semiconductor layer to be the n-type semiconductor layer 102 in the way as follows. That is, the exit valves 1041, 1042 and 1046, and the sub-valve 1008 were opened to introduce $SiH_4$ gas, $H_2$ gas and $PH_3/H_2$ gas through the gas feed pipe 1103 into the reaction space A of the deposition chamber 1101. In this case, the flow rate of the $SiH_4$ gas, the flow rate of the $H_2$ gas and the flow rate of the $PH_3/H_2$ gas were controlled to 1 SCCM, 50 SCCM and 1 SCCM respectively by adjusting the mass flow controllers 1021, 1022 and 1026.

The gas pressure (inner pressure) of the reaction space A of the deposition chamber 1101 was controlled to 1 Torr by regulating the opening of the conductance valve 1107' while observing the reading on the vacuum gage 1106. The substrate 1104 was maintained at 250° C.

The RF power source (not shown) was then switched on to apply RF power of 5 mW/cm$^2$ through the high frequency matching box 1112 and the cathode 1102 into the reaction space A to cause RF glow discharge in the reaction space A, whereby forming a 0.01 µm thick a-Si:H:P film to be the n-type semiconductor layer 102 on the lower electrode 107.

After the formation of the n-type semiconductor layer being completed, the application of the RF power was suspended, and the exit valves 1041, 1042 and 1046 and the sub-valve 1008 were closed.

Then, a semiconductor layer to be the i-type semiconductor layer 103 was formed on the previously formed n-type semiconductor layer 102. That is, the exit valves 1041, 1042 and 1044 and the sub-valve 1008 were opened to introduce $SiH_4$ gas, $H_2$ gas and $GeH_4$ gas into the reaction space A of the deposition chamber 1101 at respective flow rates of 3 SCCM, 50 SCCM and 1.5 SCCM by adjusting the mass flow controllers 1021, 1022 and 1024. The gas pressure (inner pressure) of the reaction space A of the deposition chamber 1101 was controlled to 1 Torr by regulating the opening of the conductance valve 1107' while observing the reading on the vacuum gage 1106. The substrate was maintained at 250° C.

The RF power source (not shown) was then switched on the apply RF power of 10 mW/cm$^2$ through the high frequency matching box 1112 and the cathode 1102 into the reaction space A to cause RF glow discharge in the reaction space A, whereby forming a 0.3 µm thick a-Si:H:Ge film to be the i-type semiconductor layer 103 on the previously formed n-type semiconductor layer 102.

After the formation of the i-type semiconductor layer being completed, the application of the RF power was suspended, and the exit valves 1041, 1042 and 1044 and the sub-valve 1008 were closed.

Successively, a layer to be the intermediate layer 106 was formed on the previously formed i-type semiconductor layer 103. That is, the exit valves 1041, 1042, 1044, 1045 and 1046, and the sub-valve 1008 were opened to introduce $SiH_4$ gas, $H_2$ gas, $GeH_4$ gas, $B_2H_6/H_2$ gas and $PH_3/H_2$ gas through the gas feed pipe 1103 into the reaction space A of the deposition chamber 1101. In this case, the flow rate of the $SiH_4$ gas, the flow rate of the $H_2$ gas, the flow rate of the $GeH_4$ gas, the flow rate of the $B_2H_6/H_2$ gas and the flow rate of the $PH_3/H_2$ were controlled to 1.4 SCCM, 50 SCCM, 0.7 SCCM, 0.1 SCCM and 0.1 SCCM respectively by adjusting the mass flow controllers 1021, 1022, 1024, 1025 and 1026.

The gas pressure (inner pressure) of the reaction space A of the deposition chamber 1001 was controlled to 1 Torr by regulating the opening of the conductance valve 1107' while observing the reading on the vacuum gage 1106. The substrate was maintained at 250° C.

The RF power source (not shown) was then switched on to apply RF power of 5 mW/cm$^2$ through the high frequency matching box 1112 and the cathode 1102 into the reaction space A to cause RF glow discharge in the reaction space A, whereby forming a 0.03 µm thick a-Si:H:Ge:B:P film to be the intermediate layer 106 on the previously formed i-type semiconductor layer 103.

After the formation of the intermediate layer being completed, the application of the RF power was suspended, and the exit valves 1041, 1042, 1044, 1045 and 1046 and the sub-valve 1008 were closed.

Thereafter, a semiconductor layer to be the p-type semiconductor layer 104 was formed on the previously formed intermediate layer 106. That is, the exit valves 1041, 1042 and 1045, and the sub-valve 1008 were opened to introduce $SiH_4$ gas, $H_2$ gas and $B_2H_6/H_2$ gas through the gas feed pipe 1103 into the reaction space A of the deposition chamber 1101. In this case, the flow rate of the $SiH_4$ gas, the flow rate of the $H_2$ gas and the flow rate of the $B_2H_6/H_2$ gas were controlled to 1 SCCM, 150 SCCM and 1 SCCM respectively by adjusting the mass flow controllers 1021, 1022 and 1025.

The gas pressure (inner pressure) of the reaction space A of the deposition chamber 1101 was controlled to 1.5 Torr by regulating the opening of the conductance valve 1107' while observing the reading on the vacuum gage 1106. The substrate was maintained at 250° C.

The RF power source (not shown) was then switched on to apply RF power of 80 mW/cm$^2$ through the high frequency matching box 1112 and the cathode 1102 into the reaction space A to cause RF glow discharge in the reaction space A, whereby forming a 0.005 µm thick a-Si:H:B film to be the p-type semiconductor layer 104 on the previously formed intermediate layer 106.

After the formation of the p-type semiconductor layer being completed, the application of the RF power was suspended, and the exit valves 104, 1042 and 1045 and the sub-valve 1008 were closed.

The conditions for forming each of the above layers were collectively shown in Table 20.

In the above procedures of forming each constituent layer, all the exit valves other than those required for upon forming the respective layers were of course closed. Further, upon forming the respective layers, the inside of the system was once evacuated to a high vacuum degree as required by closing the exit valves 1041 through 1046 while opening the sub-valve 1008 and fully opening the conductance valve 1107' to avoid the gases used for the formation of the previous layer left in the deposition chamber 1101 and in the pipe ways passing from the exit valves 1041 through 1046 to the inside of the deposition chamber 1101.

After being cooled to room temperature, the substrate was taken out from the deposition chamber 1101.

Then, the substrate was placed in a known vacuum deposition apparatus, which was evacuated to $10^{-5}$ Torr or below. On the foregoing p-type semiconductor layer 104 was deposited an ITO thin film of about 0.085 μm in thickness in an oxygen atmosphere with about $1\times10^{-3}$ Torr, wherein the source of deposition was a 1:1 (by weight) mixture of In and Sn placed in a crucible which was heated by the resistance heating method and the substrate temperature was 170° C. In this way the transparent electrode 105 was formed. After cooling, the substrate was removed. With a permalloy mask placed on the transparent electrode 105, the substrate was placed in another known vacuum deposition apparatus, an Al film was deposited by the resistance heating method to formed a 2 μm thick comb-shaped collecting electrode. Thus there was obtained a pin type photovoltaic element (Sample No. 13).

Comparative Experiment 3-4

The procedures of Experiment 3-3 were repeated, except that neither the $B_2H_6/H_2$ gas nor the $PH_3/H_2$ gas were used for the formation of an intermediate layer, to thereby obtain a comparative pin type photovoltaic element (Comparative Sample No. 16).

Evaluations

Evaluation (1):

Each of Sample No. 13 and Comparative Sample No. 16 was evaluated with respect to open-circuit voltage (Voc) with irradiation of AM-1.5 light (100 mW/cm$^2$)(hereinafter referred to as "evaluation item (a)"), short-circuit current (Isc) with irradiation of AM-1.5 light (100 mW/cm$^2$)(hereinafter referred to as "evaluation item (b)"), photoelectric conversion efficiency with irradiation of AM-1.5 light (100 mW/cm$^2$) (hereinafter referred to as "evaluation item (c)"), photoelectric conversion efficiency with irradiation of AM-1.5 light (100 mW/cm$^2$) through an interference filter of 400 nm (hereinafter referred to as "evaluation item (d)"), and photoelectric conversion efficiency with irradiation of AM-1.5 light (100 mW/cm$^2$) through an interference filter of 700 nm (hereinafter referred to as "evaluation item (e)"), respectively by a conventional measuring method.

As a result, it was found that Sample No. 13 is surpassing Comp. Sample No. 16 by 1.04 fold for the evaluation item (a), 1.05 fold for the evaluation item (b), 1.19 fold for the evaluation item (c), 1.23 holds for the evaluation item (d), and 1.05 fold for the evaluation item (e).

Evaluation (2):

The procedures of Experiment 3-3 for the formation of the i-type semiconductor layer were repeated to form a 0.05 μm thick a-Si:H:Ge film an a stainless steel substrate (hereinafter referred to as "i-type layer sample"). Separately, the procedures of Experiment 3-3 for the formation of the intermediate layer were repeated to form a 0.05 μm thick a-Si:H:Ge:B:P film on a stainless steel substrate (hereinafter referred to as "intermediate layer sample").

The i-type layer sample was subjected to composition analysis by a secondary ion mass spectrometry (SIMS) using a SIMS device (product by CAMELA Co.) to measure the content of hydrogen atoms (H) therein. Likewise, the intermediate layer sample was subjected to composition analysis in the same manner as in the above, to thereby measure the contents of boron atoms (B), phosphorus atoms (P) and hydrogen atoms (H) therein.

As a result, it was found that the intermediate layer sample contains about 5400 atomic ppm of the B and about 5200 atomic ppm of the P.

As for the contents of the H in each of the two layer samples, it was found that the content of the H in the intermediate layer sample is an amount of 1.24 fold over that in the i-type layer sample.

Evaluation (3):

The procedures of Experiment 3-3 for the formation of the intermediate layer were repeated to form a 0.5 μm thick a-Si:H:Ge:B:P film on a No. 7059 glass plate (product by Corning Glass Works).

The resultant was subjected to measurement of optical band gap using a spectrophotometer of 330 Type (product by Hitachi Ltd.). As a result, the optical band gap thereof was about 1.52 eV.

Then, a Cr gap electrode of 0.1 μm in thickness, 0.1 mm in gap width and 5 mm in gap length was disposed on the surface of the above film by a conventional vacuum evaporation method.

The resultant was subjected to measurement of a dark conductivity to obtain an activation energy by a conventional method. As a result, the activation energy thereof was about 0.82 eV. From this result, it was found that the conduction type of the intermediate layer is substantially intrinsic.

Evaluation (4):

The procedures of Experiment 3-3 for the formation of the intermediate layer were repeated to form a 0.03 μm thick layer on a stainless steel substrate (hereinafter referred to as "intermediate layer sample"). Likewise, the procedures of Experiment 3-3 for the formation of the p-type semiconductor layer were repeated to form a 0.005 μm thick layer on a stainless steel substrate (hereinafter referred to as "p-type semiconductor layer sample").

The crystalinity of each of the resultant two layer samples was observed by a reflection high energy electron diffraction (RHEED) using a JEM-100 SX RHEED device (product by JEOL Ltd.).

As a result, it was found that the intermediate layer sample is amorphous and the p-type semiconductor layer sample is also amorphous.

Experiment 3-4 and Comparative Experiment 3-5

(Experiment 3-4)

The procedures of Experiment 3-1 were repeated, except that the thickness of the intermediate layer to be formed was changed to 0.01, 0.04 and 0.05 μm respectively, to thereby obtain three pin type photovoltaic elements (Samples Nos. 14-1 to 14-3).

Comparative Experiment 3-5

The procedures of Experiment 3-1 were repeated, except that the thickness of the intermediate layer to be formed was changed to 0.005 and 0.07, to thereby obtain two comparative pin type photovoltaic elements (Comp. Samples Nos. 17-1 to 17-2).

Each of the samples obtained was evaluated with respect to photoelectric conversion efficiency with irradiation of AM-1.5 light (100 mW/cm$^2$) through an interference filter of 400 nm.

The evaluated results obtained were collectively shown in FIG. 6(C), in which the evaluated result of the pin type photovoltaic element (Sample No. 11) obtained in the foregoing Experiment 3-1 was together shown.

From the results shown in FIG. 6(C), it was found that any of the pin type photovoltaic elements respectively having the specific intermediate layer with a thickness in the range of 0.01 to 0.05 μm provides an improved photoelectric conversion efficiency. It was also found that the pin type photovoltaic elements with the specific intermediate layer having a thickness in the range of 0.01 to 0.04 μm provide a marked photoelectric conversion efficiency.

Experiment 3-5 and Comparative Experiment 3-6

(Experiment 3-5)

The procedures of Experiment 3-1 were repeated, except that the conditions for the formation of the intermediate layer were varied as shown in Table 21, to thereby obtain four pin type photovoltaic elements (Samples Nos. 15-1 to 15-4).

Each of the resultant Samples Nos. 15-1 to 15-4 was evaluated with respect to photoelectric conversion efficiency with irradiation of AM-1.5 light (100 mW/cm$^2$). through an interference filter of 400 nm.

The evaluated results obtained were collectively shown in FIG. 7(C), in which the evaluated result of the pin type photovoltaic element (Sample No. 11) obtained in the foregoing Experiment 3-1 was together shown.

Separately, evaluation samples for the foregoing evaluations (2) to (4) described in the foregoing Experiment 3-1 or 3-3 were prepared for each of the Samples No. 15-1 to 15-4.

And using those samples prepared, said evaluations (2) to (4) were carried out.

The evaluated results with respect to the ratio of the H-content in the intermediate layer to the H-content in the i-type semiconductor layer were collectively shown in FIG. 7(C), in which the evaluated result for the pin type photovoltaic element (Sample No. 11) obtained in the foregoing Experiment 3-1 with respect to said ratio was together shown.

As for the content of boron atoms (B) and the content of phosphorus atoms (P) in the intermediate layer of each of the Samples Nos. 15-1 to 15-4, it was found that each of the four samples contains the B and P respectively in an amount in the range of 4000 to 6500 ppm. It was then found that the intermediate layer of each of the four samples (Samples Nos. 15-1 to 15-4) is substantially intrinsic.

Comparative Experiment 3-6

The procedures of Experiment 3-1 were repeated, except that the conditions for the formation of the intermediate layer were varied as shown in Table 21, to thereby obtain two comparative pin type photovoltaic elements (Comp. Samples Nos. 18-1 to 18-2).

Each of the resultant Comp. Samples Nos. 18-1 to 18-2 was evaluated with respect to photoelectric conversion efficiency with irradiation of AM-1.5 light (100 mW/cm$^2$) through an interference filter of 400 nm.

The evaluated results obtained were collectively shown in FIG. 7(C).

Separately, evaluation samples for the foregoing evaluations (2) to (4) described in the foregoing Experiment 3-1 or 3-3 were prepared for each of the Comp. Samples No. 18-1 to 18-2.

And using those samples prepared, said evaluations (2) to (4) were carried out.

The evaluated results with respect to the ratio of the H-content in the intermediate layer to the H-content in the i-type semiconductor layer were collectively shown in FIG. 7(C).

As for the content of boron atoms (B) and the content of phosphorus atoms (P) in the intermediate layer of each of the Samples Nos. 18-1 to 18-2, it was found that each of the two comparative samples contains the B and P respectively in an amount in the range of 4000 to 6500 ppm. It was then found that the intermediate layer of each of the two comparative samples is intrinsic.

From the results shown in FIG. 7(C), it was found that each of the pin type photovoltaic elements in which the ratio of the H-content in the intermediate layer to the H-content in the i-type semiconductor layer is in the range of from 1.05 to 1.5 excels in photoelectric conversion efficiency.

DESCRIPTION OF THE PREFERRED EMBODIMENTS

The pin type photovoltaic element of the present invention will be described in more detail with reference to the following examples, which are not intended to restrict the scope of the invention.

Example 1-1 and Comparative Example 1-1

(Example 1-1)

There were prepared ten pin type photovoltaic elements by repeating the procedures of the foregoing Experiment 1-1.

The resultant ten pin type photovoltaic elements were assembled to obtain a solar cell module. Using this solar cell module, there was prepared a lighting equipment of the constitution shown in FIG. 8. In the lighting equipment shown in FIG. 8, electric power generated in a solar cell module 801 is charged through a blocking diode 803 into a secondary battery 804. Numeral reference 802 stands for another blocking diode. The electric power charged in the secondary battery is inputted into an electric lamp 806 by closing a switch 805 to make the lamp on.

Comparative Example 1-1

There were prepared ten pin type photovoltaic elements by repeating the foregoing Comparative Experiment 1-3.

The resultant ten pin type photovoltaic elements were assembled to obtain a solar cell module.

Using this solar cell module, there was prepared a comparative lighting equipment of the same constitution as in Example 1-1.

Evaluation

Each of the above two lighting equipments was exposed to sunlight during daytime to thereby generate electric power in the solar cell module 801 and charge the electric power generated into the secondary battery 804. And the lamp 806 was kept lighting at night. As a result, the lamp of the lighting equipment obtained in Example 1-1 lasted lighting by about 1.15 holds over the comparative lighting equipment obtained in Comparative Example 1-1.

From this result, it was confirmed that the pin type photovoltaic element of the present invention is surpassing the known pin type photovoltaic element.

Example 1-2

There were prepared ten pin type photovoltaic elements by repeating the procedures of the foregoing Experiment 1-1, except that the conditions for forming the n-type semiconductor layer, i-type semiconductor layer, intermediate layer and p-type semiconductor layer were changed to those shown in Table 6.

The resultant ten pin type photovoltaic elements were assembled to obtain a solar cell module.

Using this solar cell module, there was prepared a lighting equipment of the same constitution as in Example 1-1.

The lighting equipment thus obtained was evaluated in the same manner as in Example 1-1.

As a result, the lamp of the lighting equipment lasted lighting for an unexpectedly long period of time.

From this result, it was confirmed that the pin type photovoltiac element excels in solar cell characteristics.

Example 1-3

There were prepared ten pin type photovoltaic elements by repeating the procedures of the foregoing Experiment 1-1, except that the condition for forming the n-type semiconductor layer, i-type semiconductor layer, intermediate layer and p-type semiconductor layer were changed to those shown in Table 7.

The resultant ten pin type photovoltaic elements were assembled to obtain a solar cell module.

Using this solar cell module, there was prepared a lighting equipment of the same constitution as in Example 1-1.

The lighting equipment thus obtained was evaluated in the same manner as in Example 1-1.

As a result, the lamp of the lighting equipment lasted lighting for an unexpectedly long period of time.

From this result, it was confirmed that the pin type photovoltiac element excels in solar cell characteristics.

Example 2-1 and Comparative Example 2-1

(Example 2-1)

There were prepared ten pin type photovoltaic elements by repeating the procedures of the foregoing Experiment 2-1.

The resultant ten pin type photovoltaic elements were assembled to obtain a solar cell module. Using this solar cell module, there was prepared a lighting equipment of the constitution shown in FIG. 8.

Comparative Example 2-1

There were prepared ten pin type photovoltaic elements by repeating the foregoing Comparative Experiment 2-3.

The resultant ten pin type photovoltaic elements were assembled to obtain a solar cell module.

Using this solar cell module, there was prepared a comparative lighting equipment of the same constitution as in Example 2-1.

Evaluation

Each of the above two lighting equipments was exposed to sunlight during daytime to thereby generate electric power in the solar cell module 801 and charge the electric power generated into the secondary battery 804. And the lamp 806 was kept lit at night. As a result, the lamp of the lighting equipment obtained in Example 2-1 lasted lighting by about 1.18 fold over the comparative lighting equipment obtained in Comparative Example 2-1.

From this result, it was confirmed that the pin type photovoltaic element of the present invention is surpassing the known pin type photovoltaic element.

Example 2-2

There were prepared ten pin type photovoltaic elements by repeating the procedures of the foregoing Experiment 2-1, except that the conditions for forming the n-type semiconductor layer, i-type semiconductor layer, intermediate layer and p-type semiconductor layer were changed to those shown in Table 13, wherein the reservoir 1075 containing $B_2H_6/H_2$ gas was replaced by a reservoir containing $BF_3$ gas (99.999% purity) (diluted with $H_2$ gas to 10%)(that is, $BF_3/H_2$ gas).

The resultant ten pin type photovoltaic elements were assembled to obtain a solar cell module.

Figure 8:
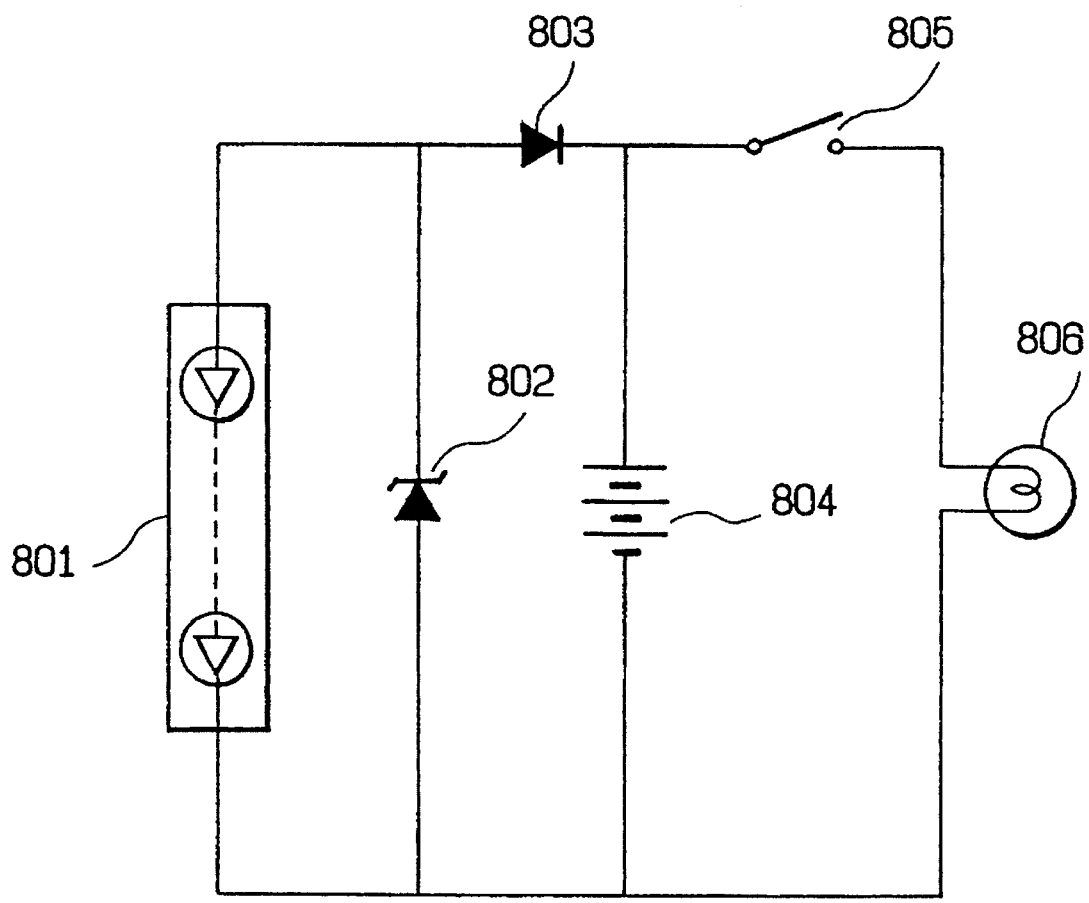
FIG. 8 is a schematic diagram of a representative electric circuit of a night illuminator with the pin type photovoltaic element according to the present invention.

Using this solar cell module, there was prepared a lighting equipment of the same constitution shown in FIG. 8.

The lighting equipment thus obtained was evaluated in the same manner as in Example 2-1.

As a result, the lamp of the lighting equipment lasted lighting for an unexpectedly long period of time.

From this result, it was confirmed that the pin type photovoltiac element excels in solar cell characteristics.

Example 2-3

There were prepared ten pin type photovoltaic elements by repeating the procedures of the foregoing Experiment 2-1, except that the conditions for forming the n-type semiconductor layer, i-type semiconductor layer, intermediate layer and p-type semiconductor layer were changed to those shown in Table 14.

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 2-1.

As a result, the lamp of the lighting equipment lasted lighting for an unexpectedly long period of time.

From this result, it was confirmed that the pin type photovoltiac element excels in solar cell characteristics.

Example 2-4

There were prepared ten pin type photovoltaic elements by repeating the procedures of the foregoing Experiment 2-1, except that the conditions for forming the n-type semiconductor layer, i-type semiconductor layer, intermediate layer and p-type semiconductor layer were changed to those shown in Table 15, wherein the reservoir 1073 containing $CH_4$ gas was replaced by a reservoir containing $C_2H_2$ gas (99.999%).

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 2-1.

As a result, the lamp of the lighting equipment lasted lighting for an unexpectedly long period of time.

From this result, it was confirmed that the pin type photovoltiac element excels in solar cell characteristics.

Example 2-5

There were prepared ten pin type photovoltaic elements by repeating the procedures of the foregoing Experiment 2-1, except that the conditions for forming the n-type semiconductor layer, i-type semiconductor layer, intermediate layer and p-type semiconductor layer were changed to those shown in Table 16 wherein the reservoir 1075 containing $B_2H_6/H_2$ gas was replaced by a gas generation system capable of providing a gas comprising $B(CH_3)_3$ and He (that is, $B(CH_3)_3$/He gas).

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 2-1.

As a result, the lamp of the lighting equipment lasted lighting for an unexpectedly long period of time.

From this result, it was confirmed that the pin type photovoltiac element excels in solar cell characteristics.

Example 3-1 and Comparative Example 3-1

(Example 3-1)

There were prepared ten pin type photovoltaic elements by repeating the procedures of the foregoing Experiment 3-1.

The resultant ten pin type photovoltaic elements were assembled to obtain a solar cell module. Using this solar cell module, there was prepared a lighting equipment of the constitution shown in FIG. 8.

Comparative Example 3-1

There were prepared ten pin type photovoltaic elements by repeating the foregoing Comparative Experiment 3-3.

The resultant ten pin type photovoltaic elements were assembled to obtain a solar cell module.

Using this solar cell module, there was prepared a comparative lighting equipment of the same constitution as in Example 3-1.

Evaluation

Each of the above two lighting equipments was exposed to sunlight during daytime to thereby generate electric power in the solar cell module 801 and charge the electric power generated into the secondary battery 804. And the lamp 806 was kept lighting at night. As a result, the lamp of the lighting equipment obtained in Example 3-1 lasted lighting by about 1.13 fold over the comparative lighting equipment obtained in Comparative Example 3-1.

From this result, it was confirmed that the pin type photovoltaic element of the present invention is surpassing the known pin type photovoltaic element.

Example 3-2

There were prepared ten pin type photovoltaic elements by repeating the procedures of the foregoing Experiment 3-1, except that the conditions for forming the n-type semiconductor layer, i-type semiconductor layer, intermediate layer and p-type semiconductor layer were changed to those shown in Table 22, wherein the reservoir 1075 containing $B_2H_6/H_2$ gas was replaced by a reservoir containing $BF_3$ gas (99.999% purity) (diluted with $H_2$ gas to 10%) (that is, $BF_3/H_2$ gas).

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 3-1.

As a result, the lamp of the lighting equipment lasted lighting for an unexpectedly long period of time.

From this result, it was confirmed that the pin type photovoltiac element excels in solar cell characteristics.

Example 3-3

There were prepared ten pin type photovoltaic elements by repeating the procedures of the foregoing Experiment 3-1, except that the conditions for forming the n-type semiconductor layer, i-type semiconductor layer, intermediate layer and p-type semiconductor layer were changed to those shown in Table 23.

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 3-1.

As a result, the lamp of the lighting equipment lasted for an unexpectedly long period of time.

From this result, it was confirmed that the pin type photovoltiac element excels in solar cell characteristics.

Example 3-4

There were prepared ten pin type photovoltaic elements by repeating the procedures of the foregoing Experiment 3-1, except that the conditions for forming the n-type semiconductor layer, i-type semiconductor layer, intermediate layer and p-type semiconductor layer were changed to those shown in Table 24.

The resultant ten pin type photovoltaic elements were assembled to obtain a solar cell module.

Using this solar cell module, there was prepared a lighting equipment of the constitution shown in FIG. 8.

The lighting equipment thus obtained was evaluated in the same manner as in Example 3-1.

As a result, the lamp of the lighting equipment lasted lighting for an unexpectedly long period of time.

From this result, it was confirmed that the pin type photovoltiac element excels in solar cell characteristics.

TABLE 1

| substrate | stainless steel (SUS 304) of 80 mm by 80 mm in size and 1 mm in thickness, having a mirror-ground surface | | | | | |
|---|---|---|---|---|---|---|
| lower electrode | a 0.1 μm thick Ag film and a 1 μm thick ZnO film being laminated | | | | | |
| | | gas used and its flow rate (sccm) | | common conditions | μW power ($W/cm^3$) | inner pressure (mTorr) | layer thickness (μm) |

| | | gas used and its flow rate (sccm) | | common conditions | μW power ($W/cm^3$) | inner pressure (mTorr) | layer thickness (μm) |
|---|---|---|---|---|---|---|---|
| conditions for the formation of the respective layers | n-type semiconductor layer | $SiH_4$<br>$H_2$<br>$PH_3/H_2$ (diluted to 10%) | 5<br>5<br>5 | substrate temperature: 280° C. | 0.1 | 10 | 0.01 |
| | i-type semiconductor layer | $SiH_4$<br>$H_2$ | 50<br>100 | | 0.5 | 10 | 0.4 |
| | intermediate layer | $SiH_4$<br>$H_2$<br>$B_2H_6/H_2$ (diluted to 10%)<br>$PH_3/H_2$ (diluted to 10%) | 10<br>20<br>0.5<br>0.5 | bias voltage to the substrate: −50V | 0.1 | 10 | 0.02 |
| | p-type semiconductor layer | $SiH_4$<br>$H_2$<br>$B_2H_6/H_2$ (diluted to 10%) | 5<br>500<br>5 | | 1 | 20 | 0.005 |
| transparent electrode | 0.085 μm thick ITO($In_2O_3$ + $SnO_2$) film | | | | | | |
| collecting electrode | 2 μm thick Al film | | | | | | |

TABLE 2

| Sample No. | Sample No. 2-1 | Sample No. 2-2 | Sample No. 2-3 |
|---|---|---|---|
| $B_2H_6/H_2$ gas (diluted to 10%), flow rate (sccm) | 0.12 | 0.3 | 1.1 |
| $PH_3/H_2$ gas (diluted to 10%), flow rate (sccm) | 0.15 | 0.32 | 1.1 |

TABLE 3

| Sample No. | Comp. Sample No. 2-1 | Com. Sample No. 2-2 |
|---|---|---|
| $B_2H_6/H_2$ gas (diluted to 10%), flow rate (sccm) | 0.6 | 1.7 |
| $PH_3/H_2$ gas (diluted to 10%), flow rate (sccm) | 0.7 | 1.7 |

TABLE 4

| | | gas used and its flow rate (sccm) | | substrate temperature (°C.) | RF power ($mW/cm^3$) | inner pressure (Torr) | layer thickness (μm) |
|---|---|---|---|---|---|---|---|
| conditions for the formation of the respective layers | n-type semiconductor layer | $SiH_4$<br>$H_2$<br>$PH_3/H_2$ (diluted to 10%) | 1<br>50<br>1 | 250 | 5 | 1 | 0.01 |
| | i-type semiconductor layer | $SiH_4$<br>$H_2$ | 4<br>50 | 250 | 10 | 1 | 0.4 |
| | intermediate layer | $SiH_4$<br>$H_2$<br>$B_2H_6/H_2$ (diluted to 10%)<br>$PH_3/H_2$ (diluted to 10%) | 2<br>50<br>0.1<br>0.1 | 250 | 5 | 1 | 0.03 |
| | p-type semiconductor layer | $SiH_4$<br>$H_2$<br>$B_2H_6/H_2$ (diluted to 10%) | 1<br>150<br>1 | 250 | 80 | 1.5 | 0.005 |

TABLE 5

|  | Sample No. | gas used and its flow rate (sccm) | | common conditions | substrate temperature (°C.) | μW power (W/cm³) | inner pressure (mTorr) |
|---|---|---|---|---|---|---|---|
| conditions for the formation of the intermediate layer | Sample No. 5-1 | $SiH_4$<br>$B_2H_6/H_2$<br>(diluted to 10%)<br>$PH_3/H_2$<br>(diluted to 10%) | 10<br>0.5<br><br>0.5 | layer thickness: 0.02 μm | 230 | 0.1 | 7 |
|  | Sample No. 5-2 | $SiH_4$<br>$B_2H_6/H_2$<br>(diluted to 10%)<br>$PH_3/H_2$<br>(diluted to 10%) | 10<br>0.5<br><br>0.5 |  | 280 | 0.1 | 7 |
|  | Sample No. 5-3 | $SiH_4$<br>$H_2$<br>$B_2H_6/H_2$<br>(diluted to 10%)<br>$PH_3/H_2$<br>(diluted to 10%) | 10<br>100<br>0.5<br><br>0.5 | bias voltage to the substrate: −50V | 280 | 0.1 | 10 |
|  | Sample No. 5-4 | $SiH_4$<br>$H_2$<br>$B_2H_6/H_2$<br>(diluted to 10%)<br>$PH_3/H_2$<br>(diluted to 10%) | 10<br>100<br>0.5<br><br>0.5 |  | 280 | 0.2 | 10 |
|  | Comp. Sample No. 6-1 | $SiH_4$<br>$H_2$<br>$B_2H_6/H_2$<br>(diluted to 10%)<br>$PH_3/H_2$<br>(diluted to 10%) | 50<br>100<br>2.5<br><br>2.5 |  | 280 | 0.5 | 10 |
|  | Comp. Sample No. 6-2 | $SiH_4$<br>$B_2H_6/H_2$ (diluted to 10%)<br>$PH_3/H_2$ (diluted to 10%) | 10<br>0.5<br><br>0.5 |  | 230 | 0.05 | 7 |

TABLE 6

|  |  | gas used and its flow rate (sccm) | | common conditions | μW power (W/cm³) | inner pressure (mTorr) | layer thickness (μm) |
|---|---|---|---|---|---|---|---|
| conditions for the formation of the respective layers | n-type semiconductor layer | $SiH_4$<br>$H_2$<br>$PH_3/H_2$<br>(diluted to 10%) | 5<br>500<br>5 | substrate temperature: 250° C. | 0.1 | 20 | 0.01 |
|  | i-type semiconductor layer | $SiH_4$<br>$H_2$ | 50<br>100 |  | 0.5 | 10 | 0.4 |
|  | intermediate layer | $SiH_4$<br>$H_2$<br>$BF_3/H_2$<br>(diluted to 10%)<br>$PH_3/H_2$<br>(diluted to 10%) | 10<br>20<br>0.8<br><br>0.5 | bias voltage to the substrate: −50V | 0.1 | 10 | 0.02 |
|  | p-type semiconductor layer | $SiH_4$<br>$H_2$<br>$BF_3/H_2$<br>(diluted to 10%) | 5<br>500<br>10 |  | 1 | 20 | 0.005 |

TABLE 7

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | n-type semiconductor layer | $SiH_4$<br>$H_2$<br>$B_2H_6/H_2$ (diluted to 10%) | 5<br>5<br>5 | substrate temperature: 280° C. | 0.1 | 20 | 0.01 |
| | i-type semiconductor layer | $SiH_4$<br>$H_2$ | 50<br>100 | | 0.5 | 10 | 0.4 |
| | intermediate layer | $SiH_4$<br>$H_2$<br>$B_2H_6/H_2$ (diluted to 10%)<br>$PH_3/H_2$ (diluted to 10%) | 10<br>20<br>0.5<br>0.5 | bias voltage to the substrate: −50V | 0.1 | 10 | 0.02 |
| | p-type semiconductor layer | $SiH_4$<br>$H_2$<br>$PH_3/H_2$ (diluted to 10%) | 5<br>500<br>5 | | 1 | 20 | 0.005 |

TABLE 8

| substrate | stainless steel (SUS 304) of 80 mm by 80 mm in size and 1 mm in thickness, having a mirror-ground surface | | | | | | |
|---|---|---|---|---|---|---|---|
| lower electrode | a 0.1 μm thick Ag film and a 1 μm thick ZnO film being laminated | | | | | | |
| | | gas used and its flow rate (sccm) | | common conditions | μW power (W/cm³) | inner pressure (mTorr) | layer thickness (μm) |
| conditions for the formation of the respective layers | n-type semiconductor layer | $SiH_4$<br>$H_2$<br>$PH_3/H_2$ (diluted to 10%) | 5<br>5<br>5 | substrate temperature: 280° C. | 0.1 | 10 | 0.01 |
| | i-type semiconductor layer | $SiH_4$<br>$H_2$<br>$CH_4$ | 50<br>100<br>2.5 | | 0.75 | 10 | 0.4 |
| | intermediate layer | $SiH_4$<br>$H_2$<br>$B_2H_6/H_2$ (diluted to 10%)<br>$PH_3/H_2$ (diluted to 10%)<br>$CH_4$ | 10<br>20<br>0.5<br>0.5<br>0.5 | bias voltage to the substrate: −40V | 0.15 | 10 | 0.02 |
| | p-type semiconductor layer | $SiH_4$<br>$H_2$<br>$B_2H_6/H_2$ (diluted to 10%)<br>$CH_4$ | 5<br>500<br>5<br>0.5 | | 1.5 | 20 | 0.005 |
| transparent electrode | 0.085 μm thick ITO($In_2O_3$ + $SnO_2$) film | | | | | | |
| collecting electrode | 2 μm thick Al film | | | | | | |

TABLE 9

| Sample No. | Sample No. 7-1 | Sample No. 7-2 | Sample No. 7-3 |
|---|---|---|---|
| $B_2H_6/H_2$ gas(diluted to 10%), flow rate (sccm) | 0.15 | 0.33 | 1.2 |
| $PH_3/H_2$ gas(diluted to 10%), flow rate (sccm) | 0.17 | 0.35 | 1.2 |

TABLE 10

| Sample No. | Comp. Sample No. 8-1 | Com. Sample No. 8-2 |
|---|---|---|
| $B_2H_6/H_2$ gas(diluted to 10%), flow rate (sccm) | 0.6 | 1.7 |
| $PH_3/H_2$ gas(diluted to 10%), flow rate (sccm) | 0.7 | 1.7 |

TABLE 11

|  |  |  |  | substrate temperature (°C.) | RF power (mW/cm³) | inner pressure (Torr) | layer thickness (μm) |
|---|---|---|---|---|---|---|---|
| | | | gas used and its flow rate (sccm) | | | | |
| conditions for the formation of the respective layers | n-type semiconductor layer | SiH$_4$<br>H$_2$<br>PH$_3$/H$_2$ (diluted to 10%) | 1<br>50<br>1 | 250 | 5 | 1 | 0.01 |
| | i-type semiconductor layer | SiH$_4$<br>H$_2$<br>CH$_4$ | 4<br>50<br>1 | 250 | 16 | 1 | 0.4 |
| | intermediate layer | SiH$_4$<br>H$_2$<br>B$_2$H$_6$/H$_2$ (diluted to 10%)<br>PH$_3$/H$_2$ (diluted to 10%)<br>CH$_4$ | 2<br>50<br>0.1<br>0.1<br>0.5 | 250 | 8 | 1 | 0.03 |
| | p-type semiconductor layer | SiH$_4$<br>H$_2$<br>B$_2$H$_6$/H$_2$ (diluted to 10%)<br>CH$_4$ | 1<br>150<br>1<br>0.1 | 250 | 130 | 1.5 | 0.005 |

TABLE 12

| | Sample No. | gas used and its flow rate (sccm) | | common conditions | substrate temperature (°C.) | μW power (W/cm³) | inner pressure (mTorr) |
|---|---|---|---|---|---|---|---|
| conditions for the formation of the intermediate layer | Sample No. 10-1 | SiH$_4$<br>CH$_4$<br>B$_2$H$_6$/H$_2$ (diluted to 10%)<br>PH$_3$/H$_2$ (diluted to 10%) | 10<br>0.5<br>0.5<br>0.5 | layer thickness 0.02 μm | 230 | 0.15 | 7 |
| | Sample No. 10-2 | SiH$_4$<br>CH$_4$<br>B$_2$H$_6$/H$_2$ (diluted to 10%)<br>PH$_3$/H$_2$ (diluted to 10%) | 10<br>0.5<br>0.5<br>0.5 | | 280 | 0.15 | 7 |
| | Sample No. 10-3 | SiH$_4$<br>H$_2$<br>B$_2$H$_6$/H$_2$ (diluted to 10%)<br>PH$_3$/H$_2$ (diluted to 10%)<br>CH$_4$ | 10<br>100<br>0.5<br>0.5<br>0.5 | bias voltage to the substrate: −40V | 280 | 0.15 | 10 |
| | Sample No. 10-4 | SiH$_4$<br>H$_2$<br>B$_2$H$_6$/H$_2$ (diluted to 10%)<br>PH$_3$/H$_2$ (diluted to 10%)<br>CH$_4$ | 10<br>100<br>0.5<br>0.5<br>0.5 | | 280 | 0.3 | 10 |
| | Comp. Sample No. 12-1 | SiH$_4$<br>H$_2$<br>B$_2$H$_6$/H$_2$ (diluted to 10%)<br>PH$_3$/H$_2$ (diluted to 10%)<br>CH$_4$ | 50<br>100<br>2.5<br>2.5<br>2.5 | | 280 | 0.75 | 10 |
| | Comp. Sample No. 12-2 | SiH$_4$<br>B$_2$H$_6$/H$_2$ (diluted to 10%)<br>PH$_3$/H$_2$ (diluted to 10%)<br>CH$_4$ | 10<br>0.5<br>0.5<br>0.5 | | 230 | 0.08 | 7 |

TABLE 13

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | n-type semiconductor layer | $SiH_4$<br>$H_2$<br>$PH_3/H_2$ (diluted to 10%) | 5<br>5<br>5 | substrate temperature: 280° C. | 1 | 20 | 0.01 |
| | i-type semiconductor layer | $SiH_4$<br>$H_2$<br>$CH_4$ | 50<br>100<br>2.5 | | 0.75 | 10 | 0.4 |
| | intermediate layer | $SiH_4$<br>$H_2$<br>$BF_4/H_2$ (diluted to 10%)<br>$PH_3/H_2$ (diluted to 10%)<br>$CH_4$ | 10<br>20<br>0.8<br><br>0.5<br><br>0.5 | bias voltage to the substrate: −40V | 0.15 | 10 | 0.02 |
| | p-type semiconductor layer | $SiH_4$<br>$H_2$<br>$BF_4/H_2$ (diluted to 10%)<br>$CH_4$ | 5<br>500<br>10<br><br>0.5 | | 1.5 | 20 | 0.005 |

TABLE 14

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | p-type semiconductor layer | $SiH_4$<br>$H_2$<br>$B_2H_6/H_2$ (diluted to 10%) | 5<br>5<br>5 | substrate temperature: 280° C. | 0.1 | 10 | 0.01 |
| | i-type semiconductor layer | $SiH_4$<br>$H_2$<br>$CH_4$ | 50<br>100<br>2.5 | | 0.75 | 10 | 0.4 |
| | intermediate layer | $SiH_4$<br>$H_2$<br>$B_2H_6/H_2$ (diluted to 10%)<br>$PH_3/H_2$ (diluted to 10%)<br>$CH_4$ | 10<br>20<br>0.5<br><br>0.5<br><br>0.5 | bias voltage to the substrate: −40V | 0.15 | 10 | 0.02 |
| | n-type semiconductor layer | $SiH_4$<br>$H_2$<br>$PH_3/H_2$ (diluted to 10%)<br>$CH_4$ | 5<br>500<br>5<br><br>0.5 | | 1.5 | 20 | 0.005 |

TABLE 15

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | n-type semiconductor layer | $SiH_4$<br>$H_2$<br>$PH_3/H_2$ (diluted to 10%) | 5<br>5<br>5 | substrate temperature: 280° C. | 0.1 | 10 | 0.01 |
| | i-type semiconductor layer | $SiH_4$<br>$H_2$<br>$C_2H_2$ | 50<br>100<br>1.5 | | 0.75 | 10 | 0.4 |
| | intermediate layer | $SiH_4$<br>$H_2$<br>$B_2H_6/H_2$ (diluted to 10%)<br>$PH_3/H_2$ | 10<br>50<br>0.5<br><br>0.5 | bias voltage to the substrate: −40V | 0.15 | 10 | 0.02 |

TABLE 15-continued

|  |  | gas used and its flow rate (sccm) |  | common conditions | µW power (W/cm³) | inner pressure (mTorr) | layer thickness (µm) |
|---|---|---|---|---|---|---|---|
| p-type semiconductor layer |  | (diluted to 10%) C$_2$H$_2$ SiH$_4$ H$_2$ B$_2$H$_6$/H$_2$ (diluted to 10%) | 0.5 5 500 5 |  | 1 | 20 | 0.005 |

TABLE 16

|  |  | gas used and its flow rate (sccm) |  | common conditions | µW power (W/cm³) | inner pressure (mTorr) | layer thickness (µm) |
|---|---|---|---|---|---|---|---|
| conditions for the formation of the respective layers | n-type semiconductor layer | SiH$_4$ H$_2$ PH$_3$/H$_2$ (diluted to 10%) | 5 5 5 | substrate temperature: 280° C. | 0.1 | 10 | 0.01 |
|  | i-type semiconductor layer | SiH$_4$ H$_2$ CH$_4$ | 50 100 2.5 |  | 0.75 | 10 | 0.4 |
|  | intermediate layer | SiH$_4$ H$_2$ B(CH$_3$)$_3$/He PH$_3$/H$_2$ (diluted to 10%) CH$_4$ | 10 20 1 0.5 0.5 | bias voltage to the substrate: −40V | 0.15 | 10 | 0.02 |
|  | p-type semiconductor layer | SiH$_4$ H$_2$ B(CH$_3$)$_3$/He CH$_4$ | 5 500 2 0.5 |  | 1.5 | 20 | 0.005 |

TABLE 17

| substrate | stainless steel (SUS 304) of 80 mm by 80 mm in size and 1 mm in thickness, having a mirror-ground surface | | | | | | |
|---|---|---|---|---|---|---|---|
| lower electrode | a 0.1 µm thick Ag film and a 1 µm thick ZnO film being laminated | | | | | | |
|  |  | gas used and its flow rate (sccm) |  | common conditions | µW power (W/cm³) | inner pressure (mTorr) | layer thickness (µm) |
| conditions for the formation of the respective layers | n-type semiconductor layer | SiH$_4$ H$_2$ PH$_3$/H$_2$ (diluted to 10%) | 5 5 5 | substrate temperature: 280° C. | 0.1 | 10 | 0.01 |
|  | i-type semiconductor layer | SiH$_4$ H$_2$ GeH$_4$ | 40 100 20 |  | 0.5 | 10 | 0.3 |
|  | intermediate layer | SiH$_4$ H$_2$ B$_2$H$_6$/H$_2$ (diluted to 10%) PH$_3$/H$_2$ (diluted to 10%) GeH$_4$ | 8 20 0.5 0.5 2 | bias voltage to the substrate: −50V | 0.1 | 10 | 0.02 |
|  | p-type semiconductor layer | SiH$_4$ H$_2$ B$_2$H$_6$/H$_2$ (diluted to 10%) | 5 500 5 |  | 1 | 20 | 0.005 |
| transparent electrode | 0.085 µm thick ITO(In$_2$O$_3$ + SnO$_2$) film | | | | | | |
| collecting electrode | 2 µm thick Al film | | | | | | |

TABLE 18

| Sample No. | Sample No. 12-1 | Sample No. 12-2 | Sample No. 12-3 |
|---|---|---|---|
| $B_2H_6/H_2$ gas(diluted to 10%), flow rate (sccm) | 0.1 | 0.25 | 0.98 |
| $PH_3/H_2$ gas(diluted to 10%), flow rate (sccm) | 0.1 | 0.27 | 1.0 |

TABLE 19

| Sample No. | Comp. Sample No. 14-1 | Com. Sample No. 14-2 |
|---|---|---|
| $B_2H_6/H_2$ gas(diluted to 10%), flow rate (sccm) | 0.5 | 1.7 |
| $PH_3/H_2$ gas(diluted to 10%), flow rate (sccm) | 0.5 | 1.7 |

TABLE 20

| | | gas used and its flow rate (sccm) | | substrate temperature (°C.) | RF power (mW/cm³) | inner pressure (Torr) | layer thickness (μm) |
|---|---|---|---|---|---|---|---|
| conditions for the formation of the respective layers | n-type semiconductor layer | $SiH_4$<br>$H_2$<br>$PH_3/H_2$ (diluted to 10%) | 1<br>50<br>1 | 250 | 5 | 1 | 0.01 |
| | i-type semiconductor layer | $SiH_4$<br>$H_2$<br>$GeH_4$ | 3<br>50<br>1.5 | 250 | 10 | 1 | 0.3 |
| | intermediate layer | $SiH_4$<br>$H_2$<br>$B_2H_6/H_2$ (diluted to 10%)<br>$PH_3/H_2$ (diluted to 10%)<br>$GeH_4$ | 1.4<br>50<br>0.1<br>0.1<br>0.7 | 250 | 5 | 1 | 0.03 |
| | p-type semiconductor layer | $SiH_4$<br>$H_2$<br>$B_2H_6/H_2$ (diluted to 10%) | 1<br>150<br>1 | 250 | 80 | 1.5 | 0.005 |

TABLE 21

| | Sample No. | gas used and its flow rate (sccm) | | common conditions | substrate temperature (°C.) | μW power (W/cm³) | inner pressure (mTorr) |
|---|---|---|---|---|---|---|---|
| conditions for the formation of the intermediate layer | Sample No. 15-1 | $SiH_4$<br>$GeH_4$<br>$B_2H_6/H_2$ (diluted to 10%)<br>$PH_3/H_2$ (diluted to 10%) | 8<br>2<br>0.5<br>0.5 | layer thickness 0.02 μm | 230 | 0.1 | 7 |
| | Sample No. 15-2 | $SiH_4$<br>$GeH_4$<br>$B_2H_6/H_2$ (diluted to 10%)<br>$PH_3/H_2$ (diluted to 10%) | 8<br>2<br>0.5<br>0.5 | | 280 | 0.1 | 7 |
| | Sample No. 15-3 | $SiH_4$<br>$H_2$<br>$B_2H_6/H_2$ (diluted to 10%)<br>$PH_3/H_2$ (diluted to 10%) | 8<br>100<br>0.5<br>0.5 | bias voltage to the substrate: −50V | 280 | 0.1 | 10 |

TABLE 21-continued

| Sample No. | gas used and its flow rate (sccm) | | common conditions | substrate temperature (°C.) | μW power (W/cm³) | inner pressure (mTorr) |
|---|---|---|---|---|---|---|
| Sample No. 15-4 | GeH₄<br>SiH₄<br>H₂<br>B₂H₆/H₂ (diluted to 10%)<br>PH₃/H₂ (diluted to 10%) | 2<br>8<br>100<br>0.5<br>0.5 | | 280 | 0.2 | 10 |
| Comp. Sample No. 18-1 | GeH₄<br>SiH₄<br>H₂<br>B₂H₆/H₂ (diluted to 10%)<br>PH₃/H₂ (diluted to 10%) | 2<br>40<br>100<br>2.5<br>2.5 | | 280 | 0.5 | 10 |
| Comp. Sample No. 18-2 | GeH₄<br>SiH₄<br>B₂H₆/H₂ (diluted to 10%)<br>PH₃/H₂ (diluted to 10%)<br>GeH₄ | 10<br>8<br>0.5<br>0.5<br>2 | | 230 | 0.05 | 7 |

TABLE 22

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | n-type semiconductor layer | SiH₄<br>H₂<br>PH₃/H₂ (diluted to 10%) | 5<br>5<br>5 | substrate temperature: 280° C. | 0.1 | 10 | 0.01 |
| | i-type semiconductor layer | SiH₄<br>H₂<br>GeH₄ | 40<br>100<br>20 | | 0.5 | 10 | 0.3 |
| | intermediate layer | SiH₄<br>H₂<br>BF₄/H₂ (diluted to 10%)<br>PH₃/H₂ (diluted to 10%)<br>GeH₄ | 8<br>20<br>0.8<br>0.5<br>2 | bias voltage to the substrate: −50V | 0.1 | 10 | 0.02 |
| | p-type semiconductor layer | SiH₄<br>H₂<br>BF₄/H₂ (diluted to 10%) | 5<br>500<br>10 | | 1 | 20 | 0.005 |

TABLE 23

| | | gas used and its flow rate (sccm) | | common conditions | μW power (W/cm³) | inner pressure (mTorr) | layer thickness (μm) |
|---|---|---|---|---|---|---|---|
| conditions for the formation of the respective layers | p-type semiconductor layer | SiH₄<br>H₂<br>B₂H₆/H₂ (diluted to 10%) | 5<br>5<br>5 | substrate temperature: 280° C. | 0.1 | 10 | 0.01 |
| | i-type semiconductor layer | SiH₄<br>H₂<br>GeH₄ | 40<br>100<br>20 | | 0.5 | 10 | 0.3 |
| | intermediate layer | SiH₄<br>H₂<br>B₂H₆/H₂ (diluted to 10%) | 8<br>20<br>0.5 | bias voltage to the substrate: −50V | 0.1 | 10 | 0.02 |

TABLE 23-continued

|  |  | gas used and its flow rate (sccm) |  | common conditions | μW power (W/cm³) | inner pressure (mTorr) | layer thickness (μm) |
|---|---|---|---|---|---|---|---|
|  |  | PH₃/H₂ (diluted to 10%) | 0.5 |  |  |  |  |
|  |  | GeH₄ | 2 |  |  |  |  |
|  | n-type | SiH₄ | 5 |  | 1 | 20 | 0.005 |
|  | semicon- | H₂ | 500 |  |  |  |  |
|  | ductor | PH₃/H₂ | 5 |  |  |  |  |
|  | layer | (diluted to 10%) |  |  |  |  |  |

TABLE 24

|  |  | gas used and its flow rate (sccm) |  | common conditions | μW power (W/cm³) | inner pressure (mTorr) | layer thickness (μm) |
|---|---|---|---|---|---|---|---|
| conditions | n-type | SiH₄ | 5 | substrate | 0.1 | 10 | 0.01 |
| for the | semicon- | H₂ | 5 | temperature: |  |  |  |
| formation | ductor | PH₃/H₂ | 5 | 280° C. |  |  |  |
| of the | layer | (diluted to 10%) |  |  |  |  |  |
| respective | i-type | SiH₄ | 40 |  | 0.5 | 10 | 0.3 |
| layers | semicon- | H₂ | 100 |  |  |  |  |
|  | ductor | GeH₄ | 20 |  |  |  |  |
|  | inter- | SiH₄ | 8 | bias voltage | 0.1 | 10 | 0.02 |
|  | mediate | H₂ | 20 | to the |  |  |  |
|  | layer | B₂H₆/H₂ | 0.5 | substrate: |  |  |  |
|  |  | (diluted to 10%) |  | −50V |  |  |  |
|  |  | PH₃/H₂ | 0.5 |  |  |  |  |
|  |  | (diluted to 10%) |  |  |  |  |  |
|  |  | GeH₄ | 2 |  |  |  |  |
|  | p-type | SiH₄ | 5 |  | 1.5 | 20 | 0.005 |
|  | semicon- | H₂ | 500 |  |  |  |  |
|  | ductor | B₂H₆/H₂ | 5 |  |  |  |  |
|  | layer | (diluted to 10%) |  |  |  |  |  |
|  |  | CH₄ | 0.5 |  |  |  |  |

What we claim is:

1. A pin type photovoltaic element comprising an electroconductive substrate and at least a cell comprising a stack of an n-type semiconductor layer composed of a silicon-containing non-single crystal material, a dopant free i-type semiconductor layer composed of a non-single crystal material containing silicon atoms as the matrix and hydrogen atoms and a p-type semiconductor layer composed of a silicon-containing non-single crystal material disposed in this order, said photovoltaic element further comprising an intermediate layer composed of a non-single crystal material containing silicon atoms as the matrix, and at least (a) atoms of an element belonging to Group IIIA of the periodic table in an amount of at least 1000 atomic ppm, (b) atoms of an element belonging to Group VA of the periodic table in an amount of at least 1000 atomic ppm and (c) hydrogen atoms, said intermediate layer being disposed between said i-type semiconductor layer and said p-type semiconductor layer, or between said i-type semiconductor layer and said n-type semiconductor layer, wherein the amount of said hydrogen atoms contained in said intermediate layer is greater than the amount of the hydrogen atoms contained in said i-type semiconductor layer.

2. A pin type photovoltaic element according to claim 1, wherein said intermediate layer is substantially intrinsic.

3. A pin type photovoltaic element according to claim 1, wherein said intermediate layer contains at least one kind of atoms selected from the group consisting of carbon atoms and germanium atoms.

4. A pin type photovoltaic element according to claim 3, wherein the intermediate layer is substantially intrinsic.

5. A pin type photovoltaic element comprising an electroconductive substrate and at least a cell comprising a stack of an n-type semiconductor layer composed of a silicon-containing non-single crystal material, a dopant free i-type semiconductor layer composed of a non-single crystal material containing silicon atoms as the matrix and hydrogen atoms and a p-type semiconductor layer composed of a silicon-containing non-single crystal material disposed in this order, said photovoltaic element further comprises an intermediate layer composed of a non-single crystal material containing silicon atoms as the matrix, and at least (a) atoms of an element belonging to Group IIIA of the periodic table in an amount of at least 1000 atomic ppm, (b) atoms of an element belonging to Group VA of the periodic table in an amount of at least 1000 atomic ppm and (c) carbon atoms, said intermediate layer being disposed between said i-type semiconductor layer and said p-type semiconductor layer, or between said i-type semiconductor layer and said n-type semiconductor layer.

6. A pin type photovoltaic element according to claim 5, wherein the intermediate layer is substantially intrinsic.

7. A pin type photovoltaic element comprising an electroconductive substrate and at least a cell comprising a stack of an n-type semiconductor layer composed of a silicon-containing non-single crystal material, a dopant free i-type semiconductor layer composed of a silicon-containing non-single crystal material and a p-type semiconductor layer composed of a silicon-containing non-single crystal material disposed in this order, said photovoltaic element further comprises an-intermediate layer composed of a non-single crystal material containing silicon atoms as the matrix, at least (a) atoms of an element belonging to Group IIIA of the periodic table, (b) atoms of an element belonging to Group VA of the periodic table, (c) carbon atoms and (d) germanium atoms is disposed between said i-type semiconductor layer and said p-type semiconductor layer, or between said i-type semiconductor layer and said n-type semiconductor layer.

8. A pin type photovoltaic element according to claim 7, wherein the intermediate layer contains said atoms (a) and said atoms (b) respectively in an amount of at least 1000 ppm.

9. A pin type photovoltaic element according to claim 7, wherein the intermediate layer is substantially intrinsic.

10. A pin type photovoltaic element according to claim 1, wherein the ratio $H_1/H_2$ of the (concentration) of the hydrogen atoms ($H_1$) contained in said intermediate layer to the (concentration) of the hydrogen atoms ($H_2$) contained in said i-type semiconductor layer is in the range of 1.05 to 1.5.

11. A pin type photovoltaic element according to claim 10, wherein the intermediate layer is substantially intrinsic.

12. A pin type photovoltaic element according to claim 10, wherein the intermediate layer further contains at least one kind of atoms selected from the group consisting of carbon atoms and germanium atoms.

13. A pin type photovoltaic element according to claim 3, wherein the intermediate layer contains the carbon atoms in an amount of 3 to 30 atomic %.

14. A pin type photovoltaic element according to claim 3, wherein the intermediate layer contains the germanium atoms in an amount of 5 to 70 atomic %.

15. A pin type photovoltaic element according to claim 5, wherein the intermediate layer contains the carbon atoms in an amount of 3 to 30 atomic %.

16. A pin type photovoltaic element according to claim 7, wherein the intermediate layer contains the carbon atoms and the germanium atoms in a total amount of 5 to 70 atomic %.

17. A pin type photovoltaic element according to claim 12, wherein the intermediate layer contains the carbon atoms and the germanium atoms in a total amount of 5 to 70 atomic %.

* * * * *

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

It is certified that error appears in the above-identified patent and that said Letters Patent is hereby corrected as shown below:

Title page,
AT [57] ABSTRACT

Line 4, "ductor," should read --ductor layer,--.

COLUMN 1

Line 28, "photodegradated" should read --photo-degraded--.
  Line 35, "examples," should read --example,--.
  Line 40, "is" should read --are--.
  Line 43, "a" (first occurrence) should read --an--.

COLUMN 4

Line 55, "configuration" should read --configurations--.

COLUMN 5

Line 9, "is" should read --are--.
  Line 63, "to" should be deleted.
  Line 66, "after" should be deleted.

COLUMN 7

Line 5, "doners" should read --donors--.
  Line 21, "doners" should read --donors--.

COLUMN 10

Line 66, "arseric" should read --arsenic--.

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

It is certified that error appears in the above-identified patent and that said Letters Patent is hereby corrected as shown below:

COLUMN 12

Line 15, "pllypro-" should read --polypro- --.

COLUMN 15

Line 60, "(ILIA," should read --(IIIA,--.

COLUMN 16

Line 29, "tetramethlsilane" should read --tetramethylsilane--.
    Line 40, "hal ides" should read --halides--.

COLUMN 17

Line 25, "stand" should read --stands--.

COLUMN 20

Line 17, "ways passes" should read --way passages--.

COLUMN 21

Line 55, "crystalinity" should read --crystallinity--.

COLUMN 23

Line 24, "box 112" should read --box 1112--..

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

Page 3 of 6

It is certified that error appears in the above-identified patent and that said Letters Patent is hereby corrected as shown below:

COLUMN 24

Line 43, "the" (first occurrence) should read --to--.

COLUMN 25

Line 39, "104" should read --1041--.
Line 51, "were" should be deleted.

COLUMN 26

Line 3, "formed" should read --form--.
Line 35, "holds" should read --fold--.
Line 36, "holds" (both occurrences) should read --fold--.
Line 37, "holds" should read --fold--.
Line 38, "holds" should read --fold--.
Line 42, "an" should read --on--.
Line 61, "folds" should read --fold--.

COLUMN 32

Line 8, "holds" should read --fold--.
Line 9, "holds" (both occurrences) should read --fold--.
Line 10, "holds" should read --fold--.
Line 11, "holds" should read --fold--.
Line 15, "an" should read --on--.
Line 34, "folds" should read --fold--.
Line 64, "crystalinity" should read --crystallinity--.

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

Page 4 of 6

It is certified that error appears in the above-identified patent and that said Letters Patent is hereby corrected as shown below:

COLUMN 33

Line 13, "evaluation" should read --evaluation (1).--.
Line 26, "holds" should read --fold--.

COLUMN 34

Line 23, "amnner" should read --manner--.
Line 47, "102" should read --102 is formed--.

COLUMN 35

Line 19, "the" (first occurrence) should read --to--.

COLUMN 36

Line 23, "upon" should be deleted.
Line 48, "formed" should read --form--.

COLUMN 37

Line 14, "holds" should read --fold--.
Line 19, "an" should read --on--.

COLUMN 38

Line 1, "crystalinity" should read --crystallinity--.

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

It is certified that error appears in the above-identified patent and that said Letters Patent is hereby corrected as shown below:

COLUMN 40

Line 34, "This is, the" should read --The--.

COLUMN 41

Line 2, "PH$_3$/H$_2$" should read --PH$_3$/H$_2$ gas--.

COLUMN 42

Line 49, "holds" should read --fold--.
Line 50, "holds" (both occurrences) should read --fold--.
Line 51, "holds" should read --fold--.
Line 52, "holds" should read --fold--.
Line 56, "an" should read --on--.

COLUMN 43

Line 8, "holds" should read --fold--.
Line 38, "crystalinity" should read --crystallinity--.

COLUMN 45

Line 21, "102" should read --102 is formed--.
Line 60, "the" (first occurrence) should read --to--.

COLUMN 46

Line 12, "PH$_3$/H$_2$" should read --PH$_3$/H$_2$ gas--.
Line 24, "whereby" should read --thereby--.
Line 56, "valves 104," should read --valves 1041,--.
Line 62, "upon" should be deleted.

UNITED STATES PATENT AND TRADEMARK OFFICE
CERTIFICATE OF CORRECTION

PATENT NO. : 5,573,601
DATED : November 12, 1996
INVENTOR(S) : KEISHI SAITOH ET AL.

It is certified that error appears in the above-identified patent and that said Letters Patent is hereby corrected as shown below:

COLUMN 47

Line 54, "holds" should read --fold--.
Line 59, "an" should read --on--.

COLUMN 48

Line 41, "crystalinity" should read --crystallinity--.

COLUMN 50

Line 63, "holds" should read --fold--.

COLUMN 73

Line 4, "is" should read --being--.

Signed and Sealed this

Sixth Day of May, 1997

Attest:

BRUCE LEHMAN

Attesting Officer
Commissioner of Patents and Trademarks